United States Patent
Kim et al.

(10) Patent No.: US 9,548,390 B2
(45) Date of Patent: *Jan. 17, 2017

(54) SEMICONDUCTOR DEVICE INCLUDING FIELD EFFECT TRANSISTOR

(71) Applicant: Samsung Electronics Co., Ltd., Suwon-si (KR)

(72) Inventors: Jongun Kim, Seoul (KR); Dong-Hyun Kim, Yongin-si (KR); Hyun-Seung Song, Incheon (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,710

(22) Filed: Jun. 18, 2015

(65) Prior Publication Data

US 2015/0287829 A1    Oct. 8, 2015

Related U.S. Application Data

(63) Continuation of application No. 14/245,007, filed on Apr. 4, 2014, now Pat. No. 9,903,422.

(30) Foreign Application Priority Data

Jul. 30, 2013   (KR) .......................... 10-2013-0090277

(51) Int. Cl.
| | |
|---|---|
| *H01L 29/78* | (2006.01) |
| *H01L 29/423* | (2006.01) |
| *H01L 29/66* | (2006.01) |
| *H01L 27/088* | (2006.01) |
| *H01L 29/06* | (2006.01) |
| *H01L 29/10* | (2006.01) |
| *H01L 29/165* | (2006.01) |

(52) U.S. Cl.
CPC ....... *H01L 29/7851* (2013.01); *H01L 27/0886* (2013.01); *H01L 29/0649* (2013.01); *H01L 29/1037* (2013.01); *H01L 29/42392* (2013.01); *H01L 29/66545* (2013.01); *H01L 29/66818* (2013.01); *H01L 29/7853* (2013.01); *H01L 29/165* (2013.01); *H01L 29/7848* (2013.01); *H01L 2029/7858* (2013.01)

(58) Field of Classification Search
CPC .... H01L 27/092; H01L 29/748; H01L 29/772; H01L 29/66795; H01L 29/165; H01L 29/7851; H01L 27/0886; H01L 29/0649
USPC ........................................................ 257/327
See application file for complete search history.

(56) References Cited

U.S. PATENT DOCUMENTS

| | | | |
|---|---|---|---|
| 6,960,517 B2 | 11/2005 | Rios et al. | |
| 7,501,674 B2 | 3/2009 | Lee et al. | |
| 7,528,022 B2 | 5/2009 | Ahn et al. | |

(Continued)

*Primary Examiner* — Nathan W Ha
(74) *Attorney, Agent, or Firm* — Muir Patent Law, PLLC

(57) ABSTRACT

A semiconductor device includes a fin portion protruding from a substrate. The fin portion includes a base part, an intermediate part on the base part, and a channel part on the intermediate part. A width of the intermediate part is less than a width of the base part and greater than a width of the channel part. A gate electrode coves both sidewalls and a top surface of the channel part, and a device isolation pattern covers both sidewalls of the base part and both sidewalls of the intermediate part.

16 Claims, 61 Drawing Sheets

(56) References Cited

U.S. PATENT DOCUMENTS

| | | |
|---|---|---|
| 7,534,686 B2 | 5/2009 | Lee et al. |
| 7,812,375 B2 | 10/2010 | Lee et al. |
| 7,863,686 B2 | 1/2011 | Lee et al. |
| 7,880,232 B2 | 2/2011 | Fischer et al. |
| 8,084,845 B2 | 12/2011 | Torek et al. |
| 8,163,610 B2 | 4/2012 | Aritome |
| 8,394,690 B2 | 3/2013 | Ikeda et al. |
| 2005/0156202 A1 | 7/2005 | Rhee et al. |
| 2007/0048947 A1 | 3/2007 | Lee et al. |
| 2008/0296702 A1 | 12/2008 | Lee et al. |
| 2011/0278676 A1 | 11/2011 | Cheng et al. |
| 2012/0037953 A1* | 2/2012 | Hayano ............ H01L 21/82388 257/133 |
| 2012/0138888 A1* | 6/2012 | Chang ................ H01L 27/1203 257/9 |
| 2012/0267697 A1* | 10/2012 | Erickson ................ H01L 21/84 257/301 |
| 2012/0295444 A1 | 11/2012 | Godet et al. |
| 2013/0009249 A1 | 1/2013 | Basker et al. |
| 2013/0049068 A1* | 2/2013 | Lin ..................... H01L 29/7853 257/192 |
| 2013/0052778 A1 | 2/2013 | Liao et al. |
| 2013/0056826 A1 | 3/2013 | Liu et al. |
| 2013/0095616 A1 | 4/2013 | Tsai et al. |
| 2013/0153960 A1 | 6/2013 | Yang |
| 2013/0187228 A1 | 7/2013 | Xie et al. |
| 2013/0248999 A1 | 9/2013 | Glass et al. |
| 2013/0285129 A1* | 10/2013 | Jensen ................ H01L 21/268 257/288 |
| 2014/0042500 A1 | 2/2014 | Wann et al. |
| 2014/0312398 A1 | 10/2014 | Ching et al. |
| 2014/0353719 A1 | 12/2014 | Kim |

\* cited by examiner

SEMICONDUCTOR DEVICE INCLUDING FIELD EFFECT TRANSISTOR

CROSS-REFERENCE TO RELATED APPLICATION

This U.S. non-provisional patent application is a continuation application of U.S. patent application Ser. No. 14/245,007, filed Apr. 4, 2014, which claims priority under 35 U.S.C. §119 to Korean Patent Application No. 10-2013-0090277, filed on Jul. 30, 2013, in the Korean Intellectual Property Office, the disclosure of each of which is hereby incorporated by reference in its entirety.

BACKGROUND

This disclosure relates to semiconductor devices and, more particularly, to semiconductor devices including a field effect transistor.

Semiconductor devices are widely used in an electronic industry because of their characteristics such as small size, multi-function, and/or manufacture costs. A field effect transistor (hereinafter, referred to as 'a transistor') is used as one of important discrete elements constituting semiconductor devices. Generally, a transistor may include a source region, a drain region spaced apart from the source region, and a gate electrode disposed over a channel region between the source region and the drain region. The gate electrode may be insulated from the channel region by a gate oxide layer.

As semiconductor devices have been highly integrated, certain characteristics of transistors have deteriorated. For example, a short channel effect may be caused in transistors, and turn-on currents of transistors may be reduced. Thus, various research is being conducted for improvement of characteristics of transistors.

SUMMARY

The disclosed embodiments provide semiconductor devices including a field effect transistor that may improve reliability and increase integration.

In one aspect, a semiconductor device includes: a fin component protruding from a substrate, the fin component including a base part including two sidewalls, an intermediate part on the base part and including two sidewalls, and a channel part on the intermediate part and including two sidewalls. A width of the intermediate part less than a width of the base part and greater than a width of the channel part. The semiconductor device further includes a device isolation pattern disposed on the substrate around the fin component, the device isolation pattern covering both sidewalls of the base part and both sidewalls of the intermediate part; a gate electrode crossing over the fin component, the gate electrode covering both sidewalls and a top surface of the channel part; and a gate insulating layer disposed between the channel part and the gate electrode. At least a first sidewall of the fin component has a different slope at an interface between the base part and intermediate part than at a portion of the intermediate part between the base part and the channel part.

In some embodiments, a bottom surface of the gate electrode disposed on the device isolation pattern is disposed at substantially the same level as or a higher level than a top end of the intermediate part.

In some embodiments, the gate electrode does not cover sidewalls of the intermediate part.

In some embodiments, the widths of the base part, the intermediate part, and the channel part are reduced stepwise.

In some embodiments, a channel may be generated in substantially the channel part when an operating voltage is applied to the gate electrode.

In some embodiments, the width of the channel part is equal to or less than a value obtained by subtracting twice a minimum removal thickness controllable by a thinning process from the width of the intermediate part.

In some embodiments, the width of the channel part is equal to or less than a value obtained by subtracting about 2 nanometers from the width of the intermediate part.

In some embodiments, the width of the intermediate part is equal to or less than a value obtained by subtracting twice a minimum removal thickness controllable by a thinning process from the width of the base part.

In some embodiments, the width of the intermediate part is equal to or less than a value obtained by subtracting about 2 nanometers from the width of the base part.

In some embodiments, the width of the channel part is substantially uniform; and the width of the intermediate part is substantially uniform.

In some embodiments, the intermediate part include a plurality of sequentially stacked sub-intermediate parts. Widths of the stacked sub-intermediate parts are different from each other. The width of each of the sub-intermediate parts may be less than the width of the base part and greater than the width of the channel part.

In some embodiments, the widths of the stacked sub-intermediate parts are reduced stepwise in a direction from the base part toward the channel part. The width of an uppermost one of the stacked sub-intermediate parts may be greater than the width of the channel part; and the width of a lowermost one of the stacked sub-intermediate part may be less than the width of the base part.

In some embodiments, the channel part includes a plurality of sequentially stacked sub-channel parts. Widths of the stacked sub-channel parts are different from each other; and the width of each of the sub-channel parts may be less than the width of the intermediate part.

In some embodiments, the widths of the stacked sub-channel parts are reduced stepwise in a direction from the intermediate part toward an uppermost one of the stacked sub-channel parts. The width of a lowermost one of the stacked sub-channel parts may be less than the width of the intermediate part.

In some embodiments, an entire portion of the channel part including the stacked sub-channel parts may become a depletion region when an operating voltage is applied to the gate electrode.

In some embodiments, the semiconductor device further includes a plurality of fin components disposed on the substrate, the plurality of fin components including the fin component. The plurality of fin components may extend in parallel to each other. The gate electrode may cross over the plurality of fin components; and the width of the base part of each of the fin components may be equal to or less than a half of a pitch of the plurality of fin components in a longitudinal direction of the gate electrode.

In some embodiments, the semiconductor device further includes: a pair of source/drain patterns disposed on the substrate at both sides of the gate electrode, respectively. The channel part and the intermediate part may be disposed between the pair of source/drain patterns; and the base part may laterally extend to be disposed between the substrate and the pair of source/drain patterns.

In some embodiments, the source/drain patterns are formed by an epitaxial growth process using top surfaces of the extensions of the base part as seeds.

In some embodiments, the device isolation pattern includes: a first insulating pattern covering both of the sidewalls of the base part; and a second insulating pattern covering both of the sidewalls of the intermediate part.

In some embodiments, the semiconductor device further includes: a mask spacer pattern disposed between the base part and the device isolation pattern. The mask spacer pattern includes an insulating material.

In some embodiments, the substrate is a bulk semiconductor substrate; and the fin portion corresponds to a portion of the bulk semiconductor substrate.

In some embodiments, the semiconductor device is part of a transistor that is included in a memory or logic semiconductor device.

In other aspects, a semiconductor device includes a fin protruding from a substrate. The fin includes a base part having opposite sidewalls, an intermediate part on the base part and including opposite sidewalls, and a channel part on the intermediate part and including opposite sidewalls, wherein a width between the sidewalls of the intermediate part is less than a width between the sidewalls of the base part and is greater than a width between the sidewalls of the channel part. The semiconductor device further includes: a device isolation structure disposed on the substrate, the device isolation structure formed on both sidewalls of the base part and both sidewalls of the intermediate part; a gate electrode crossing over the fin, the gate electrode formed on both sidewalls and a top surface of the channel part; and a gate insulating layer disposed between the channel part and the gate electrode. The widths of the base part, the intermediate part, and the channel part are reduced stepwise.

In some embodiments, the gate electrode does not cover sidewalls of the intermediate part.

In some embodiments, the width of the channel part is equal to or less than a value obtained by subtracting twice a minimum removal thickness controllable by a thinning process from the width of the intermediate part.

In some embodiments the width of the channel part is equal to or less than a value obtained by subtracting about 2 nanometers from the width of the intermediate part.

In some embodiments, the sidewalls of the base part are either inclined or are substantially vertical; the sidewalls of the intermediate part are substantially vertical; and the sidewalls of the channel part are substantially vertical.

In some embodiments, the sidewalls of the fin at the interface between the intermediate part and the base part include a substantially horizontal portion.

In another aspect, a semiconductor device includes a fin protruding from a substrate. The fin includes two sidewalls and includes a base part having opposite sidewalls, an intermediate part on the base part and including opposite sidewalls, and a channel part on the intermediate part and including opposite sidewalls. A width between the sidewalls of the intermediate part is less than a width between the sidewalls of the base part and is greater than a width between the sidewalls of the channel part. The semiconductor device additionally includes a device isolation pattern disposed on the substrate, the device isolation pattern formed on both sidewalls of the base part and both sidewalls of the intermediate part; a gate electrode crossing over the fin, the gate electrode formed on both sidewalls and a top surface of the channel part; and a gate insulating layer disposed between the channel part and the gate electrode. A sidewall of the fin at an interface between the intermediate part and the base part includes a substantially horizontal portion.

In another aspect, a semiconductor device includes a fin component protruding from a substrate, the fin component including a base part, an intermediate part on the base part and a channel part on the intermediate part, the channel part including two sidewalls and the intermediate part including two sidewalls each part of a sidewall portion of the intermediate part, wherein a width of the intermediate part is less than a width of the base part and is greater than a width of the channel part. The semiconductor device additionally includes a gate electrode crossing over the fin component, the gate electrode covering both sidewalls and a top surface of the channel part; and a gate insulating layer disposed between the channel part and the gate electrode. A channel may be generated in the channel part when an operating voltage is applied to the gate electrode, and the channel may not be generated in a sidewall portion of the intermediate part.

In some embodiments, the gate electrode does not cover sidewalls of the intermediate part and the base part.

In some embodiments, an entire portion of the channel part becomes a depletion region when the operating voltage is applied to the gate electrode.

In a further aspect, a method of providing a semiconductor device includes, providing a fin protruding from a substrate, the fin including a base part having opposite sidewalls, an intermediate part on the base part and including opposite sidewalls, and a channel part on the intermediate part and including opposite sidewalls, wherein a width between the sidewalls of the intermediate part is less than a width between the sidewalls of the base part and is greater than a width between the sidewalls of the channel part; providing a device isolation structure disposed on the substrate, the device isolation structure formed on both sidewalls of the base part and both sidewalls of the intermediate part; providing a gate electrode crossing over the fin, the gate electrode formed on both sidewalls and a top surface of the channel part; and providing a gate insulating layer disposed between the channel part and the gate electrode. The widths of the base part, the intermediate part, and the channel part are reduced stepwise

BRIEF DESCRIPTION OF THE DRAWINGS

The various disclosed embodiments will become more apparent in view of the attached drawings and accompanying detailed description.

FIGS. 4A to 12A are perspective views illustrating a method of manufacturing a semiconductor device according to some embodiments;

FIGS. 4B to 12B are cross-sectional views taken lines I-I' of FIGS. 4A to 12A, respectively;

FIGS. 4C to 12C are cross-sectional views taken lines II-II' of FIGS. 4A to 12A, respectively;

FIGS. 17A to 19A are cross-sectional views taken along a line I-I' of FIG. 15A to illustrate a method of manufacturing a semiconductor device according to certain embodiments;

FIGS. 17B to 19B are cross-sectional views taken along a line II-IF of FIG. 15A to illustrate a method of manufacturing a semiconductor device according to certain embodiments;

DETAILED DESCRIPTION OF THE EMBODIMENTS

Figure 1A:
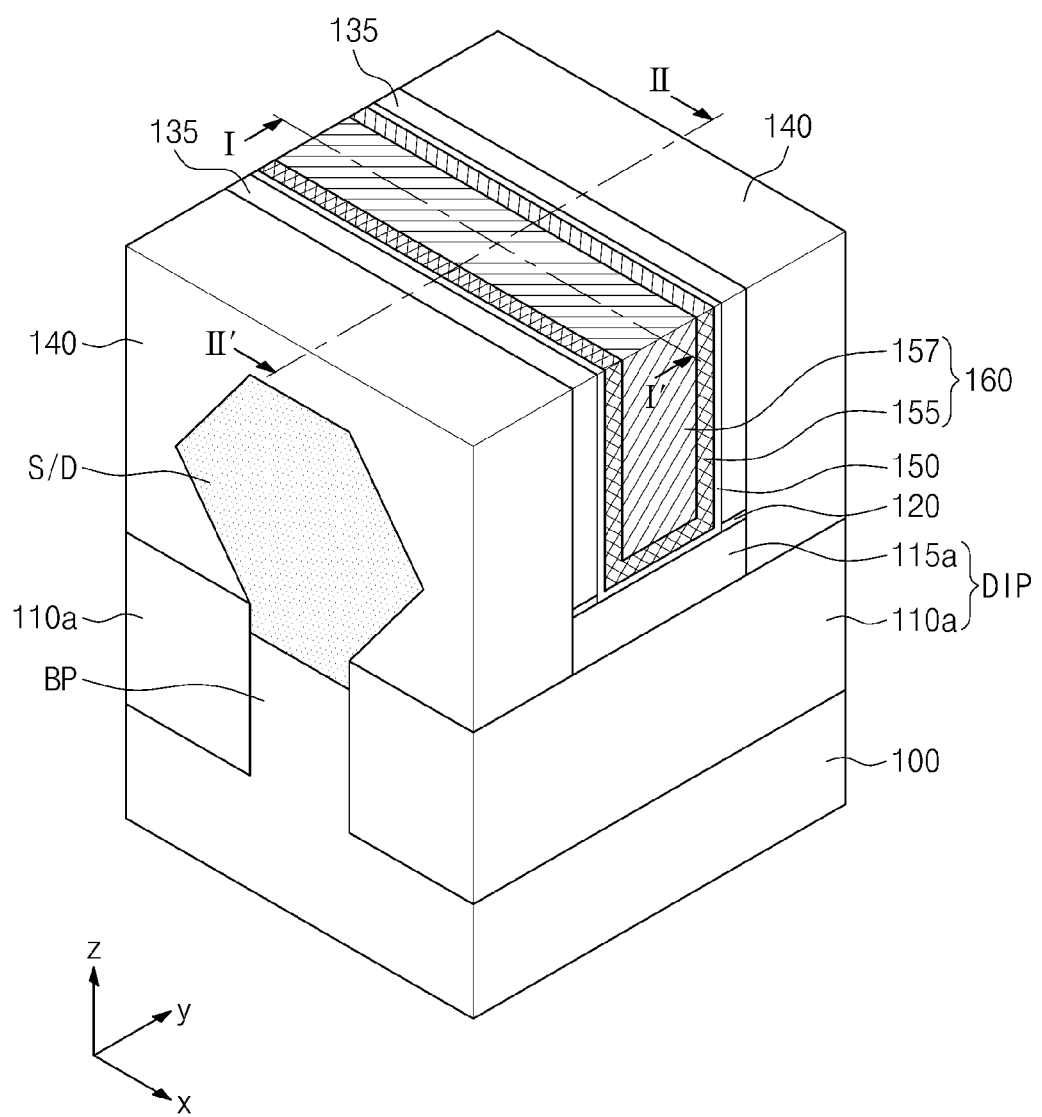
FIG. 1A is a perspective view illustrating a semiconductor device according to some exemplary embodiments.

The disclosure will now be described more fully hereinafter with reference to the accompanying drawings, in which exemplary embodiments are shown. The advantages and features and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, exemplary embodiments are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" or "adjacent to" another element, it can be directly on or adjacent to the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments of aspects of the disclosure explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

The word "contact" as used here refers to direct contact, unless indicated otherwise.

Figure 1B:
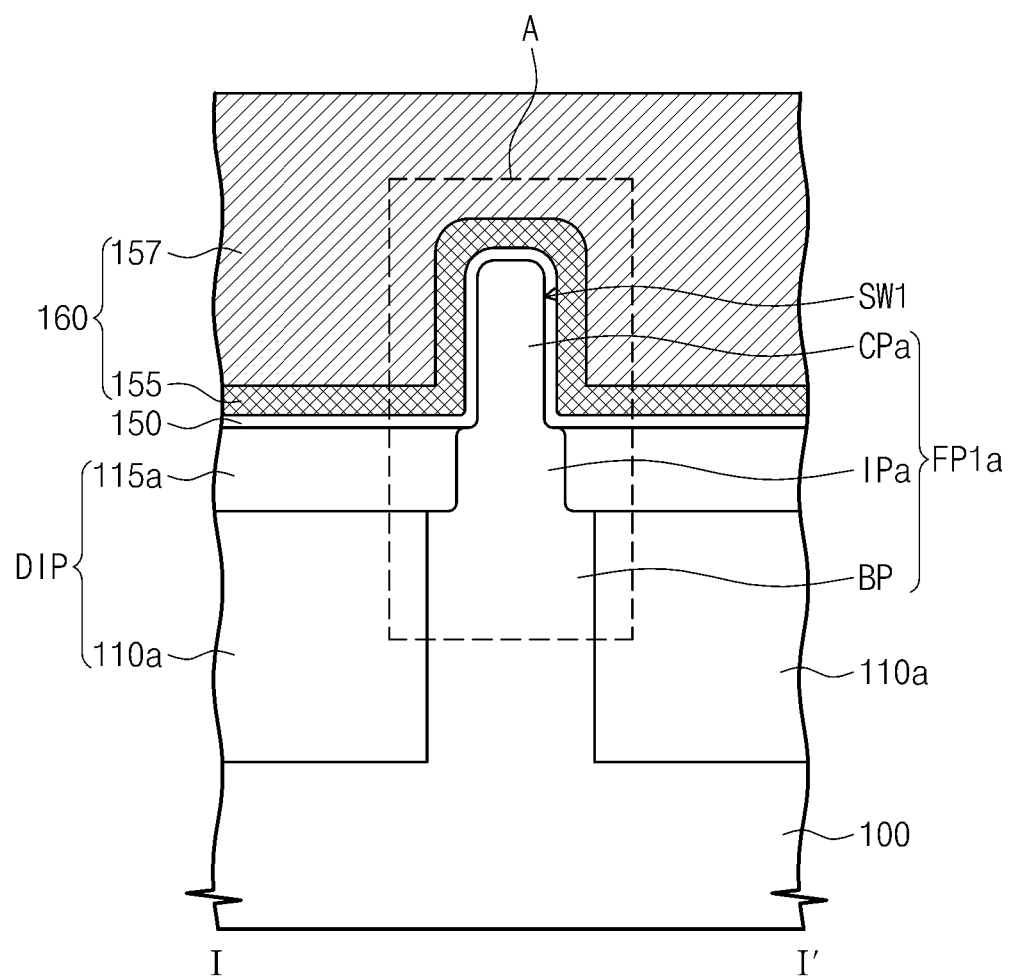
FIG. 1B is a cross-sectional view taken along a line I-I' of FIG. 1A.
Figure 1C:
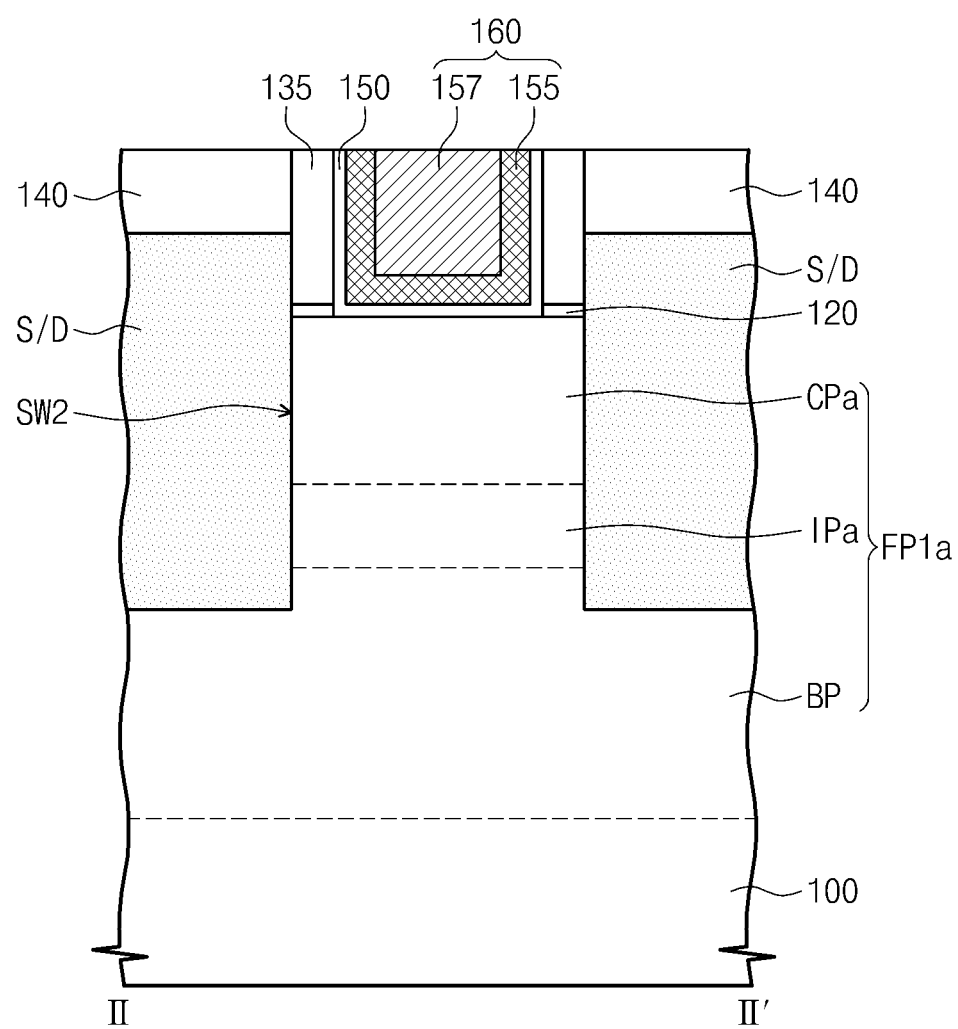
FIG. 1C is a cross-sectional view taken along a line II-IF of FIG. 1A.
Figure 1D:
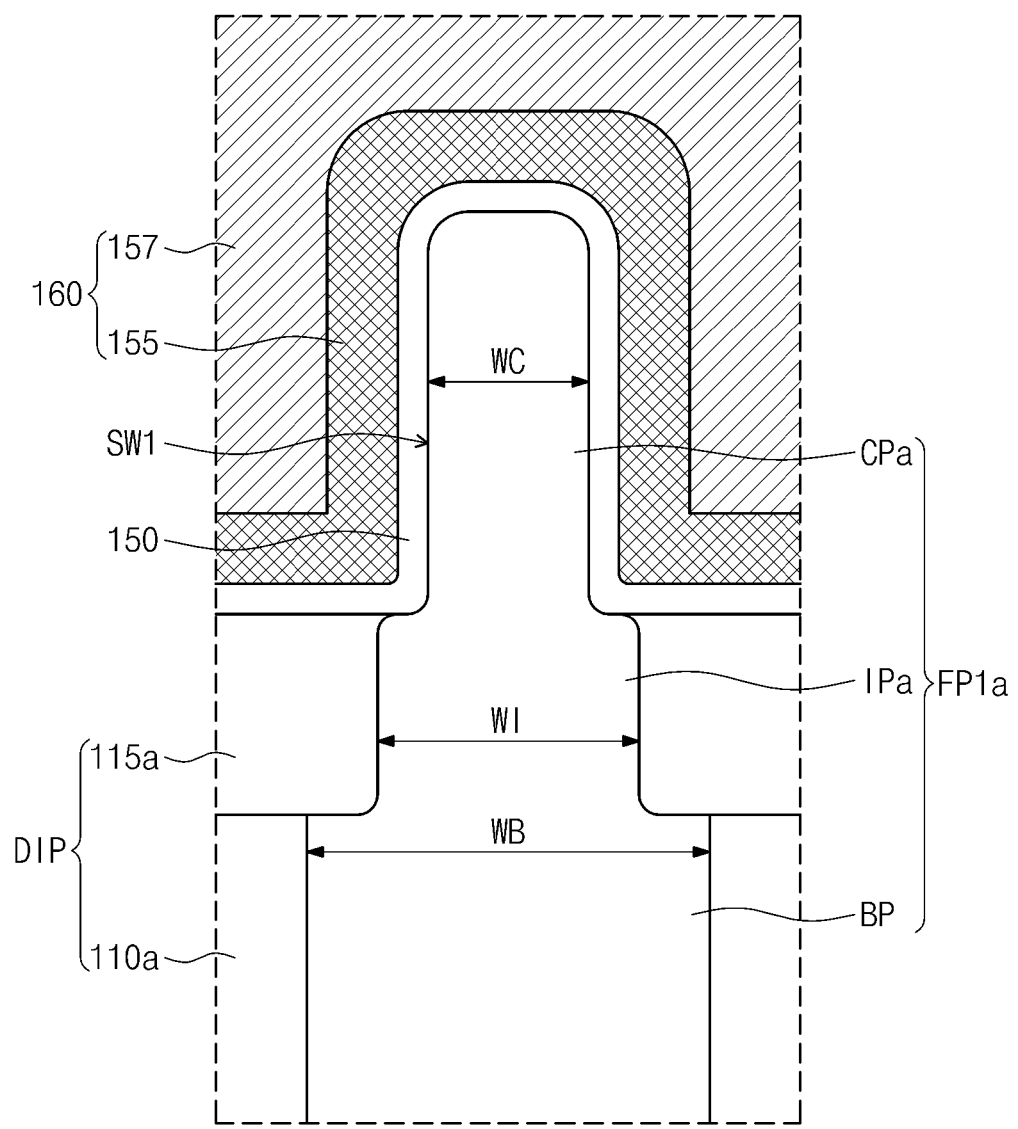
FIG. 1D is an enlarged view of a portion 'A' of FIG. 1B.

FIG. 1A is a perspective view illustrating a semiconductor device according to some exemplary embodiments. FIG. 1B is a cross-sectional view taken along a line I-I' of FIG. 1A. FIG. 1C is a cross-sectional view taken along a line II-IF of FIG. 1A. FIG. 1D is an enlarged view of a portion 'A' of FIG. 1B.

Referring to FIGS. 1A, 1B, 1C, and 1D, a fin FP1a (also described herein as a fin component or fin portion FP1a) protrudes from a substrate 100. In some embodiments, the substrate 100 may be a bulk semiconductor substrate. For example, the substrate 100 may be a silicon substrate. However, the inventive concepts are not limited thereto. In other embodiments, the substrate 100 may be a silicon-on-insulator (SOI) substrate. Hereinafter, the substrate 100 of the bulk semiconductor substrate will be described as an example for the purpose of ease and convenience in explanation.

The fin portion FP1a is formed of a semiconductor material. For example, the fin portion FP1a may be formed of silicon. In some embodiments, the fin portion FP1a may correspond to a portion of the substrate 100. For example, a fin FP1a may be directly connected to the substrate 100 of the bulk semiconductor substrate without an interface therebetween, thereby forming a fin portion FP1a of the substrate 100. In certain embodiments, the fin portion FP1a may be doped with dopants of a first conductivity type.

In one embodiment, the fin portion FP1a includes a base part BP, an intermediate part IPa on the base part BP, and a channel part CPa on the intermediate part IPa. The base part BP, the intermediate part IPa, and the channel part CPa may be sequentially stacked on the substrate 100. In one embodiment, the fin portion FP1a is in one united body, such that the base part BP, the intermediate part IPa, and the channel part CPa are directly connected to each other without interfaces therebetween. Each of the base part BP, the intermediate part IPa, and the channel part CPa may have opposing sidewalls that collectively form two opposing sidewalls of the fin portion FP1a.

As illustrated in FIGS. 1B and 1D, in one embodiment, a width WI of the intermediate part IPa is less than a width WB of the base part BP and is greater than a width WC of the channel part CPa. The widths WB, WI, and WC of the base part BP, the intermediate part IPa, and the channel part CPa may be reduced stepwise in a direction from the base part BP toward the channel part CPa. As such, sidewalls of the base part BP, the intermediate part IPa, and the channel part CPa may have a stepped structure. According to one embodiment, the width WC of the channel part CPa may be substantially uniform. Likewise, the width WI of the intermediate part IPa may be substantially uniform. For example, the width between sidewalls of the channel part CPa from a bottom of the channel part CPa to a top of the channel part CPa may be substantially the same. As such, the sidewalls of the channel part CPa may be substantially vertical. Similarly, the width between sidewalls of the intermediate part IPa from a bottom of the intermediate part IPa to a top of the intermediate part IPa may be substantially the same. As such, the sidewalls of the intermediate part IPa may be substantially vertical.

In some embodiments, the width WC of the channel part CPa may be equal to or less than a value obtained by subtracting twice a minimum removal thickness controlled by a thinning process from the width WI of the intermediate part IPa. In some embodiments, the width WC of the channel part CPa may be equal to or less than a value obtained by subtracting about 2 nanometers from the width WI of the intermediate part IPa.

Likewise, the width WI of the intermediate part IPa may be equal to or less than a value obtained by subtracting twice a minimum removal thickness controlled by a thinning process from the width WB of the base part BP. In some embodiments, the width WI of the intermediate part IPa may be equal to or less than a value obtained by subtracting about 2 nanometers from the width WB of the base part BP.

In FIG. 1B, sidewalls of the base part BP are substantially vertical to the substrate 100. Alternatively, the base part BP may have inclined sidewalls, so that a lower width of the base part BP may be greater than an upper width of the base part BP. In this case, the width WB of the base part BP may correspond to the upper width of the base part BP. However, as discussed herein, a width of a part of the fin portion FP1a may refer to any width from one sidewall to another sidewall within that portion. Also, when described herein, an average width of a part of a fin portion refers to an average width from the bottom of the part to the top of the part.

In one embodiment, a device isolation pattern DIP is disposed on the substrate 100 around the fin portion FP1a. The device isolation pattern DIP may be formed on and may cover both sidewalls of the base part BP and both sidewalls of the intermediate part IPa. In some embodiments, a top surface of the device isolation pattern DIP is disposed at substantially the same level as a top end of intermediate part IPa.

In some embodiments, the device isolation pattern DIP includes a first insulating pattern 110a covering both sidewalls of the base part BP and a second insulating pattern 115a covering both sidewalls of the intermediate part IPa. The first insulating pattern 110a may include, for example, silicon oxide (e.g., a high density plasma oxide and/or a spin-on-glass (SOG) oxide). The second insulating pattern 115a may include, for example, a same or different silicon oxide (e.g., an undoped silicon glass (USG) oxide). As shown in the example of FIG. 1B, the first insulating pattern 110a contacts both sidewalls of the base part BP, and the second insulating pattern 115a contacts both sidewalls of the intermediate part IPa.

A gate electrode 160 crosses over the fin portion FP1a on the device isolation pattern DIP. The gate electrode 160 is formed on and may cover both sidewalls and a top surface of the channel part CPa. In one embodiment, a gate insulating layer 150 is disposed between the gate electrode 160 and the channel part CPa. The widths WB, WI, and WC of the base part BP, the intermediate part IPa, and the channel part CPa are defined in a longitudinal direction of the gate electrode 160. The longitudinal direction of the gate electrode 160 may correspond to an x-axis direction of FIG. 1A.

A bottom surface of the gate electrode 160 on the device isolation pattern DIP is disposed at substantially the same level as or a higher level than the top end of the intermediate part IPa. Thus, the gate electrode 160 is not formed on both sidewalls of the intermediate part IPa and both sidewalls of the base part BP. As a result, in certain embodiments, when an operating voltage is applied to the gate electrode 160, a channel is not generated in a sidewall portion of the intermediate part IPa. The sidewall portion of the intermediate part IPa includes the sidewall and a region adjacent thereto of the intermediate part IPa. The channel is generated in the channel part CPa. In some embodiments, an entire portion of the channel part CPa may become a depletion region when the operating voltage is applied to the gate electrode 160.

As can be seen in FIGS. 1A-1D, the fin FP1a can be considered as having two sidewalls, each including portions extending in different directions (e.g., vertical versus horizontal). As such, the slope at different parts of each sidewall varies. For example, at least a first sidewall of the fin FP1a has a different slope at an interface between the base part and intermediate part (e.g., a substantially horizontal slope) than at a portion of the intermediate part between the base part and the channel part (e.g., a substantially vertical slope).

In some embodiments, the gate electrode 160 may include a conductive barrier pattern 155 and a metal pattern 157 that are sequentially stacked. The conductive barrier pattern 155 may include, for example, a conductive metal nitride (e.g., titanium nitride, tantalum nitride, and/or tungsten nitride). The metal pattern 157 may include, for example, tungsten, aluminum, and/or copper. In some embodiments, both ends of the conductive barrier pattern 155 may upwardly extend to cover both sidewalls of the metal pattern 157, as illustrated in FIGS. 1A and 1C. However, the inventive concepts are not limited thereto. In other embodiments, the conductive barrier pattern 155 may have both sidewalls respectively aligned with both sidewalls of the metal pattern 157. In still other embodiments, the gate electrode 160 may include at least one of different conductive materials (e.g., doped silicon and/or a metal silicide).

The gate insulating layer 150 may include at least one of a thermal silicon oxide layer, a chemical vapor deposition (CVD) silicon oxide layer, an atomic layer deposition (ALD) silicon oxide layer, and a high-k dielectric layer (e.g., a metal oxide layer such as an aluminum oxide layer and/or a hafnium oxide layer). In some embodiments, if the gate insulating layer 150 is formed of the thermal silicon oxide layer, the gate insulating layer 150 may be confinedly formed on a surface of the channel part CPa. In this case, the bottom surface of the gate electrode 160 on the device isolation pattern DIP may be disposed at substantially the same level as the top end of the intermediate part IPa (not shown in FIG. 1B or 1D). In other embodiments, if the gate insulating layer 150 is formed, for example, of the CVD silicon oxide layer, the ALD silicon oxide layer, and/or the high-k dielectric layer, the bottom surface of the gate electrode 160 on the device isolation pattern DIP may be disposed at a higher level than the top end of the intermediate part IPa. If the conductive barrier pattern 155 covers both sidewalls of the metal pattern 157, both ends of the gate insulating layer 150 may upwardly extend to cover both sidewalls of the gate electrode 160.

Gate spacers 135 may be disposed on the both sidewalls of the gate electrode 160, respectively. The gate spacers 135 may include, for example, an insulating material (e.g., silicon nitride and/or silicon oxynitride). In some embodiments, a buffer insulating layer 120 may be disposed between the gate spacer 135 and the channel part CPa. The buffer insulating layer 120 may include, for example, silicon oxide.

A pair of source/drain patterns S/D may be disposed on the substrate 100 at both sides of the gate electrode 160, respectively. In this case, the channel part CPa is disposed between the pair of source/drain patterns S/D. Additionally, the intermediate part IPa may also be disposed between the pair of source/drain patterns S/D. In one embodiment, the channel part CPa and the intermediate part IPa are in contact with the pair of the source/drain patterns S/D.

As illustrated in FIGS. 1B and 1C, the channel part CPa may include a pair of first sidewalls SW1 covered by the gate electrode 160, and a pair of second sidewalls SW2 parallel to the longitudinal direction of the gate electrode 160. The second sidewalls SW2 may be substantially perpendicular to the first sidewalls SW1 when viewed from a plan view. Likewise, the intermediate part IPa may include first sidewalls parallel to the first sidewalls SW1 of the channel part CPa, and second sidewalls parallel aligned with the second sidewalls SW2 of the channel part CPa. The source/drain patterns S/D may be in contact with the second sidewalls SW2 of the channel part CPa and the second sidewalls of the intermediate part IPa, respectively. The width WC of the channel part CPa corresponds to a distance between the pair of first sidewalls SW1 of the channel part CPa, and the width WI of the intermediate part IPa corresponds to a distance between the first sidewalls of the intermediate part IPa.

As illustrated in FIG. 1C, the base part BP may laterally extend to be disposed between the substrate 100 and each of the source/drain patterns S/D. The source/drain patterns S/D may be in contact with top surfaces of the extensions of the base part BP, respectively. The source/drain patterns S/D include a semiconductor material. At least a portion of each source/drain pattern S/D is doped with dopants of a second conductivity type opposite to the first conductivity type. In some embodiments, at least a portion of each source/drain pattern S/D may be in contact with the channel part CPa.

The source/drain patterns S/D may be formed, for example, by an epitaxial growth process using the extensions of the base part BP as seeds. In some embodiments, if a field effect transistor including the gate electrode 160 and the fin portion FP1a is a PMOS transistor, the source/drain patterns S/D may include a semiconductor material capable of providing a compressive force to the channel part CPa. For example, if the channel part CPa is formed of silicon, the source/drain patterns S/D may include silicon-germanium (SiGe). Since an atomic diameter of germanium is greater than an atomic diameter of silicon, the source/drain patterns S/D may provide the compressive force to the channel part CPa. Thus, when the field effect transistor is operated, mobility of holes may be increased in the channel part CPa.

In other embodiments, if the field effect transistor is an NMOS transistor, the channel part CPa and the source/drain patterns S/D may be formed of silicon. Top surfaces of the source/drain patterns S/D may be higher than the top surface of the fin portion FP1a.

An interlayer insulating layer 140 may cover the source/drain patterns S/D. The interlayer insulating layer 140 may have a top surface substantially coplanar with a top surface of the gate electrode 160. Thus, the interlayer insulating layer 140 may not be formed on or cover the top surface of the gate electrode 160. The interlayer insulating layer 140 may include, for example, a silicon oxide layer, a silicon nitride layer, and/or a silicon oxynitride layer.

According to the semiconductor device including the field effect transistor described above, the width WI of the intermediate part IPa between the channel part CPa and the base part BP is smaller than the width WB of the base part BP. Thus, a punch-through characteristic between the source/drain patterns S/D may be improved. As such, since the intermediate part IPa corresponding to a punch-through path under the channel part CPa is narrower than the base part BP, the punch-through characteristic may be improved. Thus, influence of a short channel effect to the field effect transistor may be reduced.

Additionally, a parasitic capacitance between the gate electrode 160 and the fin portion FP1a may be reduced or minimized due to the intermediate part IPa. In more detail, the gate electrode 160 may overlap with an edge top surface of the intermediate part IPa to define a parasitic capacitor, as illustrated in FIG. 1D. The edge top surface of the intermediate part IPa may be defined as a top surface between the channel part CPa and the sidewall of the intermediate part IPa. Since the intermediate part IPa is narrower than the base part BP, an area of the edge top surface of the intermediate part IPa may be reduced. Thus, the capacitance of the parasitic capacitor may be reduced or minimized. If the intermediate part IPa is omitted, the gate electrode 160 may overlap with an edge top surface having a wide width of the base part BP. Thus, a capacitance of a parasitic capacitor may be increased. However, according to the embodiments described above, the intermediate part IPa narrower than the base part BP is disposed between the channel part CPa and the base part BP so that the capacitance of the parasitic capacitor may be reduced or minimized. As a result, an operating speed and reliability of the field effect transistor may be improved. Thus, high speed and excellent reliable semiconductor devices may be realized.

Furthermore, in certain embodiments, the widths WB, WI, and WC of the base part BP, the intermediate part IPa, and the channel part CPa are reduced stepwise from the base part BP toward the channel part CPa. Thus, the fin portion FP1a has a stable vertical structure. As a result, even though a height of the fin portion FP1a increases, the fin portion FP1a does not lean. If the fin portion FP1a consists of only the narrow channel part CPa, the fin portion FP1a is more likely to lean.

Next, modified examples of the semiconductor device according to certain embodiments will be described with reference to the drawings.

Figure 2A:
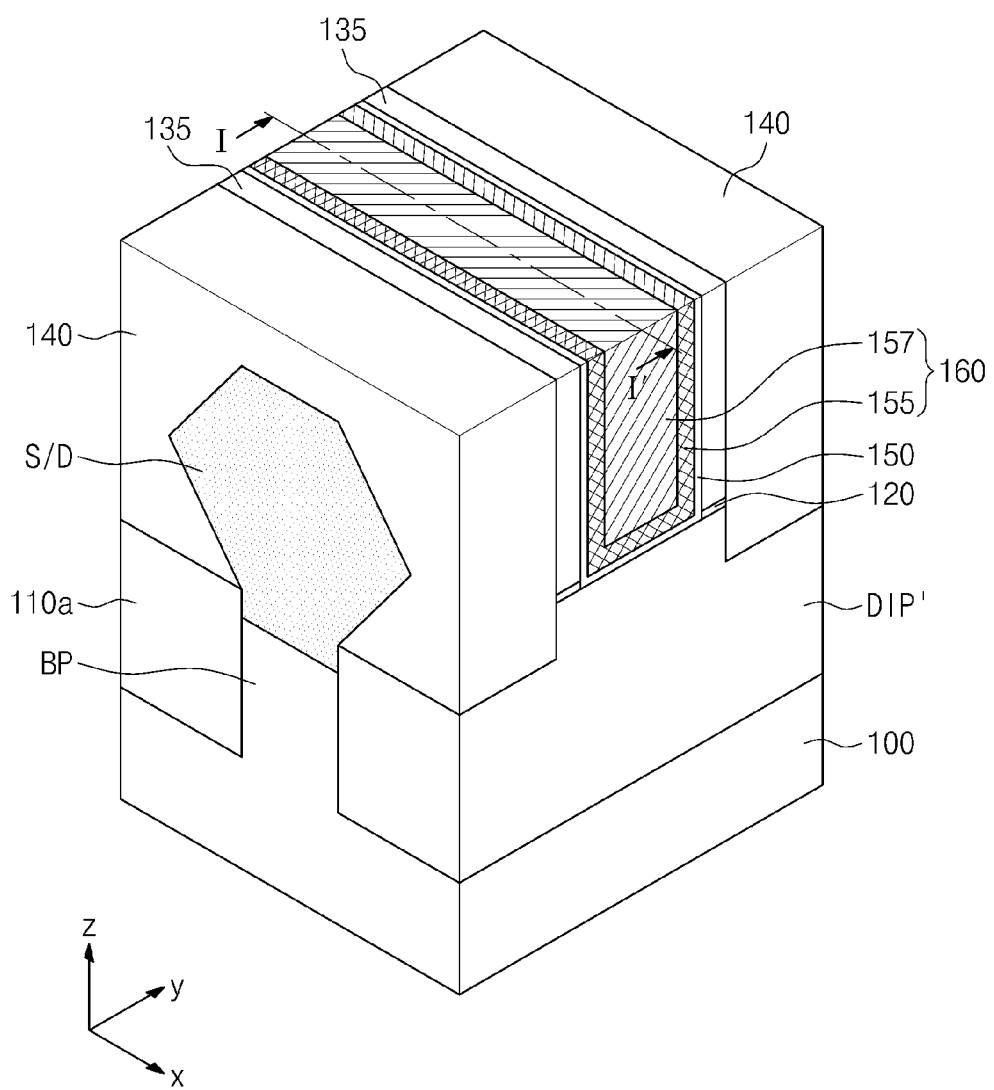
FIG. 2A is a perspective view illustrating a modified example of a semiconductor device according to some exemplary embodiments.
Figure 2B:
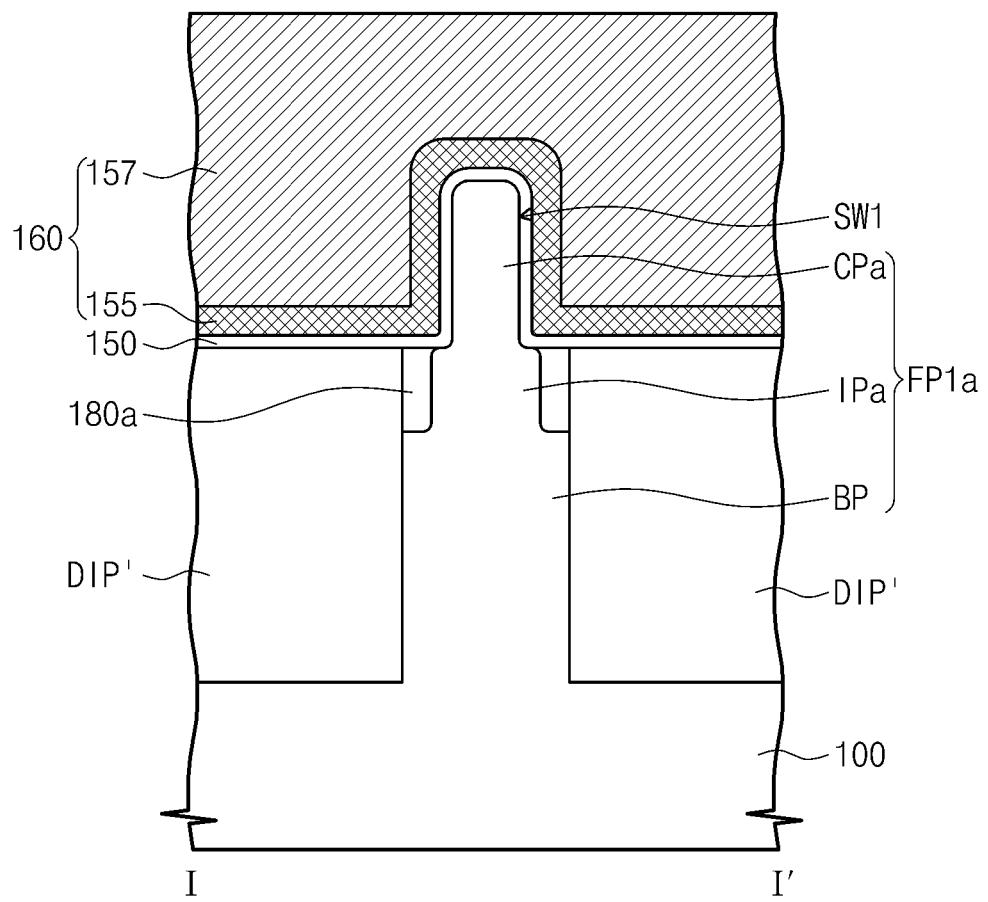
FIG. 2B is a cross-sectional view taken along a line I-I' of 2A.

FIG. 2A is a perspective view illustrating a modified example of a semiconductor device according to some embodiments of the inventive concepts, and FIG. 2B is a cross-sectional view taken along a line I-I' of 2A.

Referring to FIGS. 2A and 2B, a mask spacer pattern 180a may be disposed between a device isolation pattern DIP' and the intermediate part IPa. The mask spacer pattern 180a may include, for example, an insulating material (e.g., silicon oxide and/or silicon nitride). The device isolation pattern DIP' according to the present modified example may be formed in one united body, unlike the device isolation pattern DIP including the first and second insulating patterns 110a and 115a of FIGS. 1A to 1D. As such, an interface may not exist between a first portion of the device isolation pattern DIP' covering the sidewall of the intermediate part IPa and a second portion of the device isolation pattern DIP' covering the sidewall of the base part BP. Note that the term "device isolation structure" may be used herein to refer to one or more of the elements that serve as isolation elements for the semiconductor device. For example, the combined pattern including first and second insulating patterns 110a and 115a of FIGS. 1A to 1D may be referred to as a device isolation structure. Also, the device isolation pattern DIP' and mask spacer pattern 180a of FIG. 2B may collectively be referred to as device isolation structure.

Figure 3:
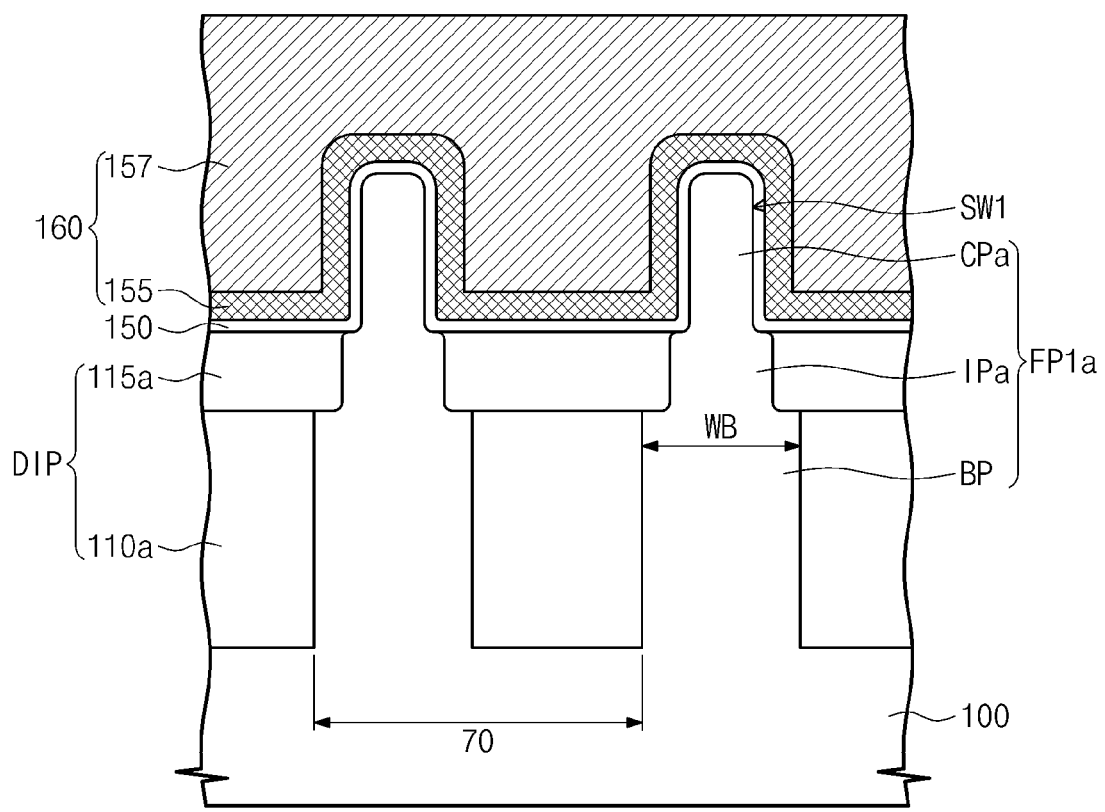
FIG. 3 is a cross-sectional view illustrating another modified example of a semiconductor device according to some exemplary embodiments.

FIG. 3 is a cross-sectional view illustrating another modified example of a semiconductor device according to some embodiments.

Referring to FIG. 3, a plurality of fin portions FP1a may be disposed on the substrate 100. The plurality of fin portions FP1a may be arranged in parallel to each other. The gate electrode 160 may cross over the plurality of fin portions FP1a. As such, the gate electrode 160 may control the channel parts CPa of the plurality of fin portions FP1a. In one embodiment, the plurality of fin portions FP1a are arranged by equal intervals. In one embodiment, the width WB of the base part BP of each of the fin portions FP1a may be substantially equal to or less than half of a pitch 70 of the fin portions FP1a in the longitudinal direction of the gate electrode 160.

Next, a method of manufacturing a semiconductor device according to one embodiment will be described with reference to the drawings. FIGS. 4A to 12A are perspective views illustrating a method of manufacturing a semiconductor device according to some embodiments. FIGS. 4B to 12B are cross-sectional views taken lines I-I' of FIGS. 4A to 12A, respectively. FIGS. 4C to 12C are cross-sectional views taken lines II-II' of FIGS. 4A to 12A, respectively.

Figure 4A:
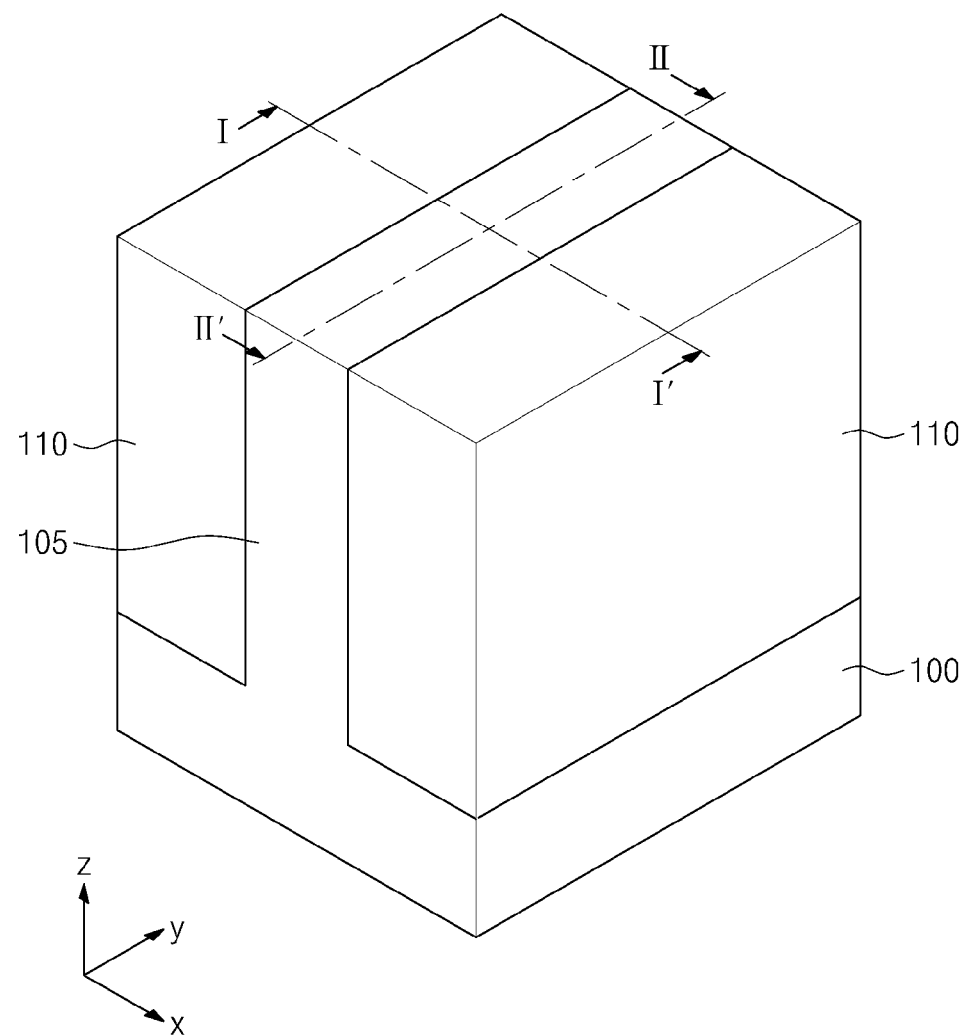
Figure 4B:
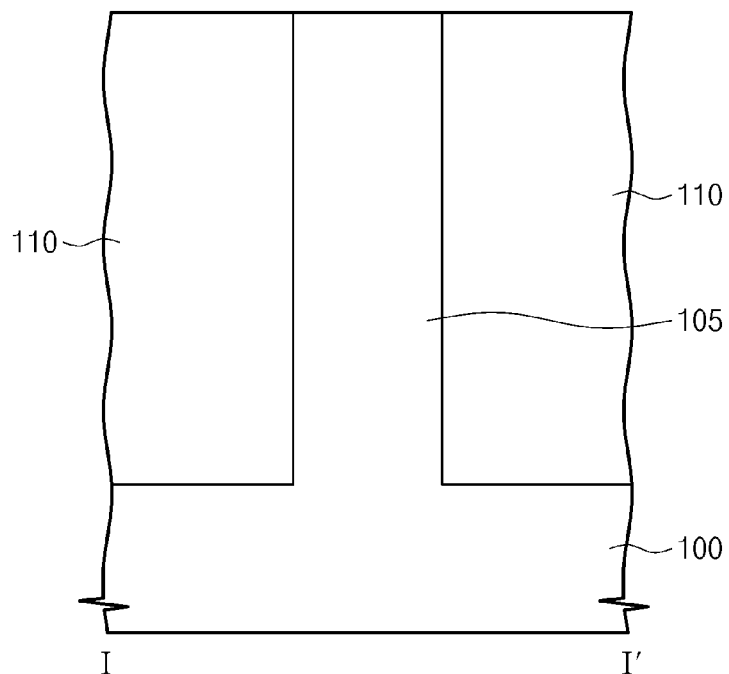
Figure 4C:
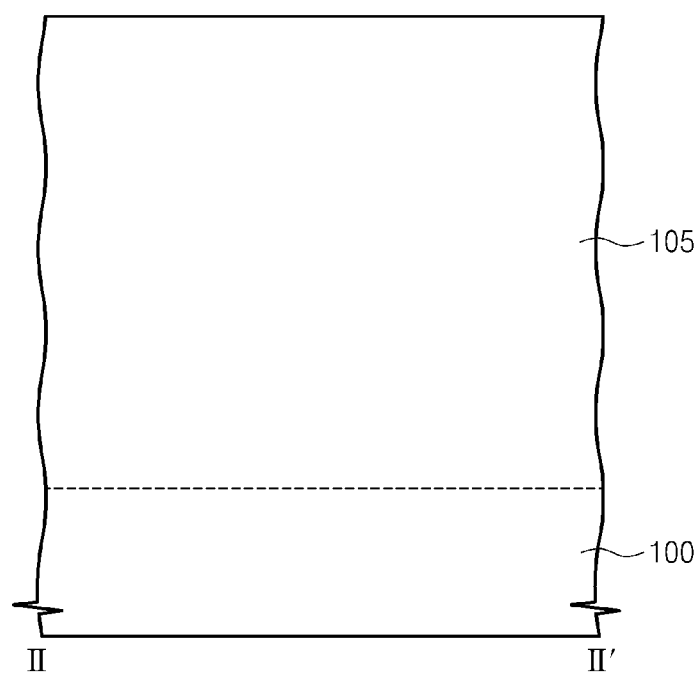

Referring to FIGS. 4A, 4B, and 4C, a mask pattern (see 102 of FIG. 13A) may be formed on a substrate 100 and then the substrate 100 may be etched using the mask pattern as an etch mask, thereby forming a first preliminary fin 105. The mask pattern may have a line-shape extending in one direction (e.g., a y-axis direction). Subsequently, a first insulating layer 110 may be formed on the substrate 100 and then the first insulating layer 110 may be planarized until the mask pattern is exposed. The exposed mask pattern may be removed to expose a top surface of the first preliminary fin 105. The mask pattern may include, for example, a material having an etch selectivity with respect to the substrate 100 and the first insulating layer 110. For example, if the first insulating layer 110 includes a silicon oxide layer, the mask pattern may include a silicon nitride layer. Additionally, the mask pattern may further include a buffer layer (e.g., a silicon oxide layer) disposed between the silicon nitride layer and the substrate 100. The first preliminary fin 105 may be doped with dopants of a first conductivity type.

In some embodiments, the first preliminary fin 105 may have a width substantially equal to the width WB of the base part BP described with reference to FIG. 1D.

Figure 5A:
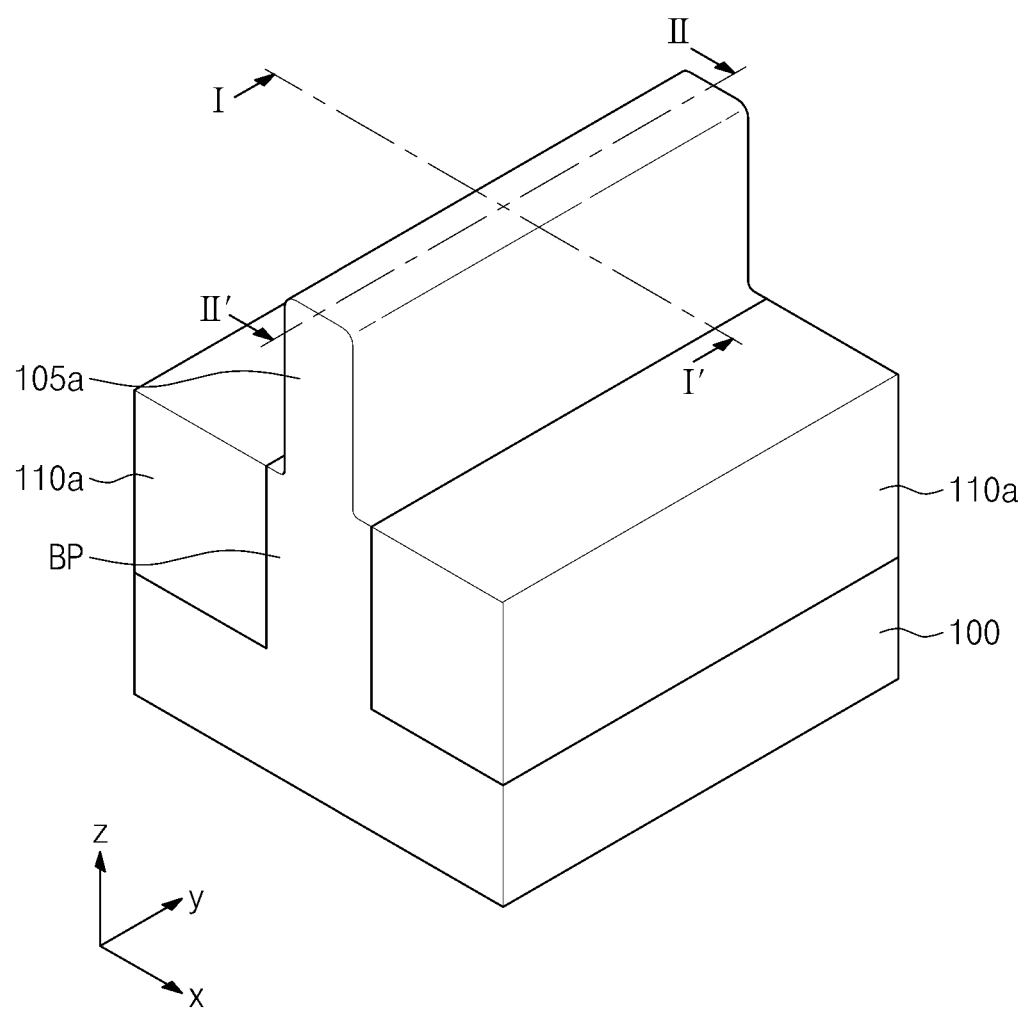
Figure 5B:
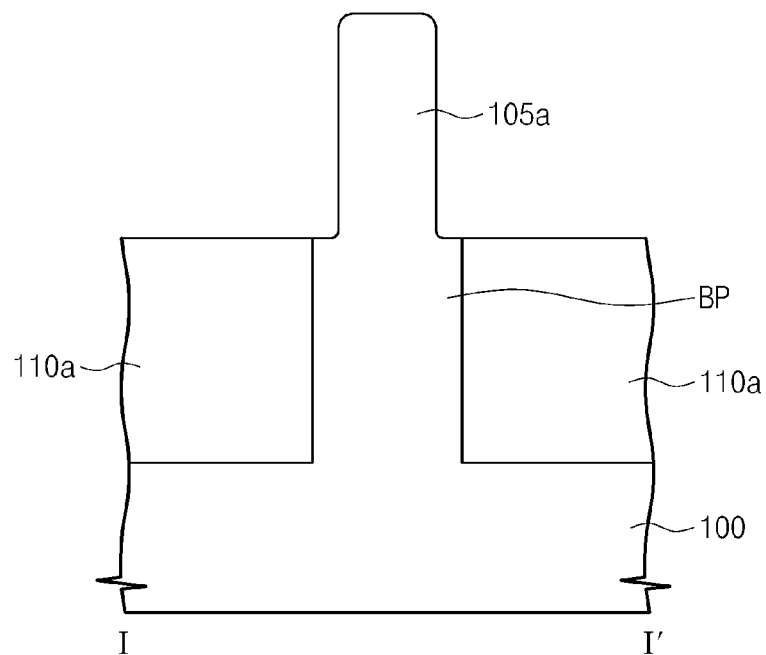
Figure 5C:
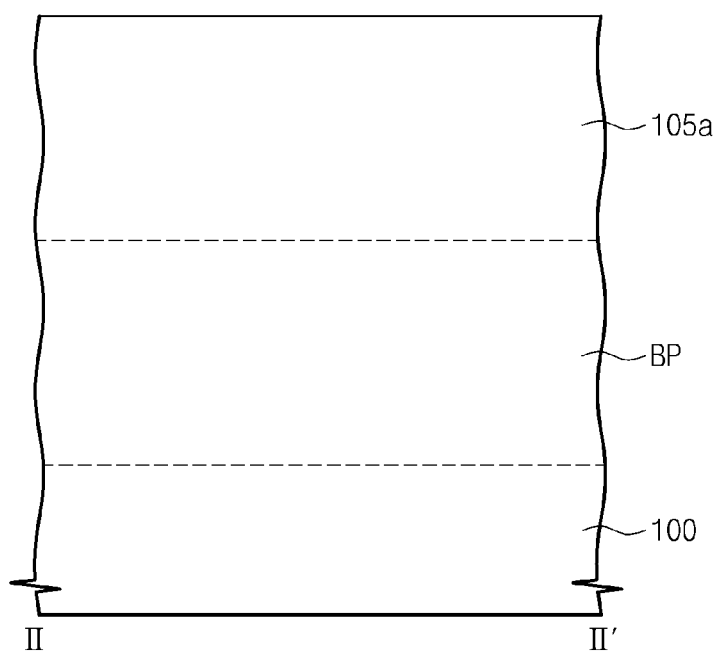

Referring to FIGS. 5A, 5B, and 5C, the planarized first insulating layer 110 may be recessed to form a first insulating pattern 110a. The first insulating pattern 110a covers sidewalls of a lower portion of the first preliminary fin 105. At this time, an upper portion of the first preliminary fin 105 is exposed.

A first thinning process may be performed on the expose upper portion of the first preliminary fin 105 to form a second preliminary fin 105a. At this time, a base part BP is formed under the second preliminary fin 105a. The base part BP corresponds to the lower portion of the first preliminary fin 105, which is not exposed in the first thinning process. The base part BP is covered by the first insulating pattern 110a.

The first thinning process reduces a width of the exposed upper portion of the first preliminary fin 105. According to an example of the first thinning process, the exposed upper portion of the first preliminary fin 105 may be directly etched by an isotropic etching process (e.g., a dry isotropic etching process and/or a wet isotropic etching process). According to another example of the first thinning process, the exposed upper portion of the first preliminary fin 105 may be oxidized to form a sacrificial oxide layer and then the sacrificial oxide layer may be removed. Semiconductor atoms (e.g., silicon atoms) in the exposed upper portion of the first preliminary fin 105 are consumed during the formation of the sacrificial oxide layer. Thus, the second preliminary fin 105a having a narrow width may be formed after the removal of the sacrificial oxide layer.

The first thinning process may have a controllable minimum removal thickness. A width of a lower portion of the second preliminary fin 105a may be substantially equal to or less than a value obtained by subtracting twice the minimum removal thickness of the first thinning process from the width of the base part BP. In some embodiments, the width of the lower portion of the second preliminary fin 105a may be substantially equal to or less than a value obtained by subtracting about 2 nanometers from the width of the base part BP.

Figure 6A:
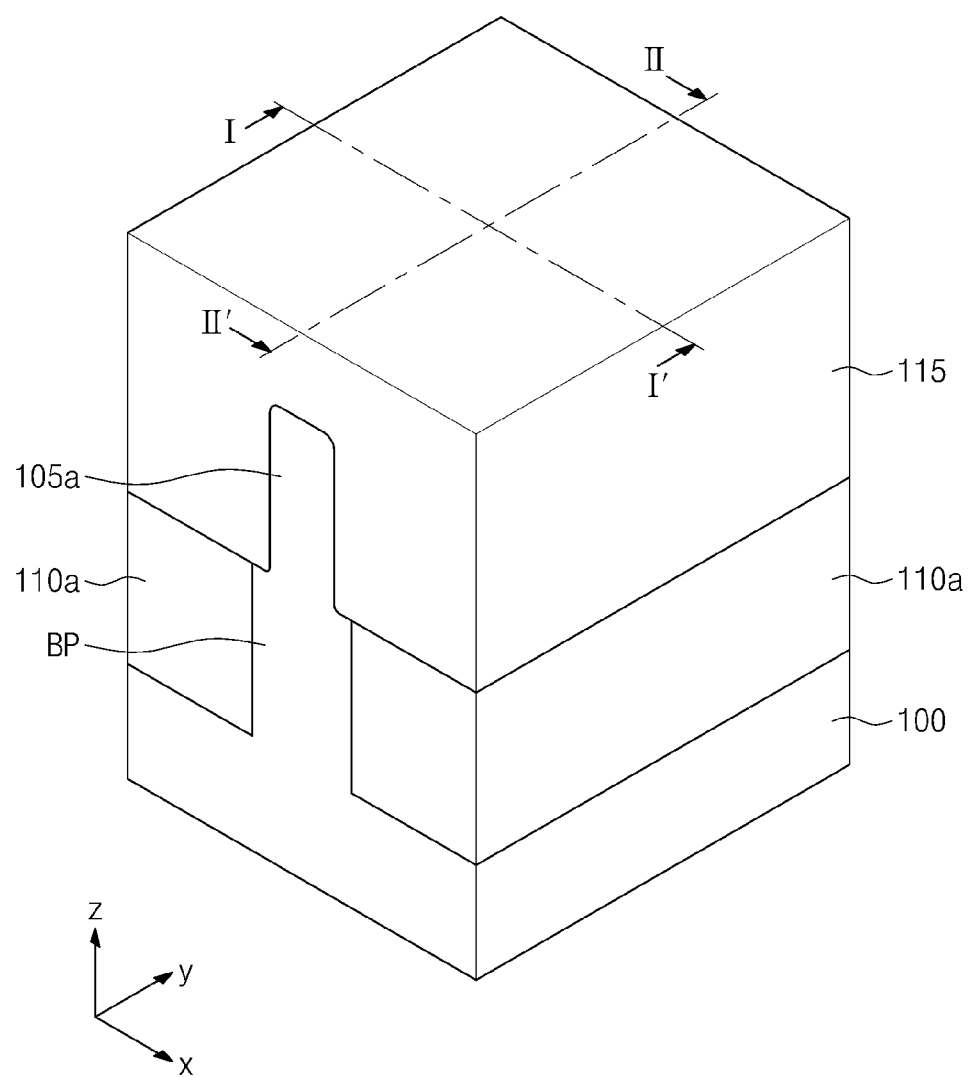
Figure 6B:
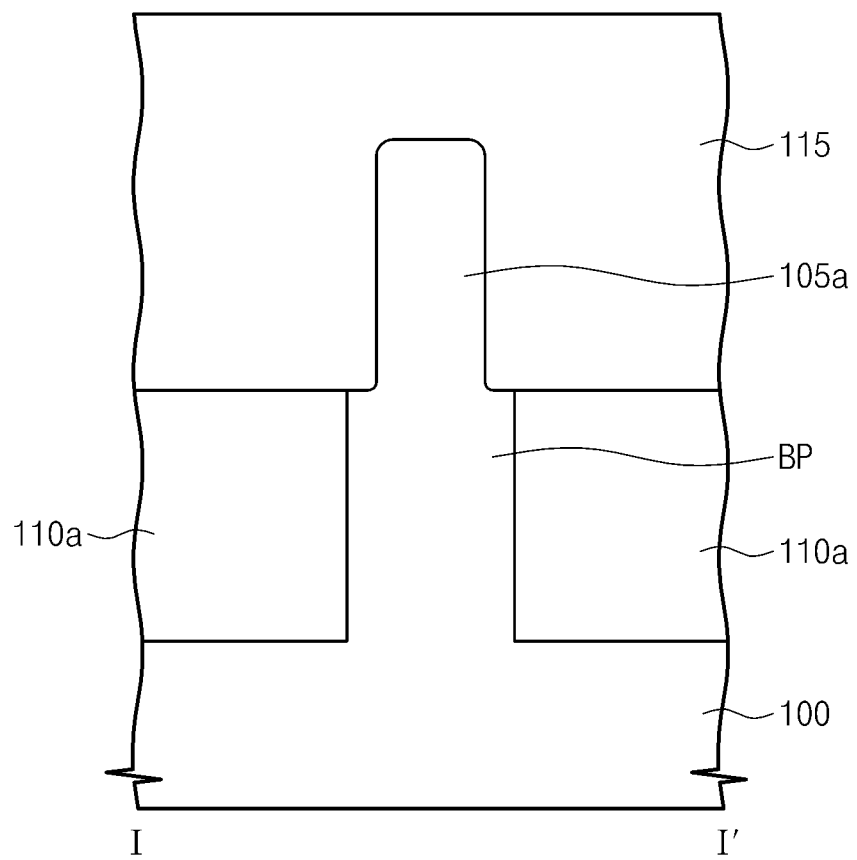
Figure 6C:
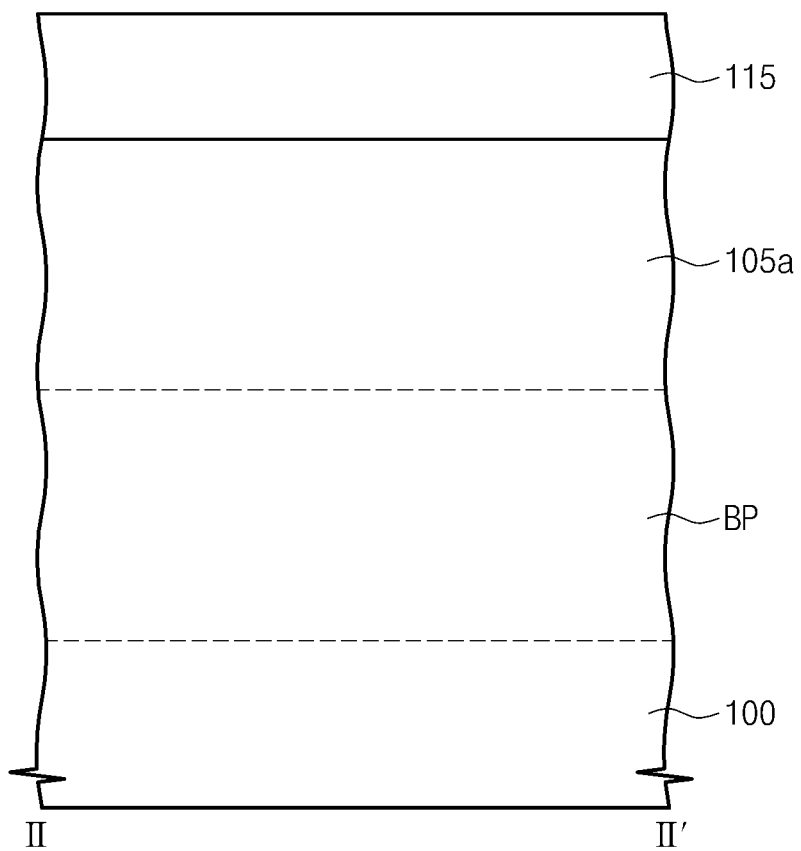

Referring to FIGS. 6A, 6B, and 6C, a second insulating layer 115 may be formed on the substrate 100 having the second preliminary fin 105a. The second insulating layer 115 covers sidewalls and a top surface of the second preliminary fin 105a. The second insulating layer 115 may include, for example, a single-layered silicon oxide layer or a multi-layered silicon oxide layer (e.g., a double layer of an USG layer and a TEOS layer).

Figure 7A:
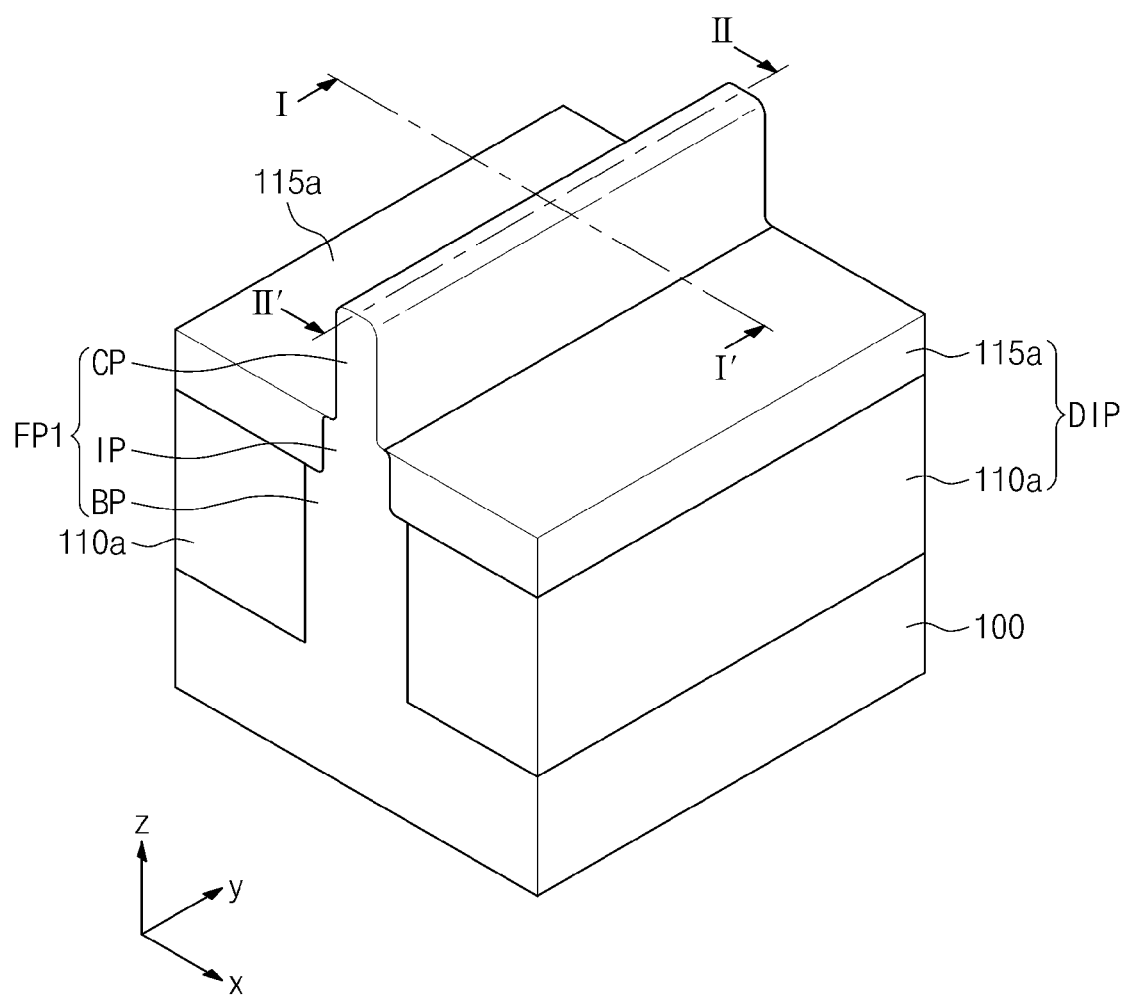
Figure 7B:
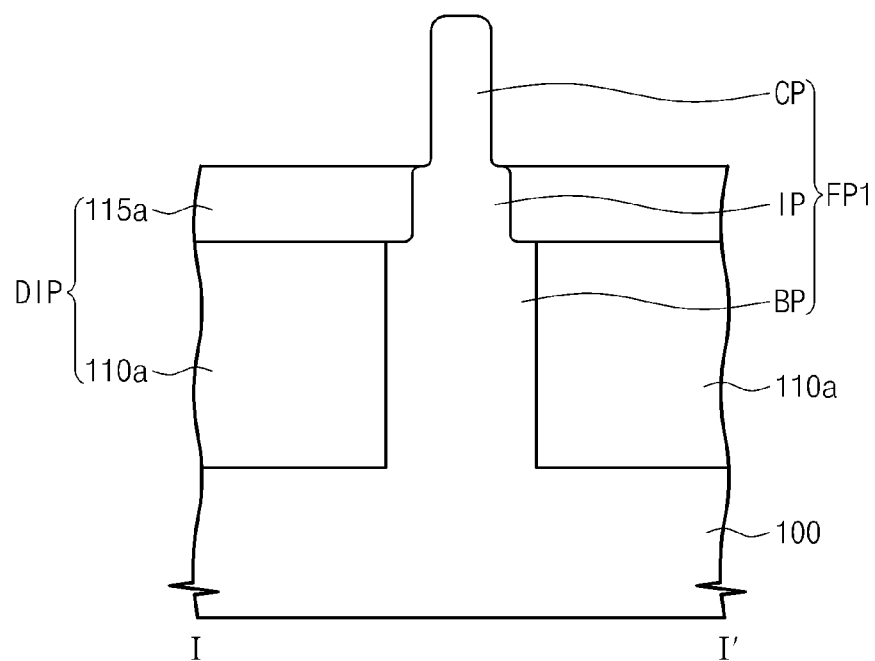
Figure 7C:
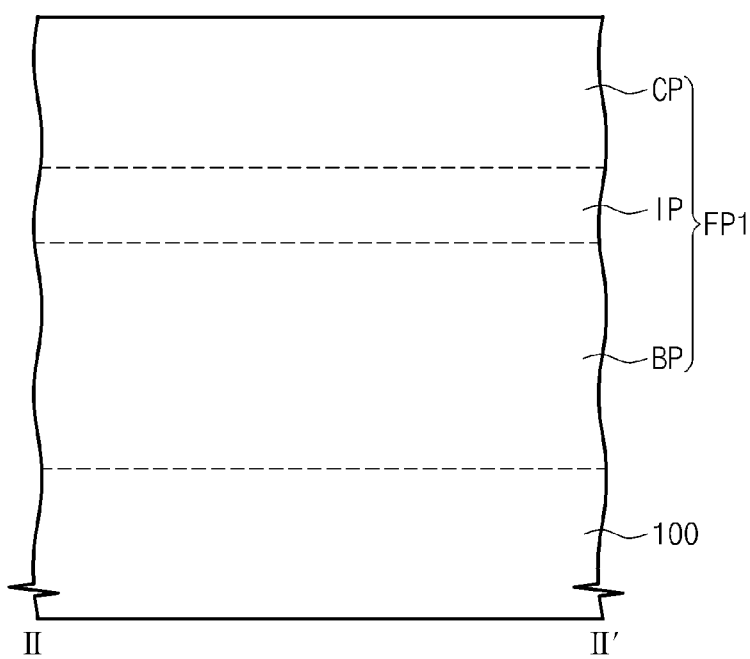

Referring to FIGS. 7A, 7B, and 7C, the second insulating layer 115 is recessed to form a second insulating pattern 115a. At this time, an upper portion of the second preliminary fin 105a is exposed. The lower portion of the second preliminary fin 105a is covered by the second insulating pattern 115a.

A second thinning process may be performed on the exposed upper portion of the second preliminary fin 105a, thereby forming a channel part CP. At this time, an intermediate part IP is formed under the channel part CP. The intermediate part IP corresponds to the lower portion of the second preliminary fin 105a, which is not exposed in the second thinning process. As result, a fin portion FP1 including the base part BP, the intermediate part IP, and the channel part CP is formed. In an example of the second thinning process, the exposed upper portion of the second preliminary fin 105a may be oxidized to form a sacrificial oxide layer and then the sacrificial oxide layer may be removed to form the channel part CP. In some embodiments, the sacrificial oxide layer may be removed by a wet etching process. In another example of the second thinning process, the exposed upper portion of the second preliminary fin 105a may be directly etched by an isotropic etching process. The first and second insulating patterns 110a and 115a may constitute a device isolation pattern DIP.

A width of the channel part CP is less than a width of the intermediate part IP due to the second thinning process. In some embodiments, the width of the channel part CP may be substantially equal to or less than a value obtained by subtracting twice a minimum removal thickness controllable by the second thinning process from the width of the intermediate part IP. In some embodiments, the width of the channel part CP may be substantially equal to or less than a value obtained by subtracting about 2 nanometers from the width of the intermediate part IP.

Figure 8A:
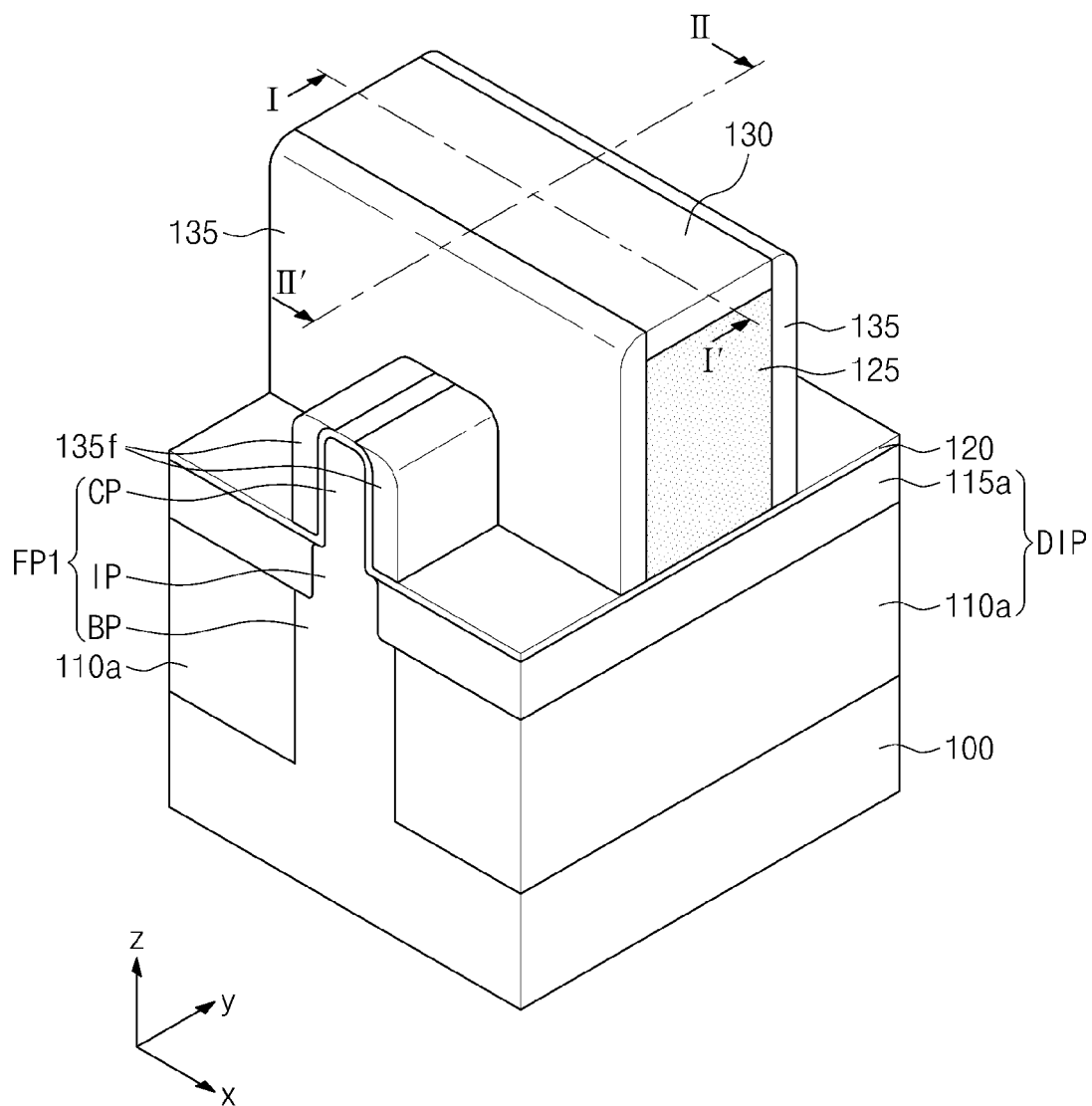
Figure 8B:
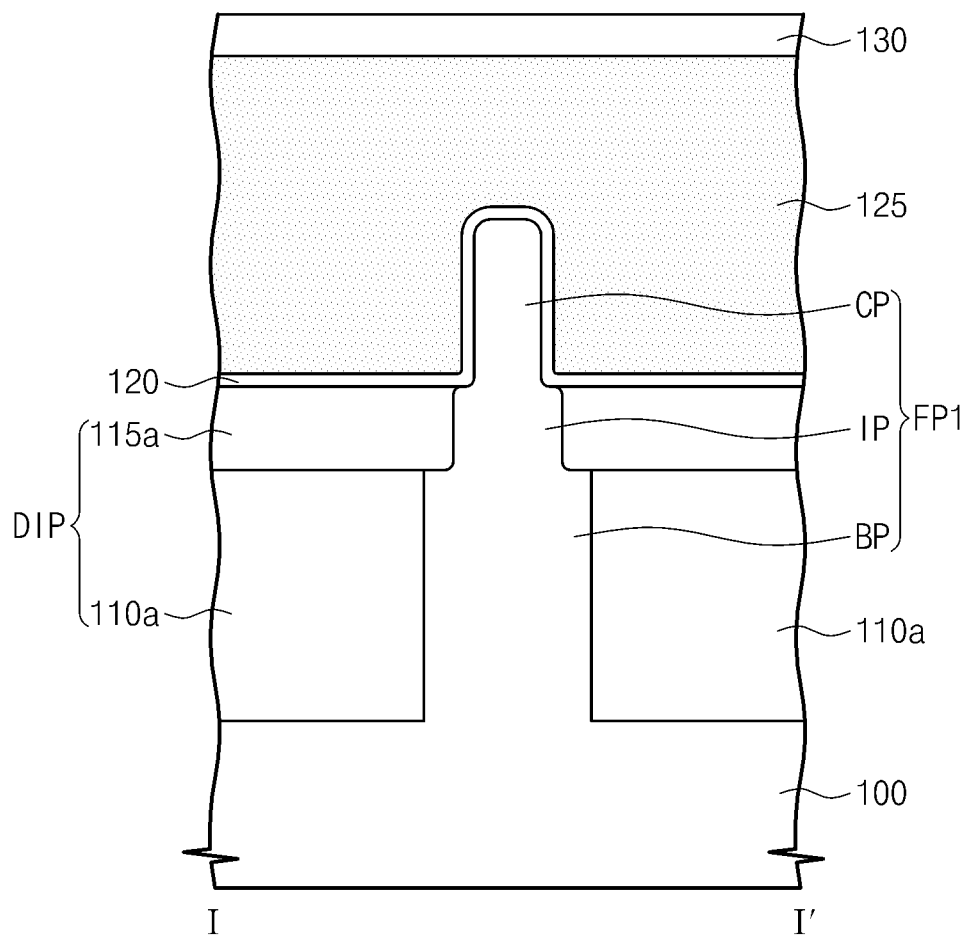
Figure 8C:
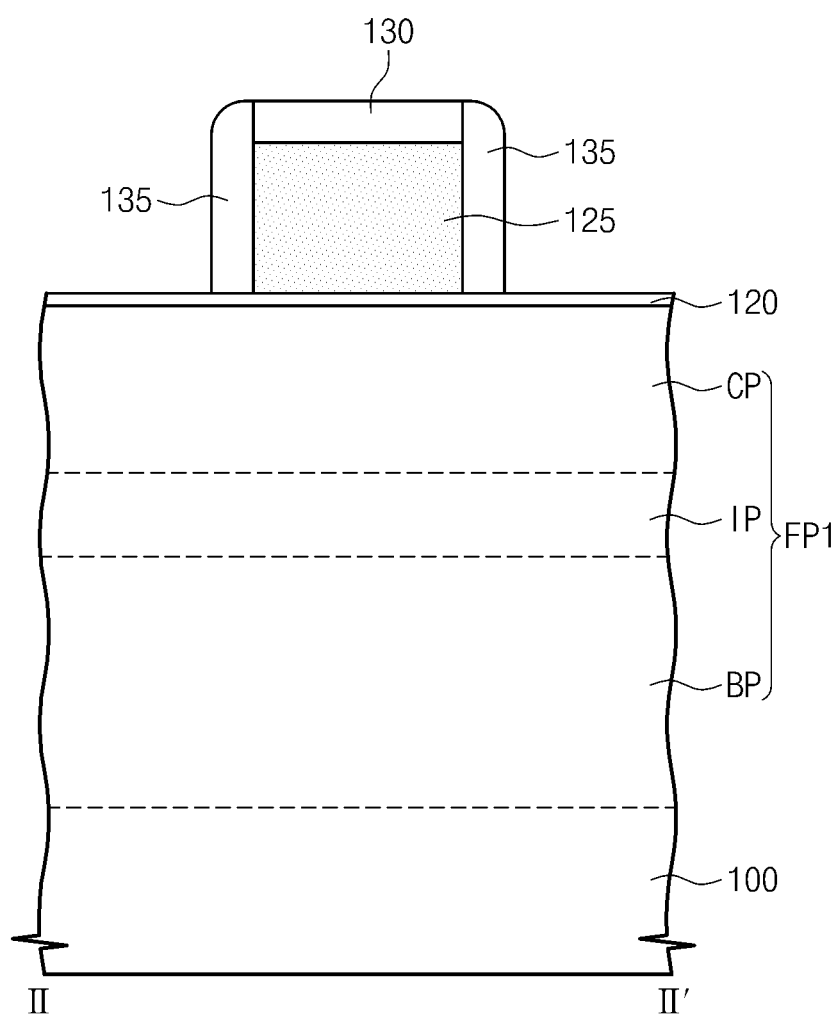

Referring to FIGS. 8A, 8B, and 8C, a buffer insulating layer 120 may be conformally formed on the substrate 100 including the fin portion FP1 and the device isolation pattern DIP. For example, the buffer insulating layer 120 may be a silicon oxide layer.

Subsequently, a dummy gate 125 may be formed to cross over the fin portion FP1. The dummy gate 125 may extend in an x-axis direction of FIG. 8A. A capping pattern 130 may be formed on the dummy gate 125. For example, a dummy gate layer and a capping layer may be sequentially formed on the substrate 100 having the buffer insulating layer 120, and then the capping layer and the dummy gate layer may be patterned to form the dummy gate 125 and the capping pattern 130 that are sequentially stacked. Before the capping layer is formed, a top surface of the dummy gate layer may be planarized. The capping pattern 130 may be formed of a material having an etch selectivity with respect to the dummy gate 125. For example, the dummy gate 125 may be formed of poly-silicon, and the capping pattern 130 may be formed of silicon oxide, silicon oxynitride, and/or silicon nitride. In other embodiments, the capping pattern 130 may be omitted.

A gate spacer layer may be conformally formed on the substrate 100 and then the gate spacer layer may be anisotropically etched to form gate spacers 135 on both sidewalls of the dummy gate 125, respectively. At this time, fin spacers 135f may be formed on sidewalls of the fin portion FP1 disposed at both sides of the dummy gate 125, as illustrated in FIG. 8A.

Figure 9A:
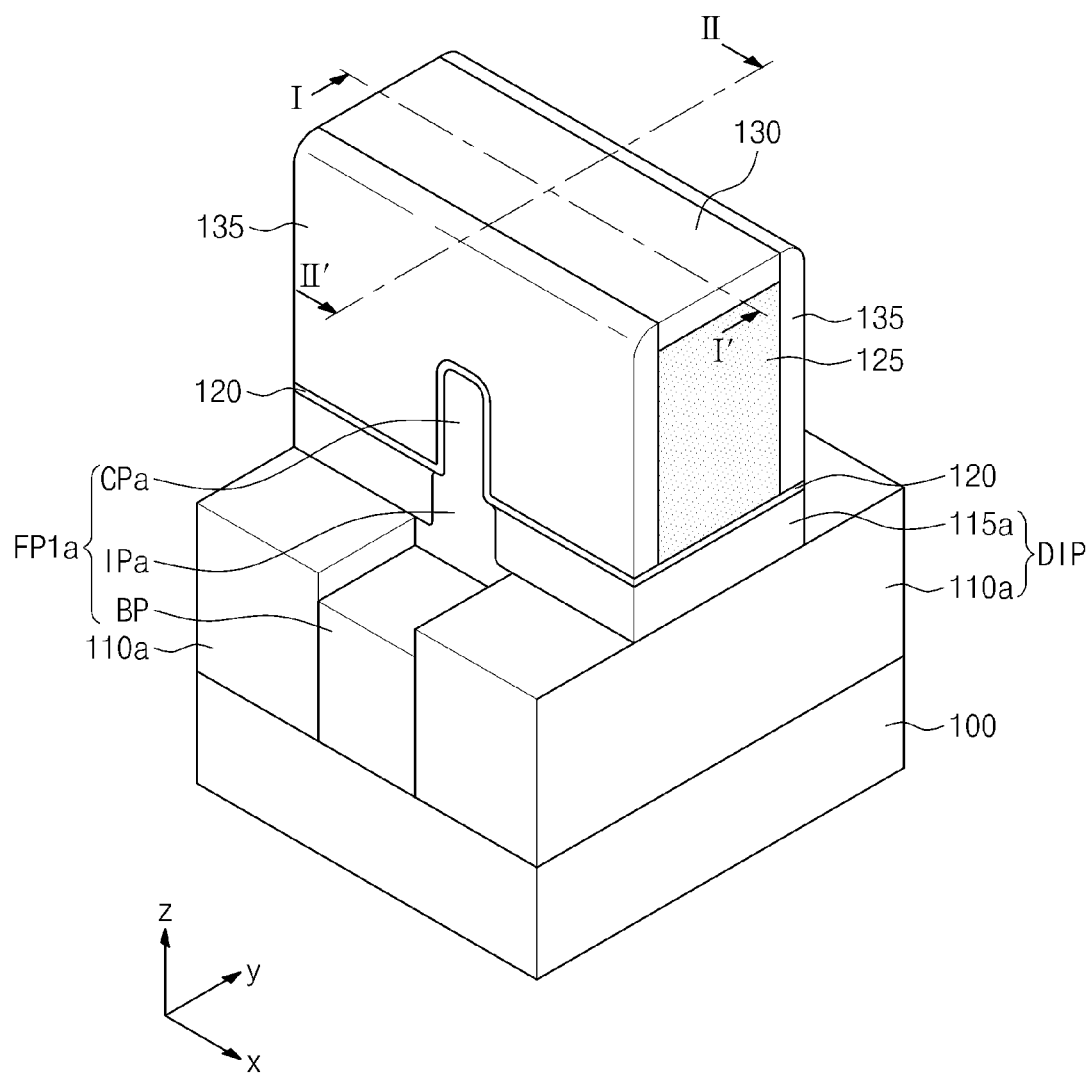
Figure 9B:
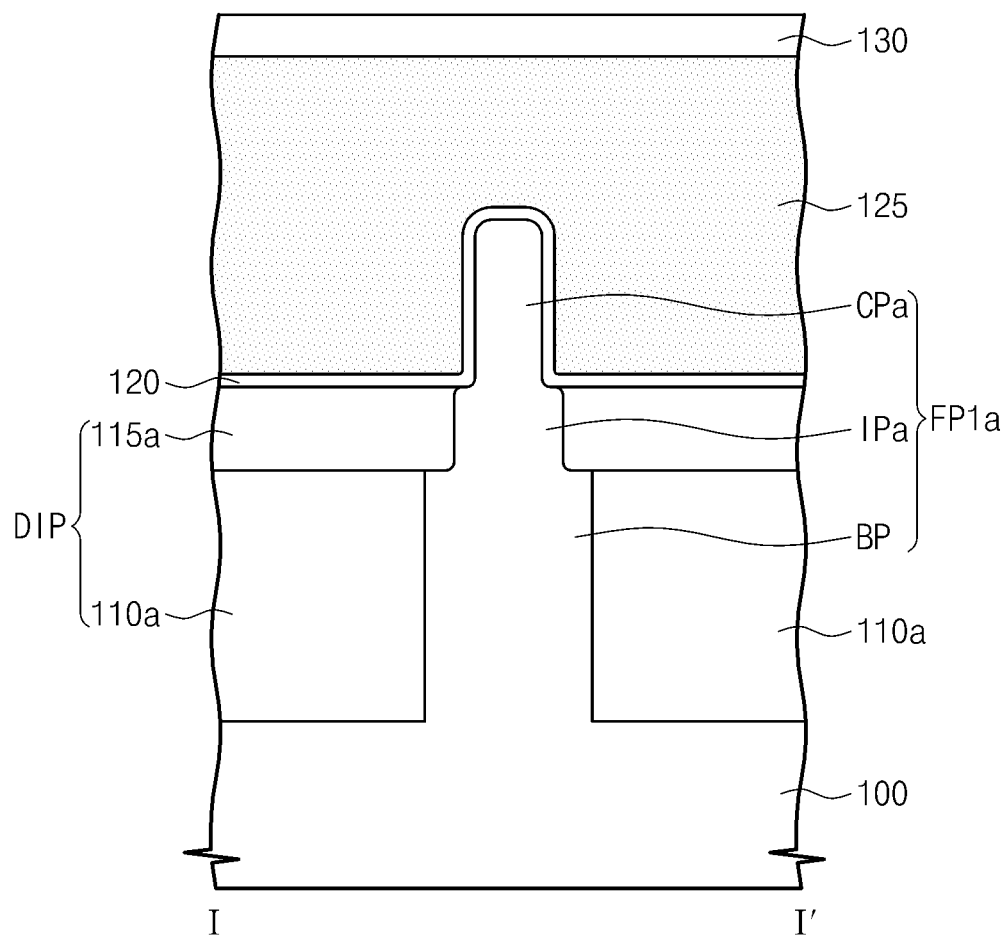
Figure 9C:
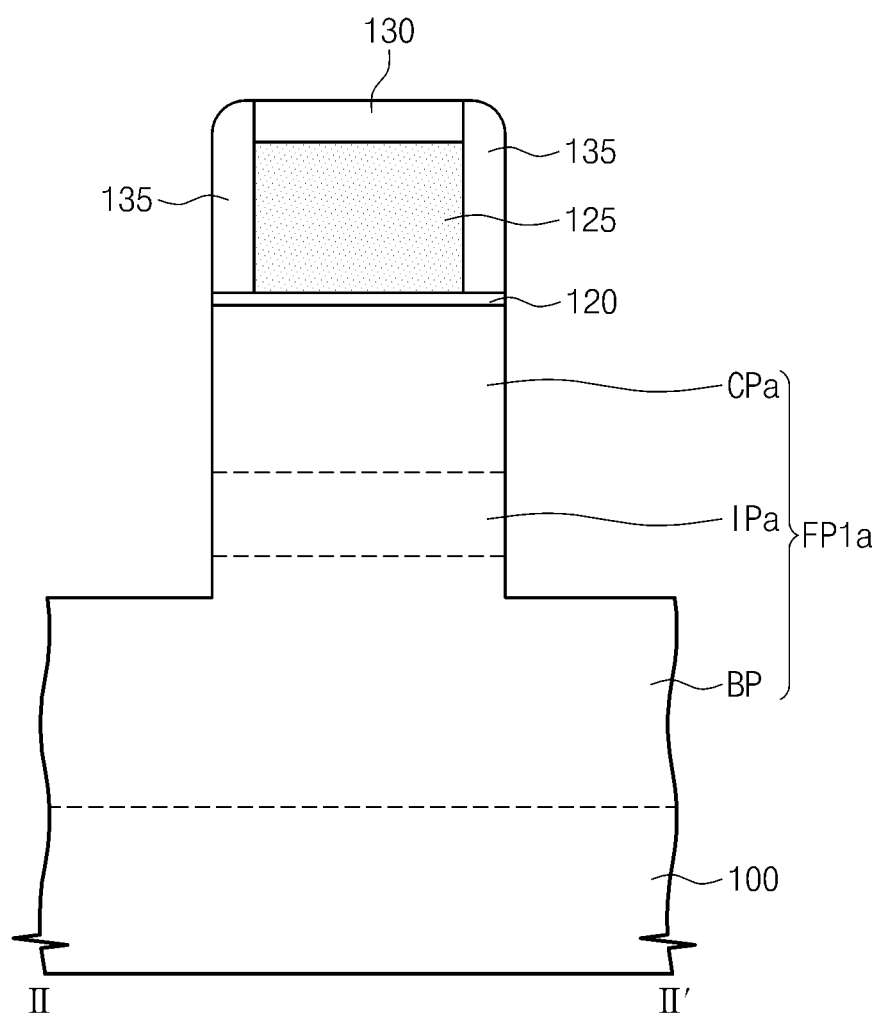

Referring to FIGS. 9A, 9B, and 9C, the fin portions FP1 (i.e., the channel part CP and the intermediate part IP) at both sides of the dummy gate 125 may be etched to expose the base part BP disposed at both sides of the dummy gate 125. Thus, the fin portion FP1a described with reference to FIGS. 1A to 1D is formed. Due to the etching process of exposing the base part BP, the fin spacers 135f may be removed, and the buffer insulating layer 120 and a portion of the device isolation pattern DIP at both sides of the dummy gate 125 may be etched. At this time, an upper portion of the capping pattern 130 may be etched. However, at least a lower portion of the capping pattern 130 may remain. Additionally, the gate spacers 135 may remain.

Figure 10A:
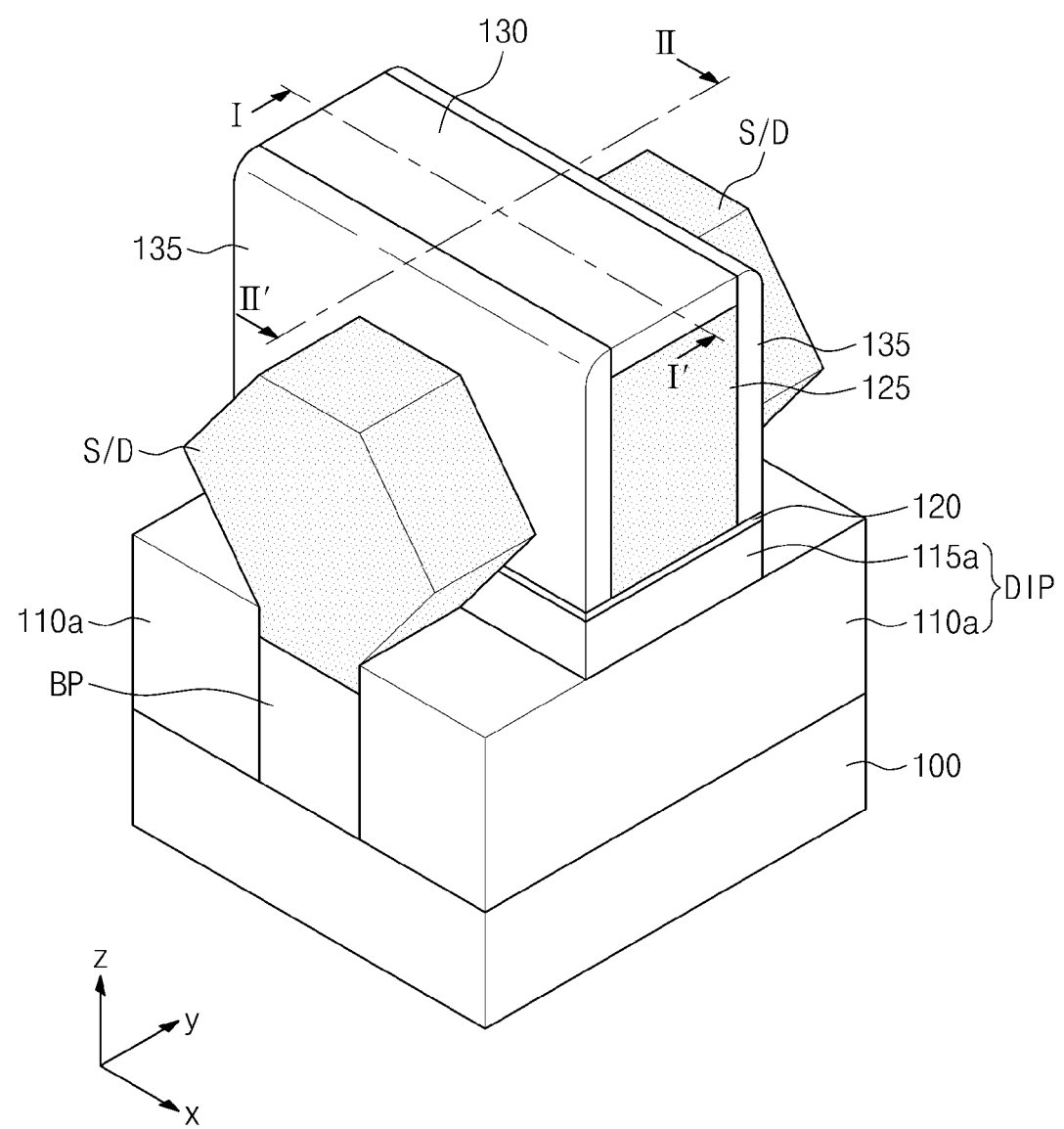
Figure 10B:
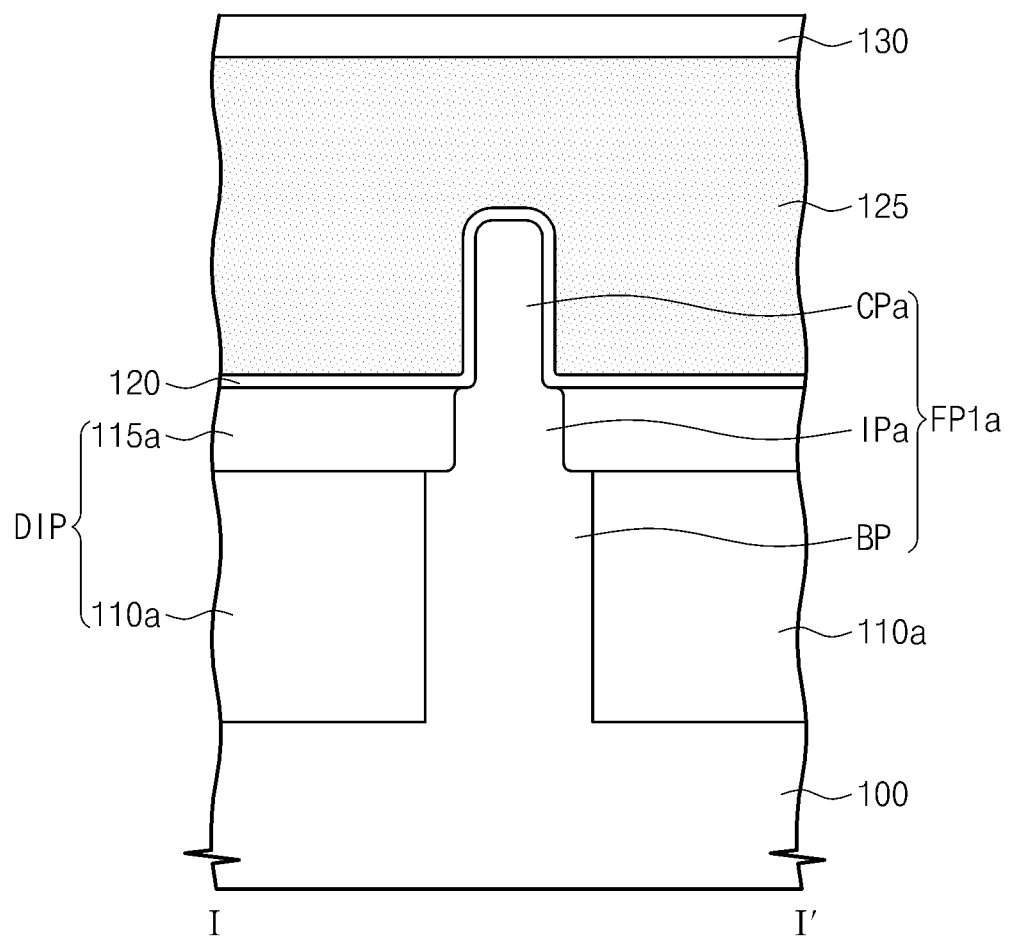
Figure 10C:
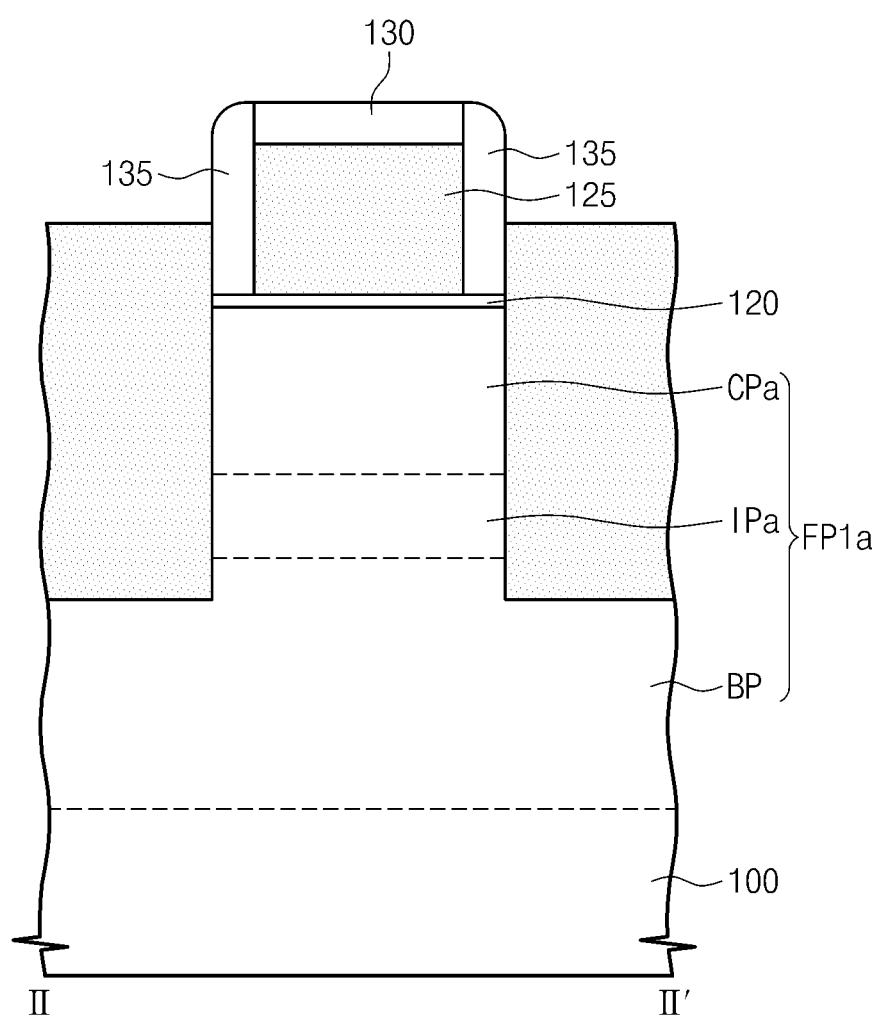

Referring to FIGS. 10A, 10B, and 10C, source/drain patterns S/D may be formed. For example, in one embodiment, a selective epitaxial growth process may be performed using the exposed top surfaces of the base part BP as seeds, thereby forming source/drain patterns S/D. As described above, the base part BP has the width wider than the widths of the channel part CPa and the intermediate part IPa. Thus, a seed area of the selective epitaxial growth process is increased. As a result, the source/drain patterns S/D may be easily formed. In one embodiment, the source/drain patterns S/D are be doped with dopants of a second conductivity type by an in-situ method or an ion implantation method.

As described with reference to FIGS. 1A to 1D, if the field effect transistor is a PMOS transistor, the source/drain patterns S/D may be formed to include a semiconductor material (e.g., silicon-germanium (SiGe)) capable of providing a compressive force to the channel part CPa. Alternatively, if the field effect transistor is an NMOS transistor, the source/drain patterns S/D may be formed to include, for example, silicon.

Figure 11A:
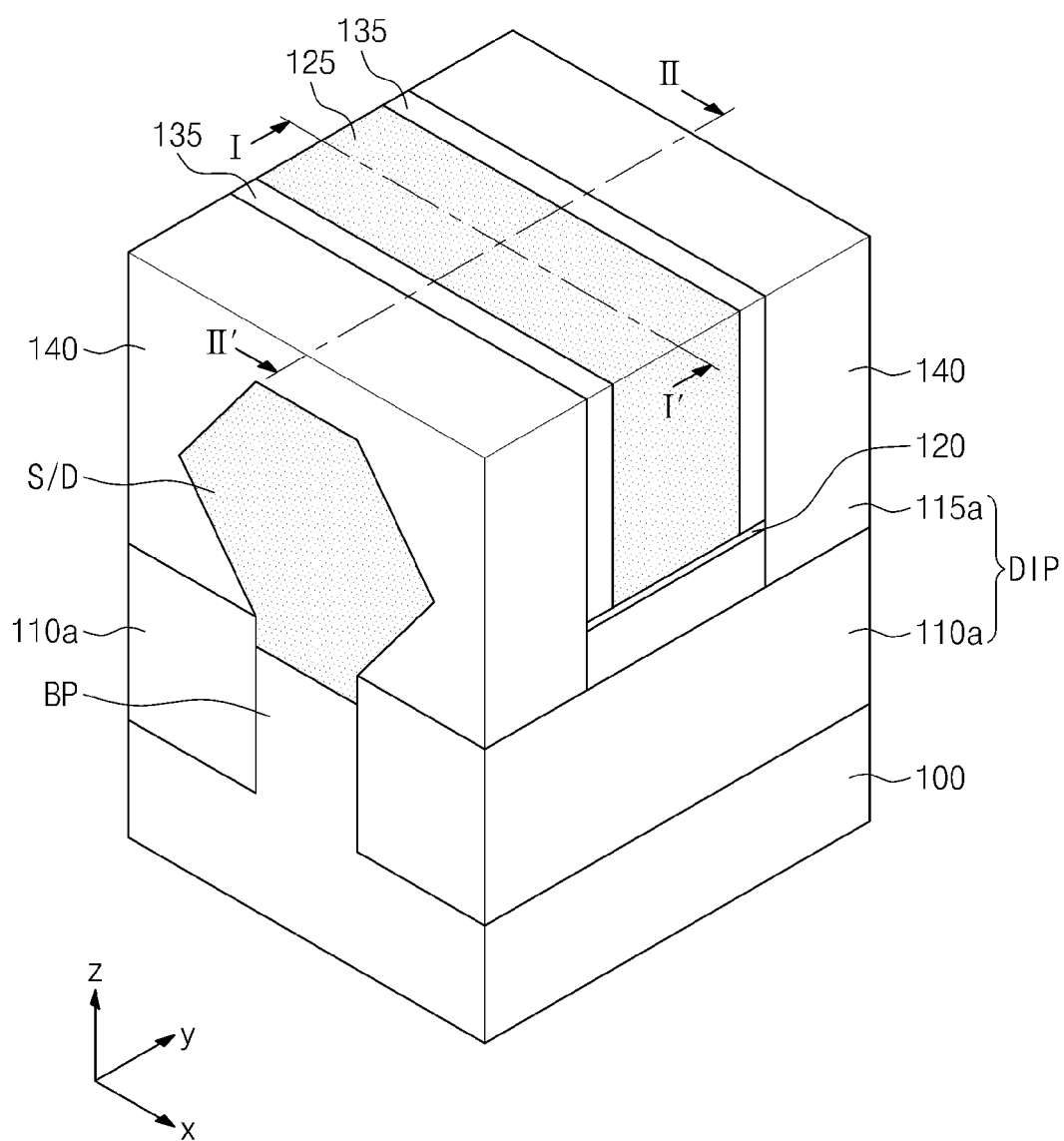
Figure 11B:
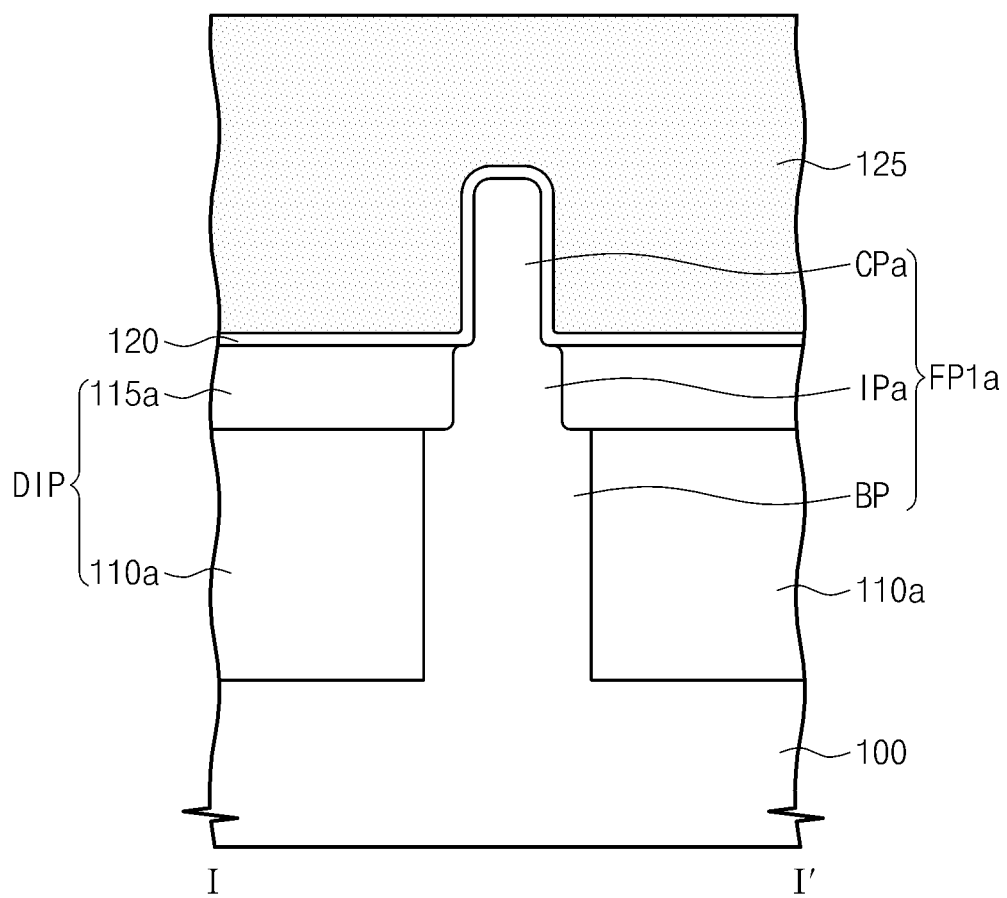
Figure 11C:
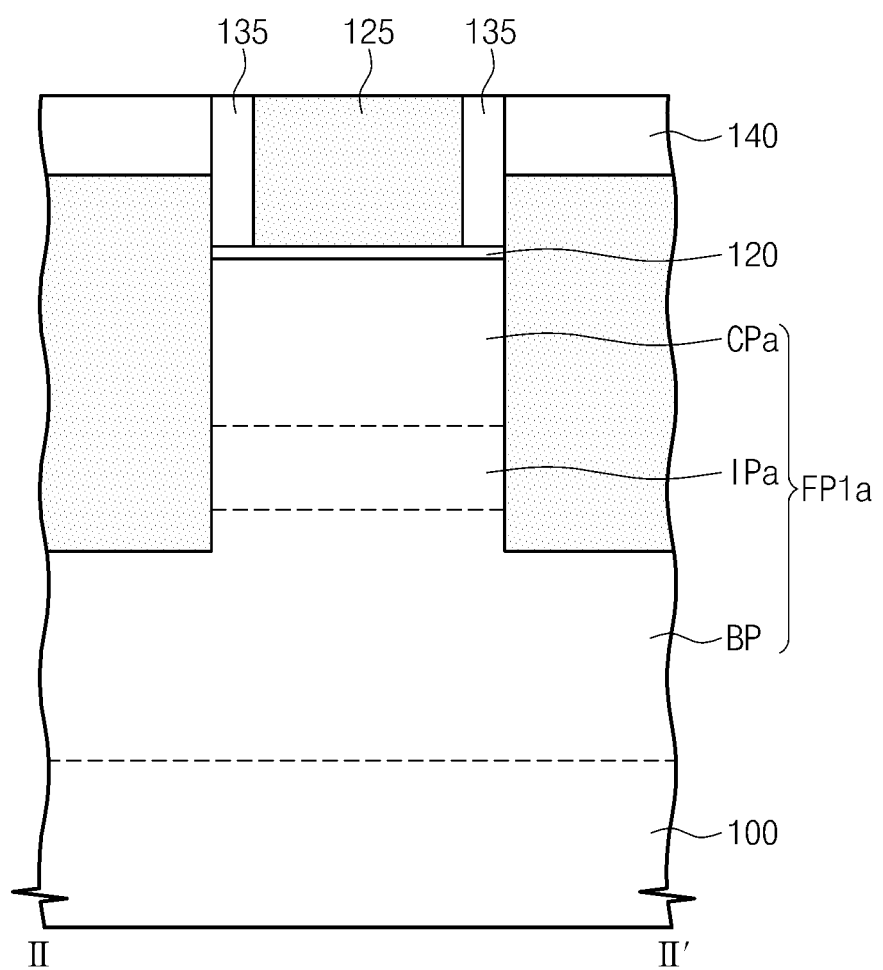

Referring to FIGS. 11A, 11B, and 11C, subsequently, an interlayer insulating layer 140 may be formed on an entire top surface of the substrate 100 and then the interlayer insulating layer 140 may be planarized. At this time, the dummy gate 125 may be used as a planarization stop layer. Thus, the remaining capping pattern 130 may be removed to expose the dummy gate 125. The planarized interlayer insulating layer 140 may cover the source/drain patterns S/D disposed at both sides of the dummy gate 125. Upper portions of the gate spacers 135 may be removed during the planarization process of the interlayer insulating layer 140. The dummy gate 125 has an etch selectivity with respect to the planarized interlayer insulating layer 140 and the gate spacers 135.

Figure 12A:
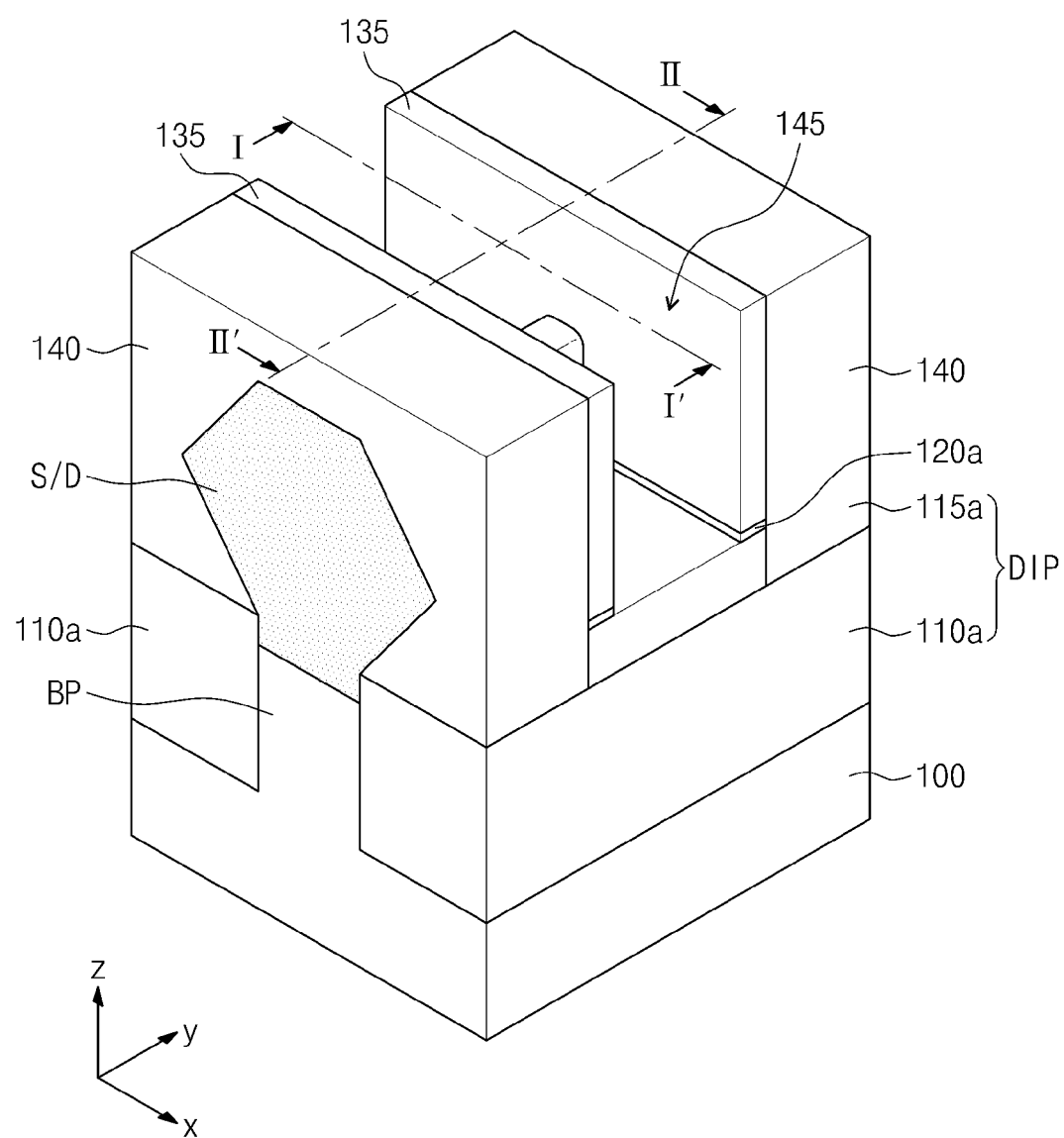
Figure 12B:
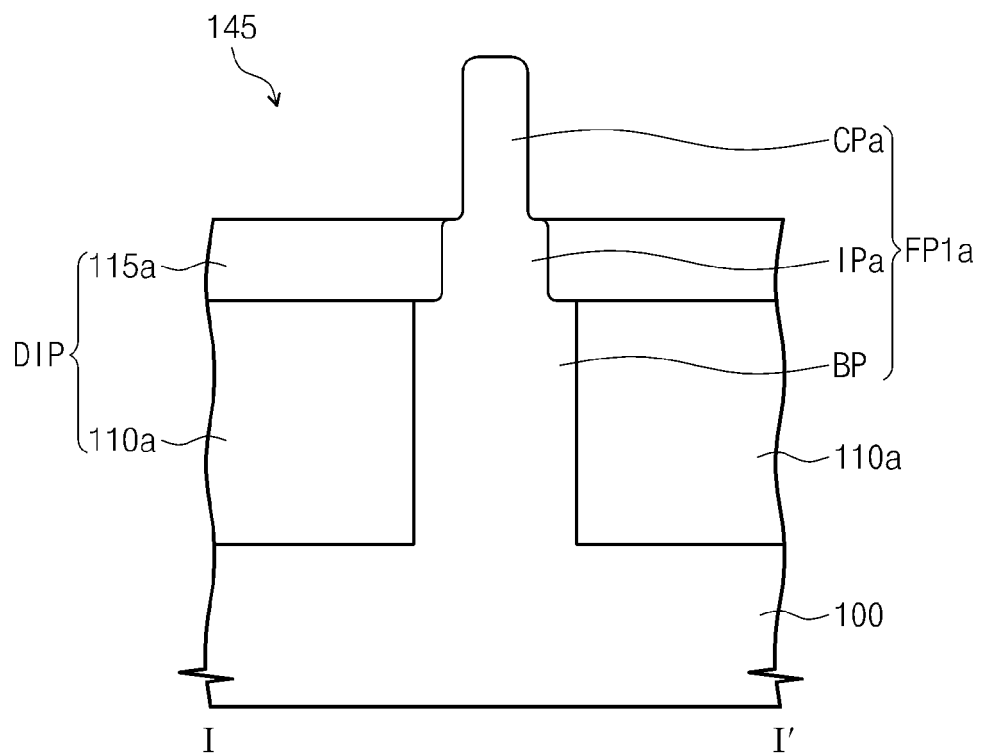
Figure 12C:
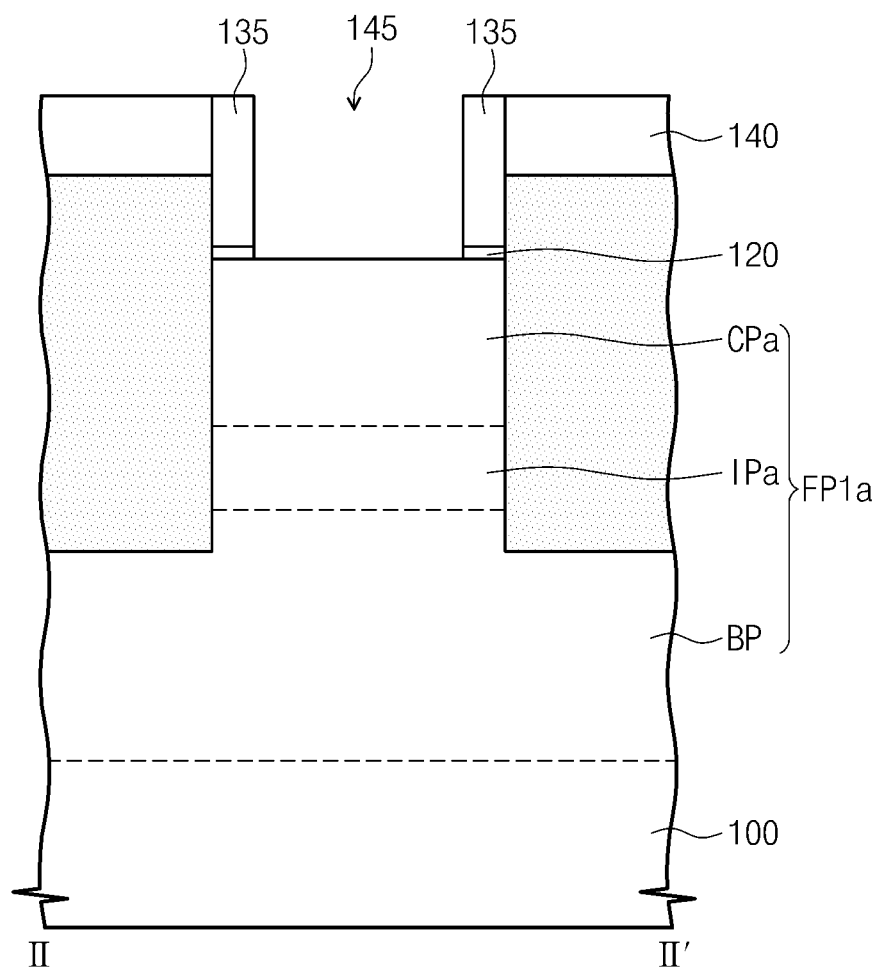

Referring to FIGS. 12A, 12B, and 12C, the exposed dummy gate 125 and the buffer insulating layer 120 thereunder are removed to form a gate groove 145. The gate groove 145 may expose the fin portion FP1a (in particular, the channel part CPa) under the dummy gate 125.

Subsequently, the gate insulating layer 150 of FIGS. 1A to 1D may be formed on the exposed fin portion FP1a in the gate groove 145, and then a gate conductive layer may be formed to fill the gate groove 145. The gate conductive layer may be planarized until the planarized interlayer insulating layer 140 is exposed, thereby forming the gate electrode 160 described with reference to FIGS. 1A to 1D in the gate groove 145.

The gate insulating layer 150 may include, for example, a silicon oxide layer and/or a high-k dielectric layer. The gate insulating layer 150 may be formed, for example, by a thermal oxidation process, a chemical vapor deposition (CVD) process, and/or an atomic layer deposition (ALD) process. In some embodiments, if the gate insulating layer 150 is formed by the thermal oxidation process, the gate insulating layer 150 may be confinedly formed on the exposed surface of the channel part CPa in the gate groove 145. In other embodiments, if the gate insulating layer 150 includes one or more insulating layers formed by the CVD process and/or the ALD process, the gate insulating layer 150 may be conformally formed on an inner surface of the gate groove 145 and a top surface of the planarized interlayer insulating layer 140.

In some embodiments, the gate conductive layer may include a conductive barrier layer and a metal layer that are sequentially stacked. The conductive barrier layer may be conformally formed on the inner surface of the gate groove 145 and the top surface of the planarized interlayer insulating layer 140. The metal layer may be formed to fill the gate groove 145. In this case, the gate electrode 160 may include the conductive barrier pattern 155 and the metal pattern 157 sequentially stacked, as illustrated in FIGS. 1A to 1D. In some embodiments, if the gate insulating layer 150 is also formed on the top surface of the planarized interlayer insulating layer 140, the gate insulating layer on the top surface of the planarized interlayer insulating layer 140 may be planarized along with the gate conductive layer.

Since the gate conductive layer is planarized until the planarized interlayer insulating layer 140 is exposed, a top surface of the gate electrode 160 may be substantially coplanar with the top surface of the planarized interlayer insulating layer 140.

In the method of manufacturing the semiconductor device described above, the gate electrode 160 is formed using the dummy gate 125 and the gate groove 145. Alternatively, the gate insulating layer 150 and the gate conductive layer may be sequentially formed on the structure illustrated in FIGS. 7A to 7C and then the gate conductive layer may be patterned to form a gate electrode.

On the other hand, the fin portion FP1 may be formed by different methods.

FIGS. 13A to 13E are cross-sectional views illustrating another example of a method of forming a fin portion in a method of manufacturing a semiconductor device according to some embodiments.

Figure 13A:
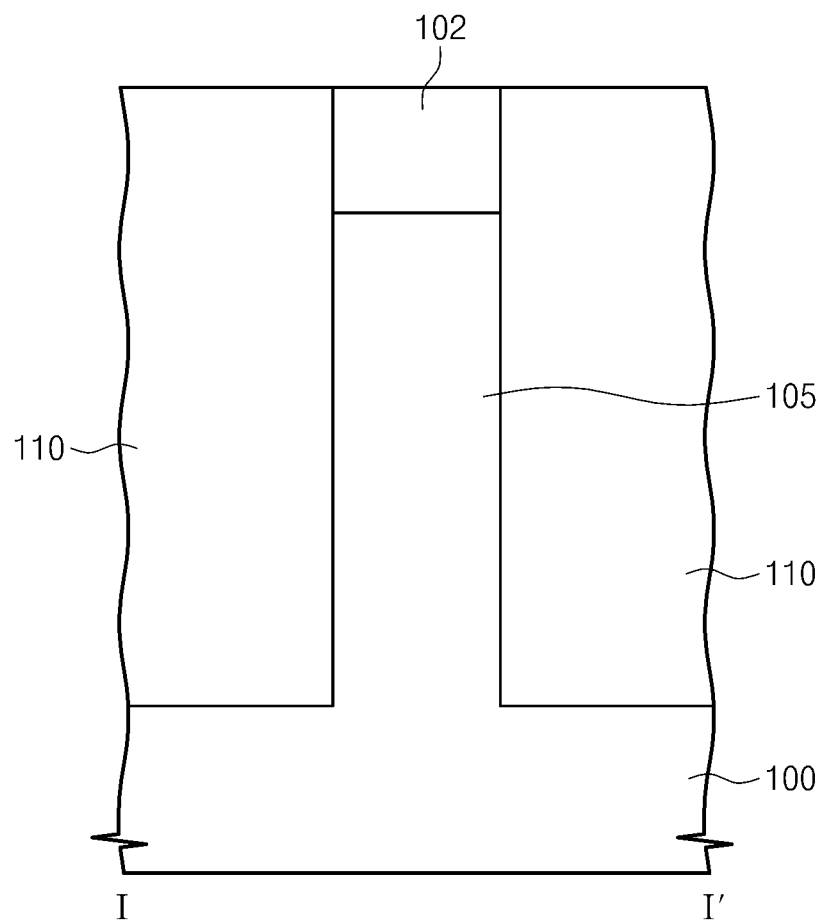
FIGS. 13A to 13E are cross-sectional views illustrating another example of a method of forming a fin portion in a method of manufacturing a semiconductor device according to some exemplary embodiments.

Referring to FIG. 13A, a mask pattern 102 may be formed on a substrate 100, and then the substrate 100 may be etched using the mask pattern 102 as an etch mask to form the first preliminary fin 105. Subsequently, the first insulating layer 110 may be formed on the substrate 100 and then the first insulating layer 110 may be planarized until the mask pattern 102 is exposed.

Figure 13B:
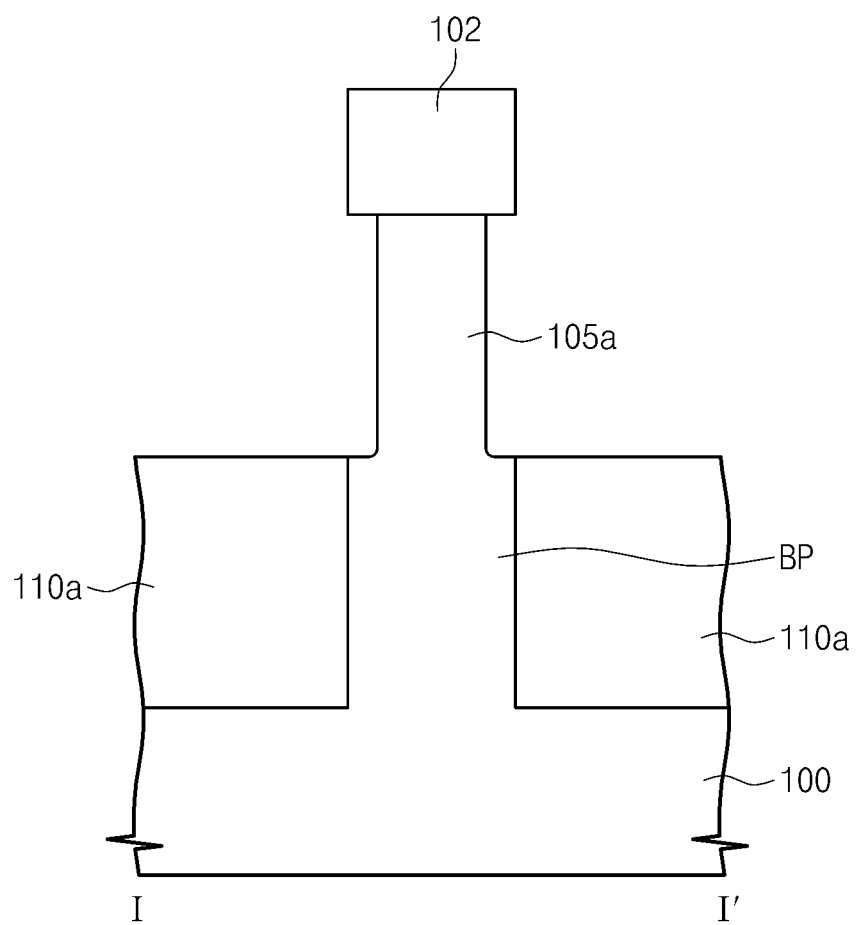

Referring to FIG. 13B, the planarized first insulating layer 110 may be recessed to form a first insulating pattern 110a. The first insulating pattern 110a may cover a lower portion of the first preliminary fin 105, and sidewalls of an upper portion of the first preliminary fin 105 may be exposed. At this time, the mask pattern 102 remains on a top surface of the first preliminary fin 105.

The first thinning process is performed on the exposed sidewalls of the upper portion of the first preliminary fin 105, thereby forming a second preliminary fin 105a. At this time, the base part BP is formed under the second preliminary fin 105a. Since the mask pattern 102 remains on the top surface of the first preliminary fin 105 during the first thinning process, a height of the second preliminary fin 105a may not be reduced.

Figure 13C:
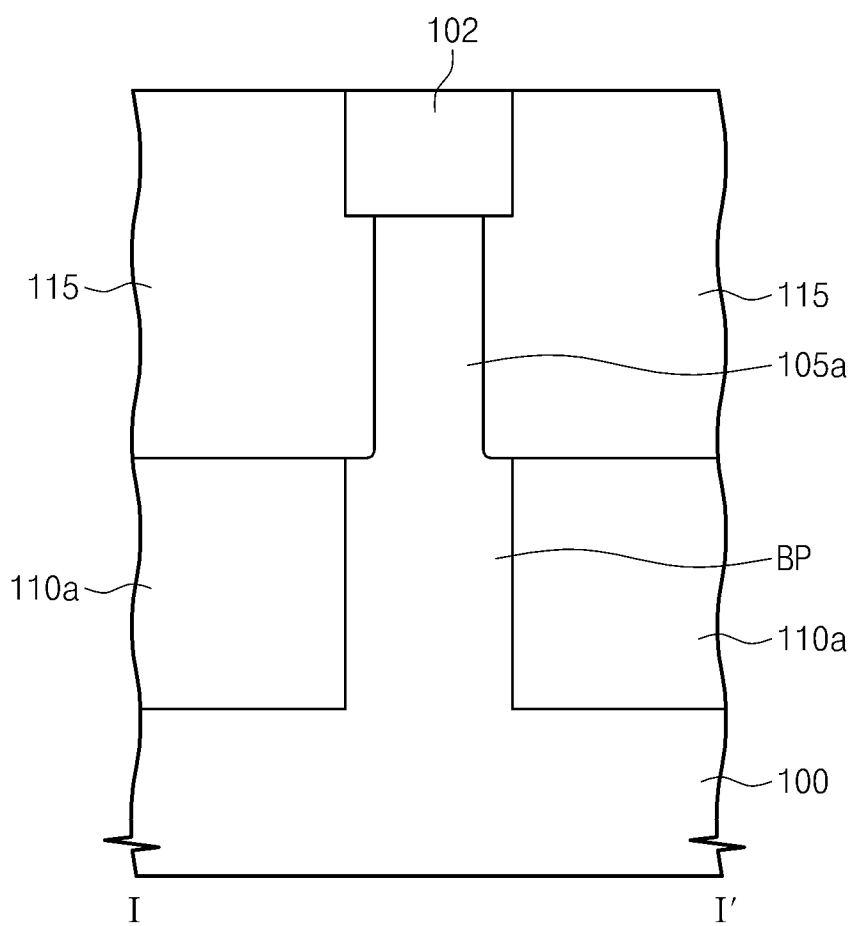

Referring to FIG. 13C, the second insulating layer 115 is formed on the substrate 100 and then the second insulating layer 115 may be planarized until the mask pattern 102 is exposed.

Figure 13D:
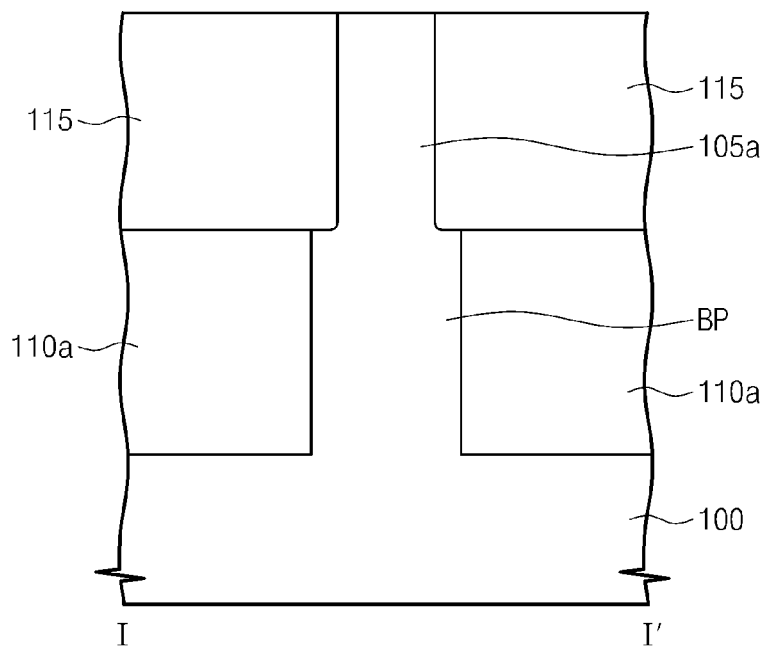

Referring to FIG. 13D, the exposed mask pattern 102 may be removed to expose a top surface of the second preliminary fin 105a. At this time, an upper portion of the planarized second insulating layer 115 may be partially etched.

Figure 13E:
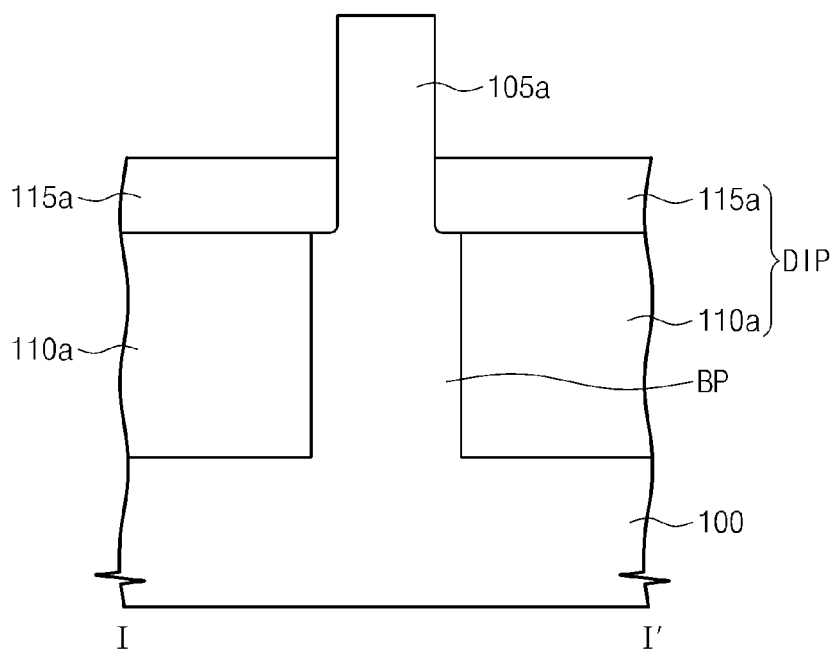

Referring to FIG. 13E, the planarized second insulating layer 115 may be recessed to form a second insulating pattern 115a covering a lower portion of the second preliminary fin 105a. At this time, an upper portion of the second preliminary fin 105a is exposed. Subsequently, the second thinning process described with reference to FIGS. 7A to 7C may be performed on the exposed upper portion of the second preliminary fin 105a. Thus, the fin portion FP1 of FIGS. 7A to 7C may be formed. Next, the subsequent processes described with reference to FIGS. 8A to 12A, 8B to 12B, and 8C to 12C may be performed.

FIGS. 14A to 14E are cross-sectional views illustrating still another example of a method of forming a fin portion in a method of manufacturing a semiconductor device according to some embodiments.

Figure 14A:
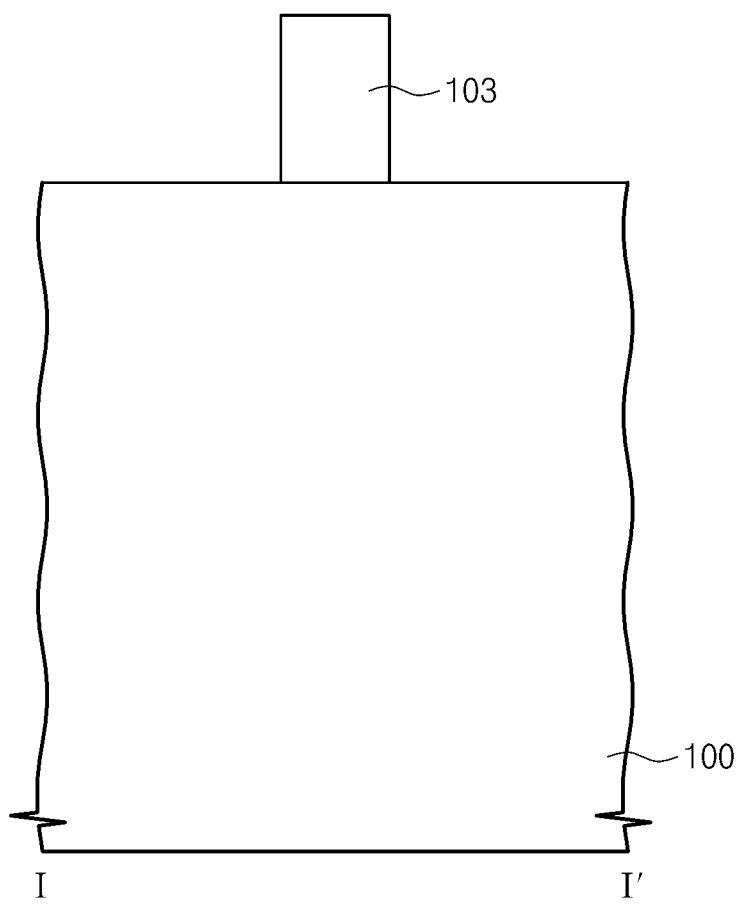
FIGS. 14A to 14E are cross-sectional views illustrating still another example of a method of forming a fin portion in a method of manufacturing a semiconductor device according to some embodiments.

Referring to FIG. 14A, a mask pattern 103 may be formed on a substrate 100. A width of the mask pattern 103 may be substantially equal to the width WI of the intermediate part IPa described with reference to FIGS. 1A to 1D.

Figure 14B:
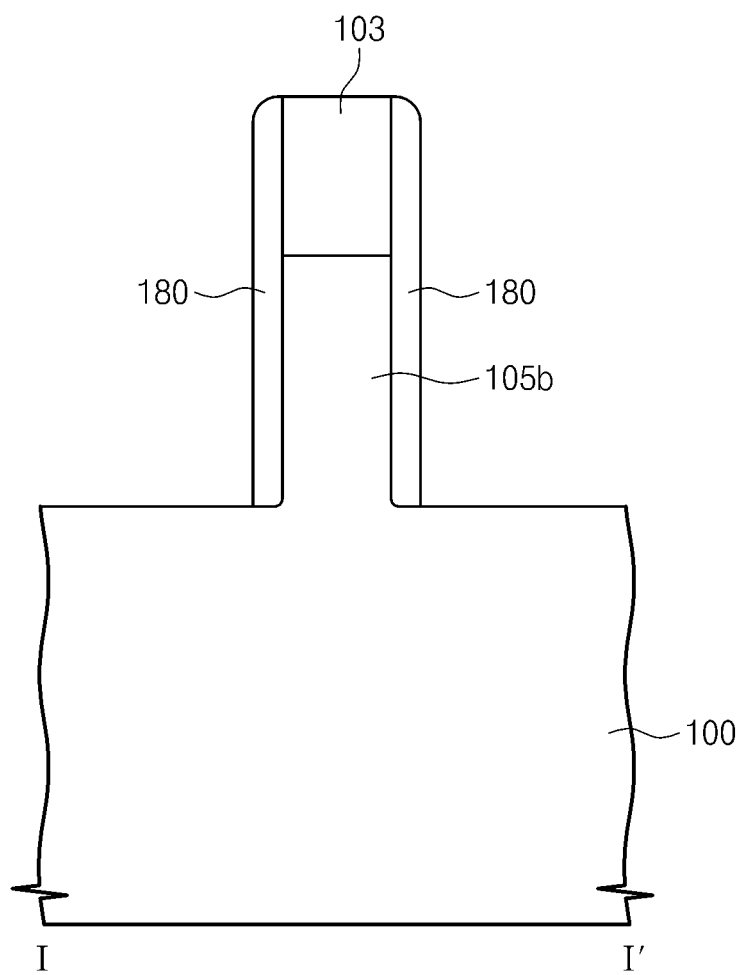

Referring to FIG. 14B, the substrate 100 may be etched using the mask pattern 103 as an etch mask, thereby forming a preliminary fin 105b. A bottom end of the preliminary fin 105b may be disposed at substantially the same level as a bottom end of the intermediate part IPa.

A mask spacer layer may be conformally formed on the substrate 100 and then the mask spacer layer may be etched (e.g., anisotropically etched) to form mask spacers 180 on sidewalls of the preliminary fin 105b and the mask patterns 103. The mask spacer layer may be formed, for example, by a chemical vapor deposition (CVD) process or an atomic layer deposition (ALD) process. The mask spacers 180 may be formed of an insulating material having an etch selectivity with respect to the substrate 100. For example, the mask spacers 180 may be formed of silicon oxide, silicon oxynitride, and/or silicon nitride.

Figure 14C:
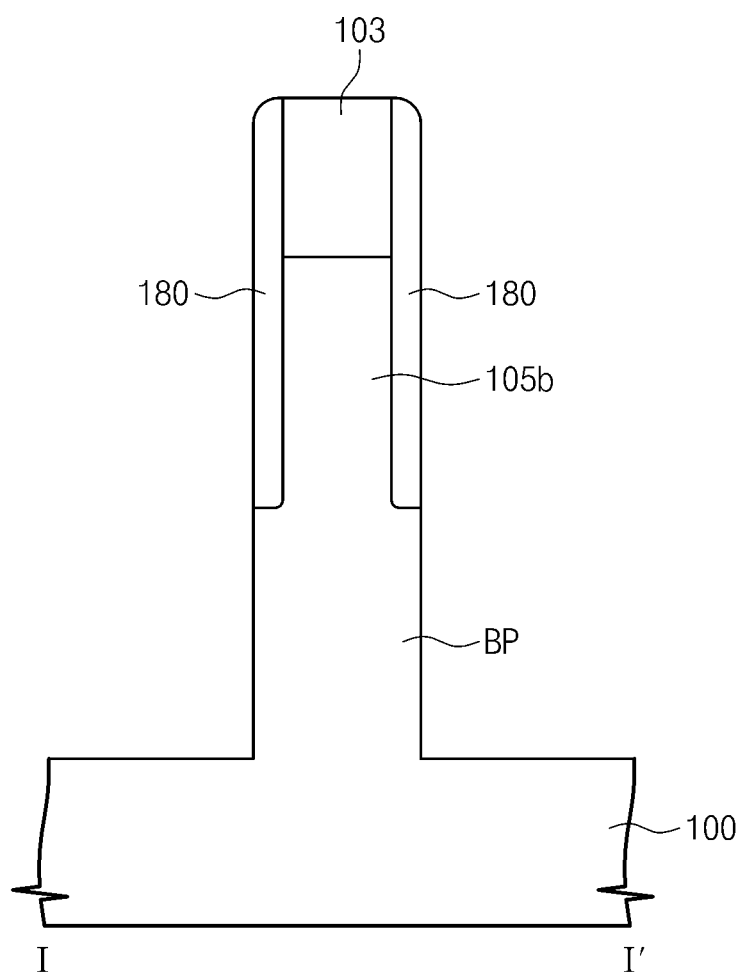

Referring to FIG. 14C, the substrate 100 may be etched using the mask pattern 103 and the mask spacers 180 as etch masks, thereby forming the base part BP under the preliminary fin 105b.

Figure 14D:
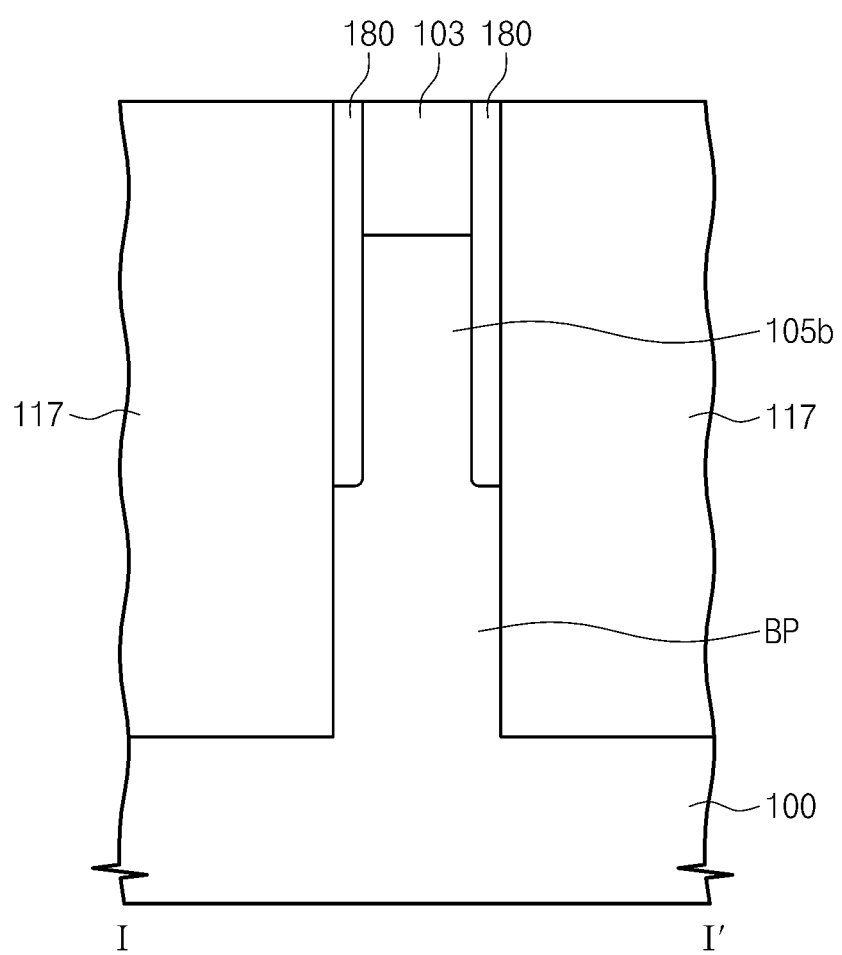

Referring to FIG. 14D, subsequently, a device isolation layer 117 may be formed on the substrate 100 and then the device isolation layer 117 may be planarized until the mask pattern 103 is exposed.

Figure 14E:
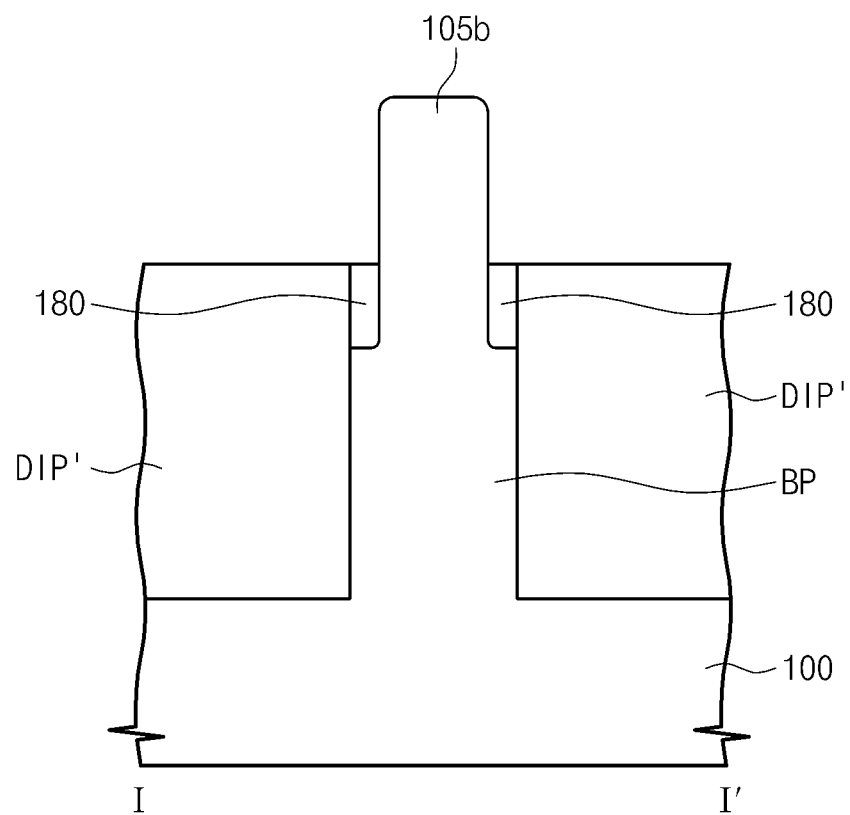

Referring to FIG. 14E, the exposed mask pattern 103 may be removed. The planarized device isolation layer 117 may be recessed to form a device isolation pattern DIP'. The device isolation pattern DIP' covers a lower portion of the preliminary fin 105b. When the planarized device isolation layer 117 is recessed, the mask spacers 180 are etched to expose an upper portion of the preliminary fin 105b. Thus, mask spacer patterns 180 may be formed between the device isolation pattern DIP' and sidewalls of the lower portion of the preliminary fin 105b, respectively.

The second thinning process described with reference to FIGS. 7A to 7C may be performed on the exposed upper portion of the preliminary fin 105b, thereby forming the fin portion FP1 illustrated in FIGS. 7A to 7C. Thereafter, the subsequent processes described with reference to FIGS. 8A to 12A, 8B to 12B, and 8C to 12C may be performed to realize the semiconductor device illustrated in FIGS. 2A and 2B.

Figure 15A:
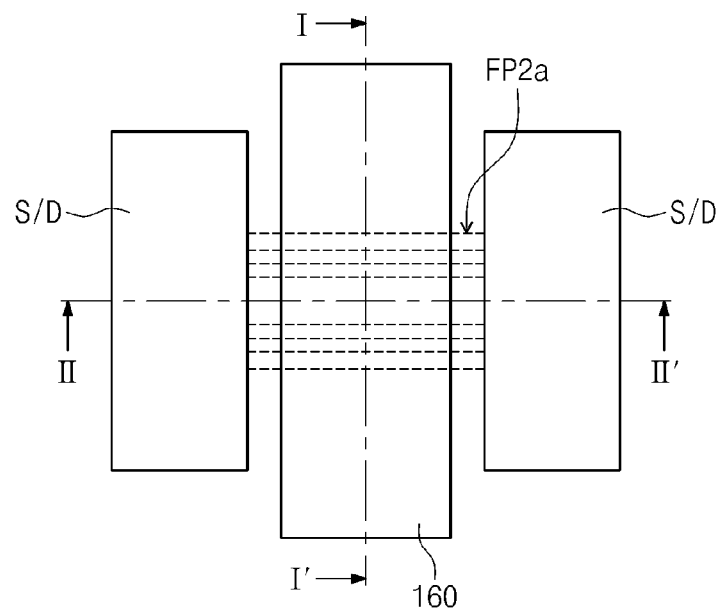
FIG. 15A is a plan view illustrating a semiconductor device according to other exemplary embodiments.
Figure 15B:
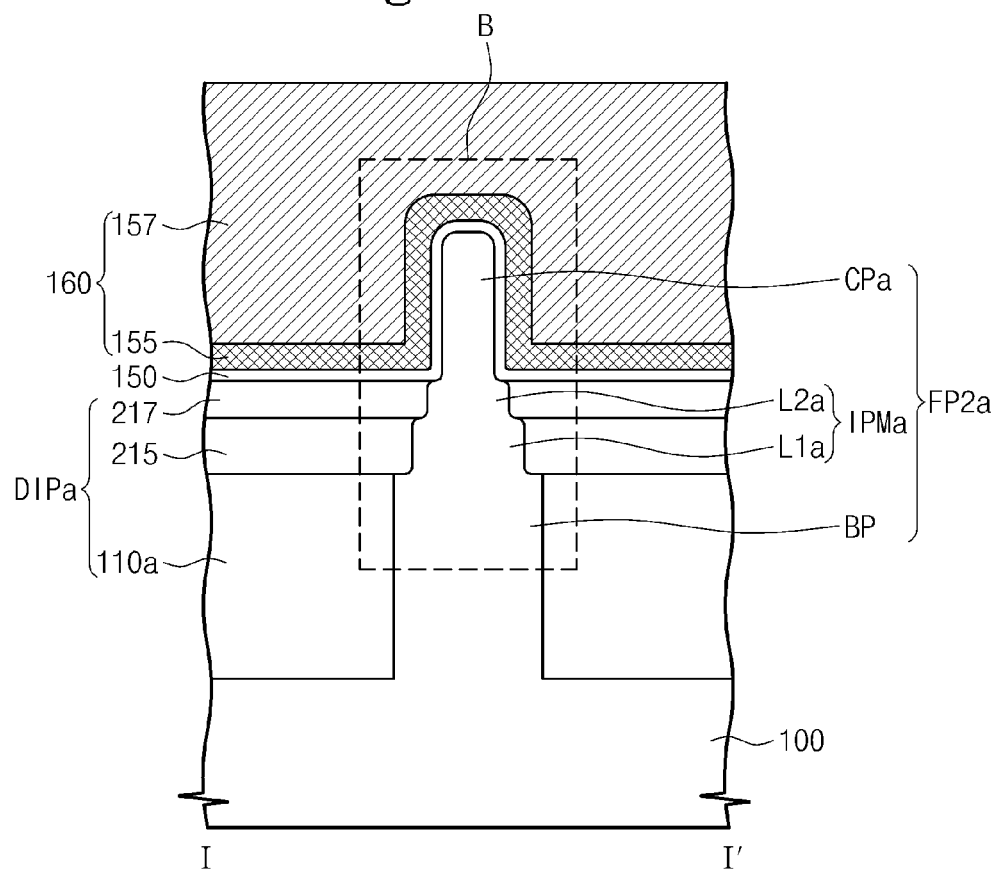
FIG. 15B is a cross-sectional view taken along a line I-I' of FIG. 15A.
Figure 15C:
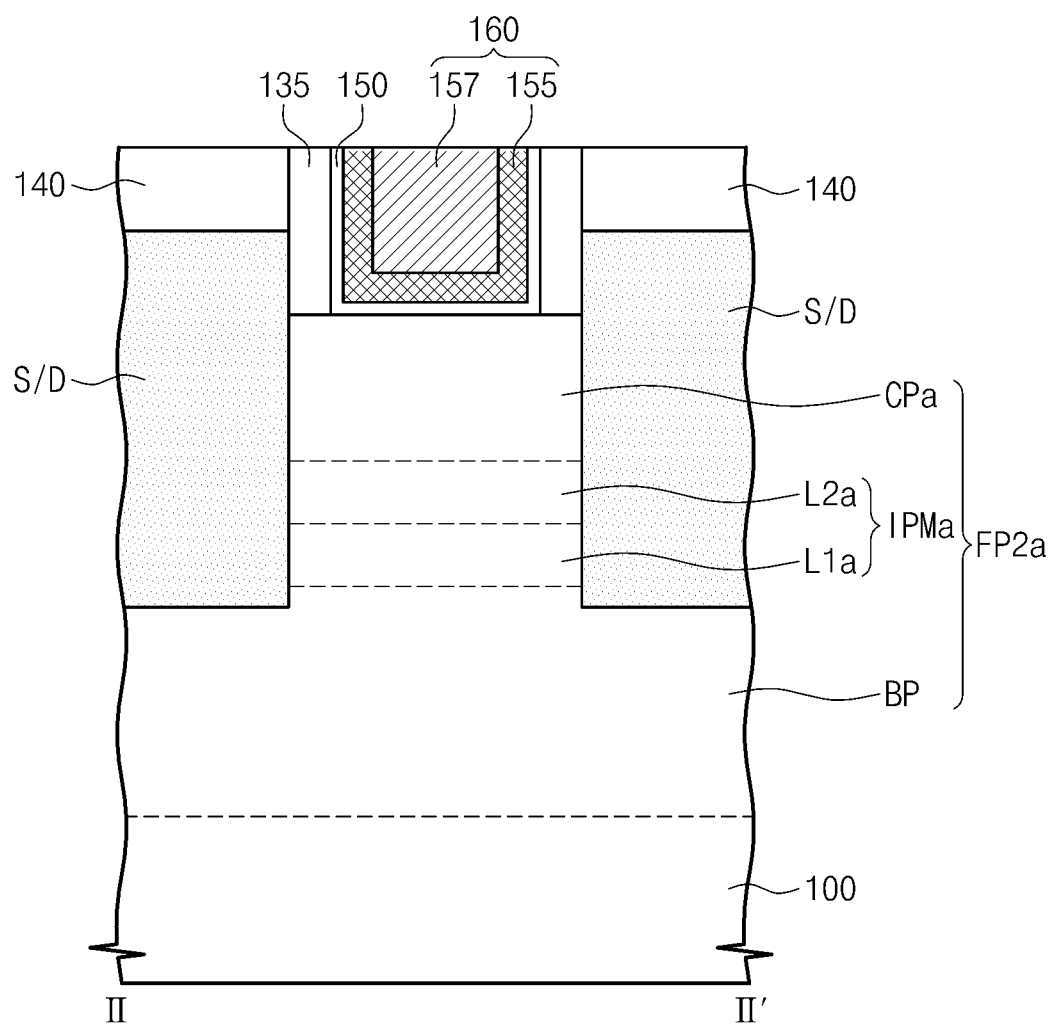
FIG. 15C is a cross-sectional view taken along a line II-IF of FIG. 15A.
Figure 15D:
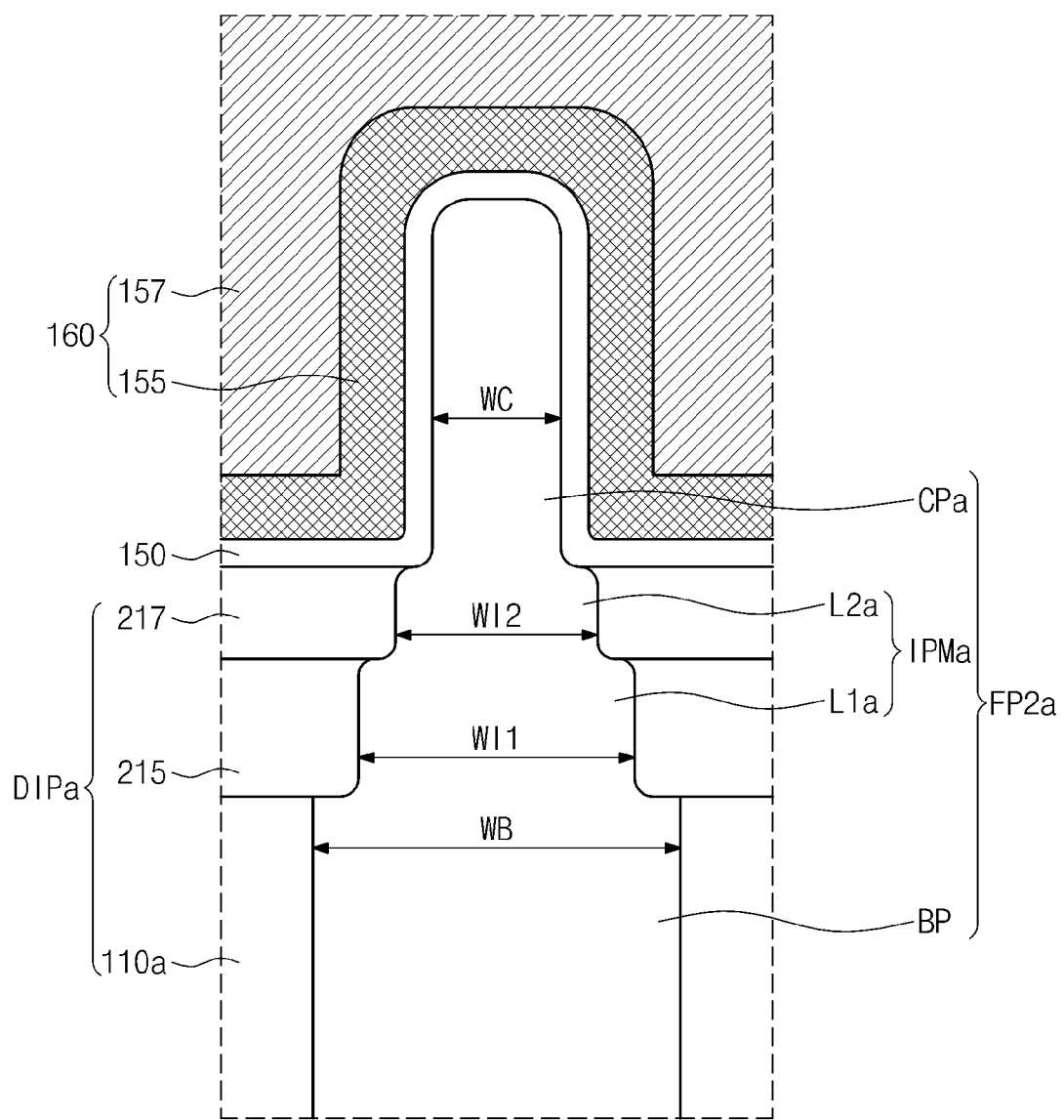
FIG. 15D is an enlarged view of a portion 'B' of FIG. 15B.

FIG. 15A is a plan view illustrating a semiconductor device according to other embodiments. FIG. 15B is a cross-sectional view taken along a line I-I' of FIG. 15A. FIG. 15C is a cross-sectional view taken along a line II-II' of FIG. 15A. FIG. 15D is an enlarged view of a portion 'B' of FIG. 15B. In the present embodiment, the same elements as described in the aforementioned embodiment of FIGS. 1A to 1D will be indicated by the same reference numerals or the same reference designators. For the purpose of ease and convenience in explanation, the descriptions to the same elements as described in the aforementioned embodiment will be omitted or mentioned briefly. Differences between the present embodiment and the aforementioned embodiment will be mainly described hereinafter.

Referring to FIGS. 15A, 15B, 15C, and 15D, a fin portion FP2a according to the present embodiment may include the base part BP, the channel part CPa, and an intermediate part IPMa disposed between the base part BP and the channel part CPa. The intermediate part IPMa may include a plurality of sub-intermediate parts L1a and L2a sequentially stacked. As illustrated in FIGS. 15B and 15D, widths WI1 and WI2 of the stacked sub-intermediate parts L1a and L2a are different from each other. Each of the widths WI1 and WI2 of the stacked sub-intermediate parts L1a and L2a is less than the width WB of the base part BP and greater than the width WC of the channel part CPa. The sub-intermediate parts L1a and L2a are realized as one united body. As such, the sub-intermediate parts L1a and L2a are directly connected to each other without an interface therebetween.

As illustrated in FIG. 15D, the widths WI1 and WI2 of the stacked sub-intermediate parts L1a and L2a may be reduced stepwise in a direction from the base part BP toward the channel part CPa. The width WI2 of the uppermost sub-intermediate part L2a of the stacked sub-intermediate parts L1a and L2a is greater than the width WC of the channel part CPa. The width WI1 of the lowermost sub-intermediate part L1a of the stacked sub-intermediate parts L1a and L2a is less than the width WB of the base part BP. In some embodiments, each of the sub-intermediate parts L1a and L2a may have a substantially uniform width.

The width WC of the channel part CPa may be equal to or less than a value obtained by subtracting about 2 nanometers from the width WI2 of the uppermost sub-intermediate part L2a. The width WI1 of the lowermost sub-intermediate part L1a may be equal to or less than a value obtained by subtracting about 2 nanometers from the width WB of the base part BP.

In FIGS. 15B, 15C, and 15D, the intermediate part IPMa includes a first sub-intermediate part L1a and a second sub-intermediate part L2a that are sequentially stacked. However, the inventive concepts are not limited thereto. For example, the intermediate part IPMa may include three or more sub-intermediate parts sequentially stacked. Hereinafter, the intermediate part IPMa having the first and second sub-intermediate parts L1a and L2a will be described as an example for the purpose of ease and convenience in explanation.

A device isolation pattern DIPa covers both sidewalls of the base part BP and both sidewalls of the sub-intermediate parts L1a and L2a, and the gate electrode 160 covers both sidewalls and a top surface of the channel part CPa. The gate electrode 160 does not cover sidewalls of the sub-intermediate parts L1a and L2a.

The device isolation pattern DIPa may include first, second, and third insulating patterns 110a, 215, and 217 that are sequentially stacked. The first insulating pattern 110a covers both sidewalls of the base part BP, and the second insulating pattern 215 covers both sidewalls of the first sub-intermediate part L1a. The third insulating pattern 217 covers both sidewalls of the second sub-intermediate part L2a. As shown in the example of FIG. 15B, the first insulating pattern 110a contacts the sidewalls of the base part BP, the second insulating pattern 215 contacts the sidewalls of the first sub-intermediate part L1a, and the third insulating pattern 217 contacts the sidewalls of the second sub-intermediate part L2a.

The source/drain patterns S/D may be disposed at both sides of the gate electrode 160, respectively. The channel part CPa and the intermediate part IPMa may be disposed between the source/drain patterns S/D.

The features of the modified example of FIG. 3 may be applied to the semiconductor device according to the present embodiment. For example, a plurality of fin portions FP2a may be arranged in parallel on the substrate 100, and the gate electrode 160 may cross over the plurality of fin portions FP2a. The gate electrode 160 may cover sidewalls and top surfaces of the channel parts CPa of the plurality of fin portions FP2a.

Other elements of the semiconductor device according to the present embodiment may be the same as corresponding elements in the aforementioned embodiments.

Figure 16:
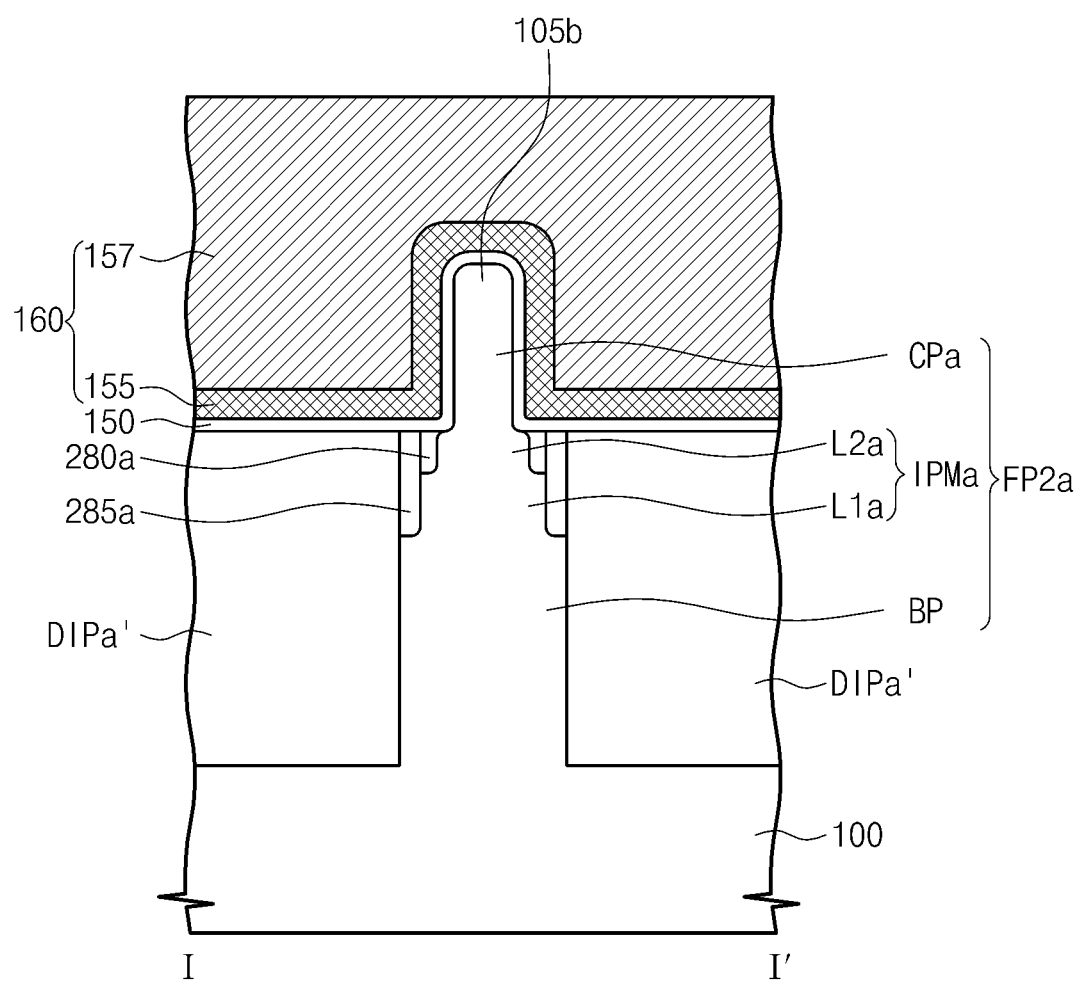
FIG. 16 is a cross-sectional view illustrating a modified example of a semiconductor device according to other exemplary embodiments.

FIG. 16 is a cross-sectional view illustrating a modified example of a semiconductor device according to other embodiments.

Referring to FIG. 16, a device isolation pattern DIPa' according to the present modified example may be in one united body. The device isolation pattern DIPa' covers sidewalls of the base part BP and the intermediate part IPMa. A first mask spacer pattern 280a may be disposed between the device isolation pattern DIPa' and the sidewall of the second sub-intermediate part L2a. A second mask spacer pattern 285a may be disposed between the device isolation pattern DIPa' and the sidewall of the first sub-intermediate part L1a and between the device isolation pattern DIPa' and the first mask spacer pattern 280a. The first and second mask spacer patterns 280a and 285a may be formed, for example, of an insulating material having an etch selectivity with respect to the substrate 100. For example, each of the first and second mask spacer patterns 280a and 285a may be formed of a silicon oxide layer, or a double layer of a silicon oxide layer and a silicon nitride layer.

FIGS. 17A to 19A are cross-sectional views taken along a line I-I' of FIG. 15A to illustrate a method of manufacturing a semiconductor device according to certain exemplary embodiments. FIGS. 17B to 19B are cross-sectional views taken along a line II-II' of FIG. 15A to illustrate a method of manufacturing a semiconductor device according to certain exemplary embodiments.

Figure 17A:
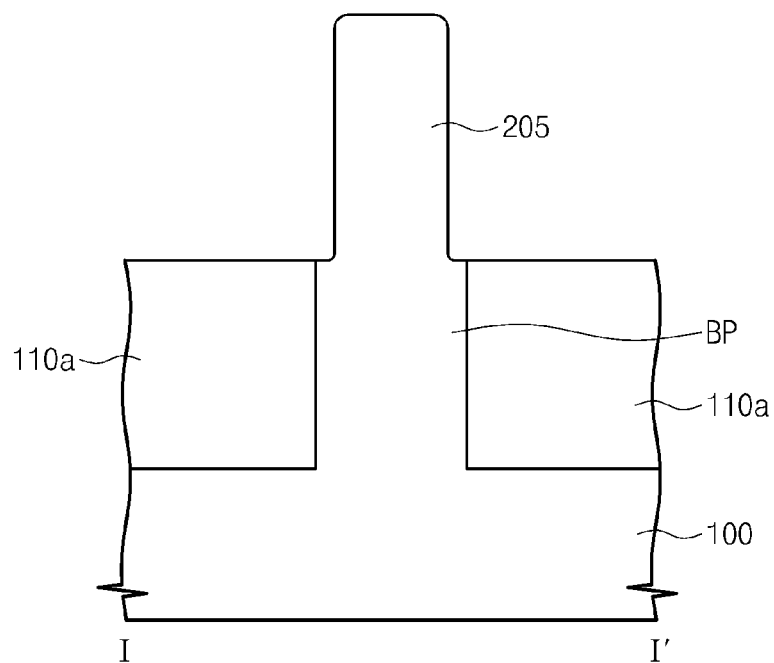
Figure 17B:
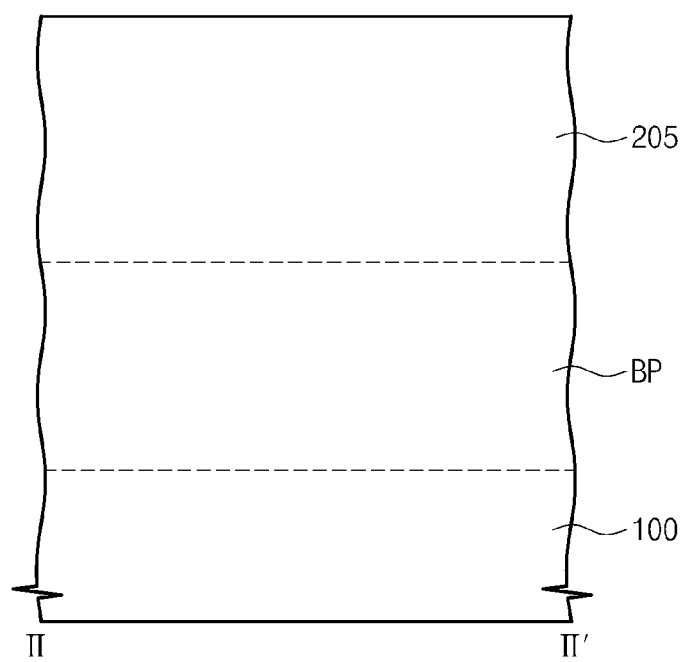

Referring to FIGS. 17A and 17B, a substrate 100 may be etched using a mask pattern (not shown) to form a first preliminary fin, and a first insulating pattern 110a may be formed to cover a lower portion of the first preliminary fin. A first thinning process may be performed on an exposed upper portion of the first preliminary fin, thereby forming a second preliminary fin 205. At this time, a base part BP is formed under the second preliminary fin 205. Sidewalls of the base part BP are covered by the first insulating pattern. As described with reference to FIGS. 5A to 5C, the first thinning process may be an isotropic etching process directly etching the exposed upper portion of the first preliminary fin, or a process using formation and removal of a sacrificial oxide layer.

Figure 18A:
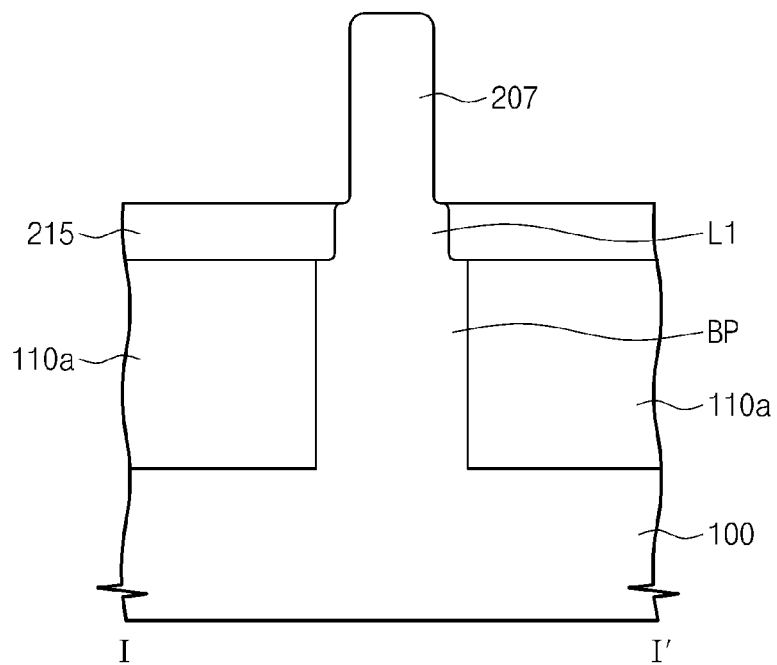
Figure 18B:
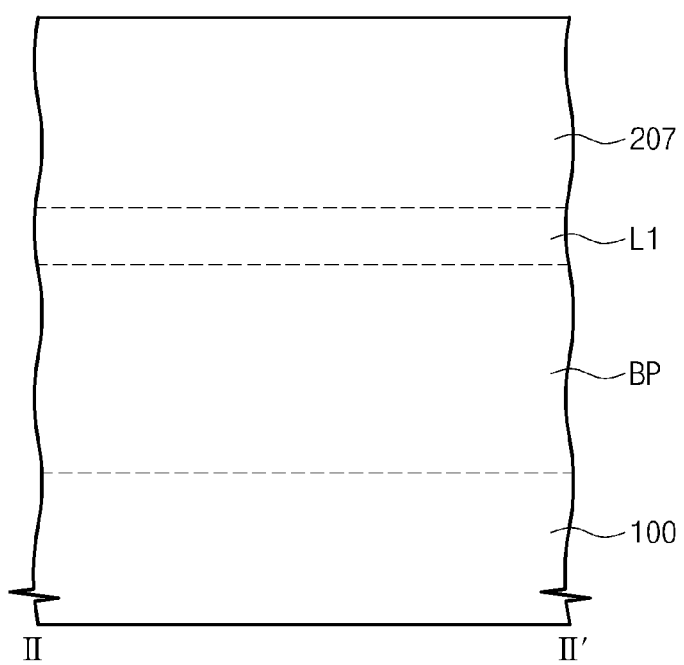

Referring to FIGS. 18A and 18B, a second insulating pattern 215 may be formed to cover a lower portion of the second preliminary fin 205. At this time, an upper portion of the second preliminary fin 205 is exposed. A second thinning process is performed on the exposed upper portion of the second preliminary fin 205, thereby forming a third preliminary fin 207. At this time, a first sub-intermediate part L1 is formed under the third preliminary fin 207. Sidewalls of the first sub-intermediate part L1 are covered by the second insulating pattern 215. The second thinning process may be, for example, an isotropic etching process directly etching the exposed upper portion of the second preliminary fin 205, or a process using formation and removal of a sacrificial oxide layer.

Figure 19A:
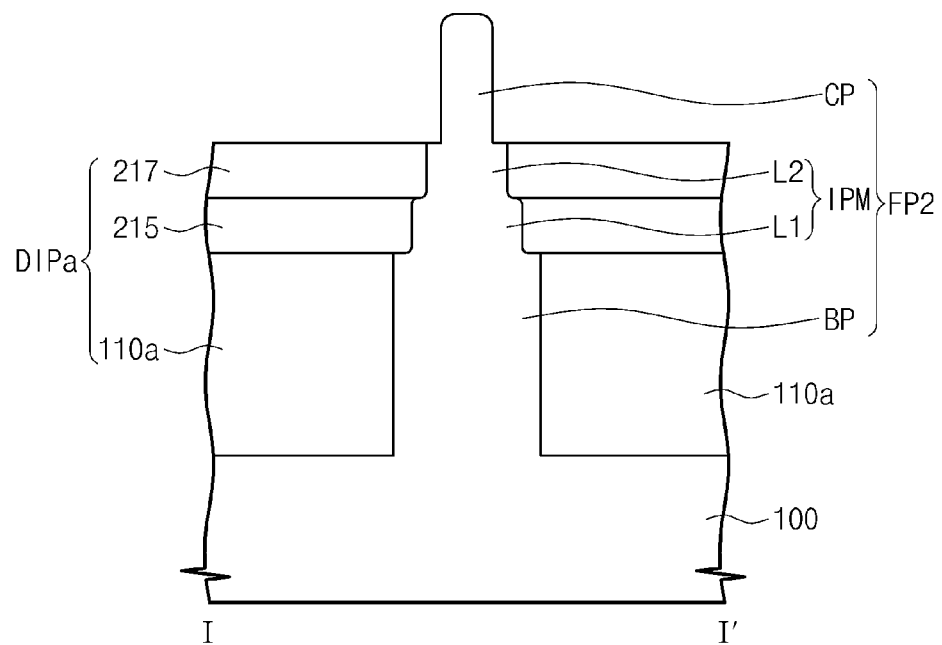
Figure 19B:
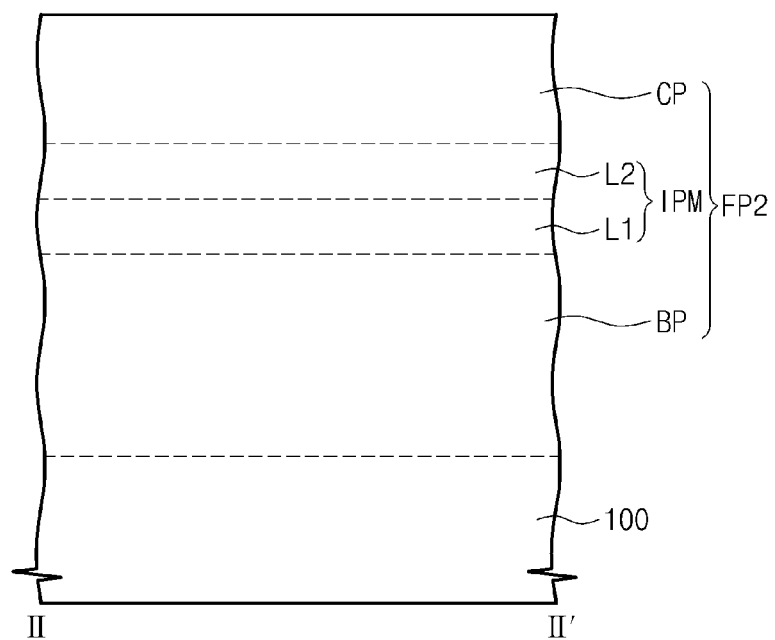

Referring to FIGS. 19A and 19B, a third insulating pattern 217 may be formed to cover sidewalls of a lower portion of the third preliminary fin 207. At this time, an upper portion of the third preliminary fin 207 is exposed. A third thinning process is performed on the exposed upper portion of the third preliminary fin 207, thereby forming a channel part CP. At this time, a second sub-intermediate part L2 is formed under the channel part BP. Sidewalls of the second sub-intermediate part L2 are covered by the third insulating pattern 217. The third thinning process may be, for example, an isotropic etching process directly etching the exposed upper portion of the third preliminary fin 207, or a process using formation and removal of a sacrificial oxide layer.

The first and second sub-intermediate parts L1 and L2 constitute an intermediate part IPM. As a result, a fin portion FP2 including the base part BP, the intermediate part IPM, and the channel part CP sequentially stacked may be formed. Next, the subsequent processes described with reference to FIGS. 8A to 12A, 8B to 12B, and 8C to 12C may be performed to realize the semiconductor device illustrated in FIGS. 15A to 15D.

FIGS. 20A to 20E are cross-sectional views illustrating another example of a method of forming a fin portion in a method of manufacturing a semiconductor device according to certain exemplary embodiments.

Figure 20A:
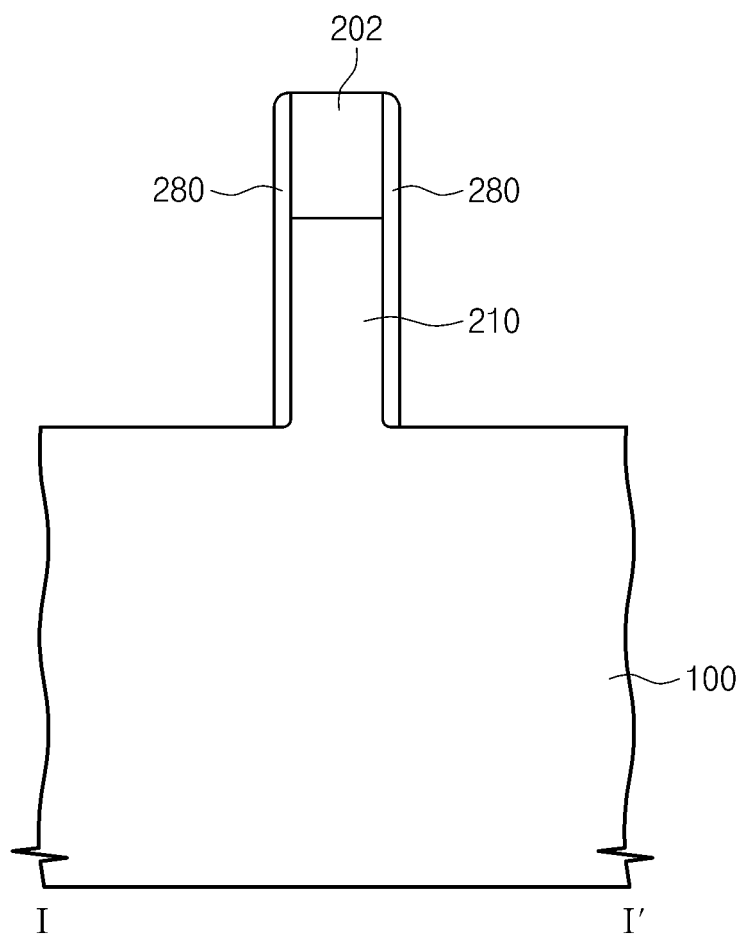
FIGS. 20A to 20E are cross-sectional views illustrating another example of a method of forming a fin portion in a method of manufacturing a semiconductor device according to other exemplary embodiments.

Referring to FIG. 20A, a mask pattern 202 may be formed on a substrate 100, and then the substrate 100 may be etched using the mask pattern 202 as an etch mask to form a preliminary fin 210. A first mask spacer layer may be conformally formed and then the first mask spacer layer may be anisotropically etched to form first mask spacers 280. The first mask spacers 280 may be formed on both sidewalls of the mask pattern 202 and both sidewalls of the preliminary fin 210, respectively.

Figure 20B:
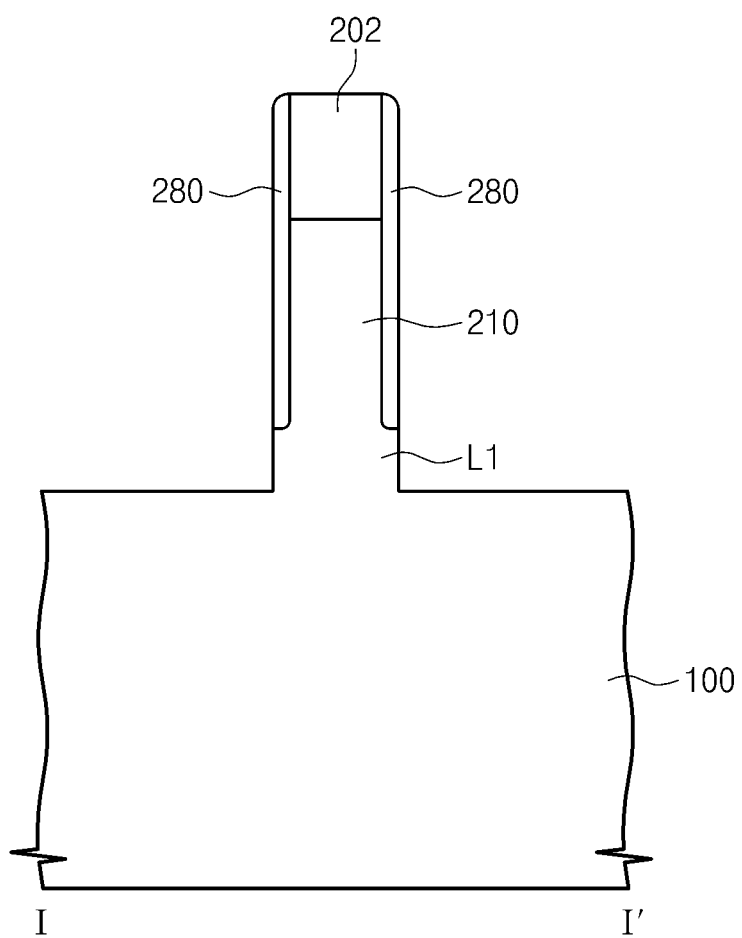

Referring to FIG. 20B, the substrate 100 may be etched using the mask pattern 202 and the first mask spacers 280 as etch masks, thereby forming a first sub-intermediate part L1 under the first mask spacers 280 and the preliminary fin 210.

Figure 20C:
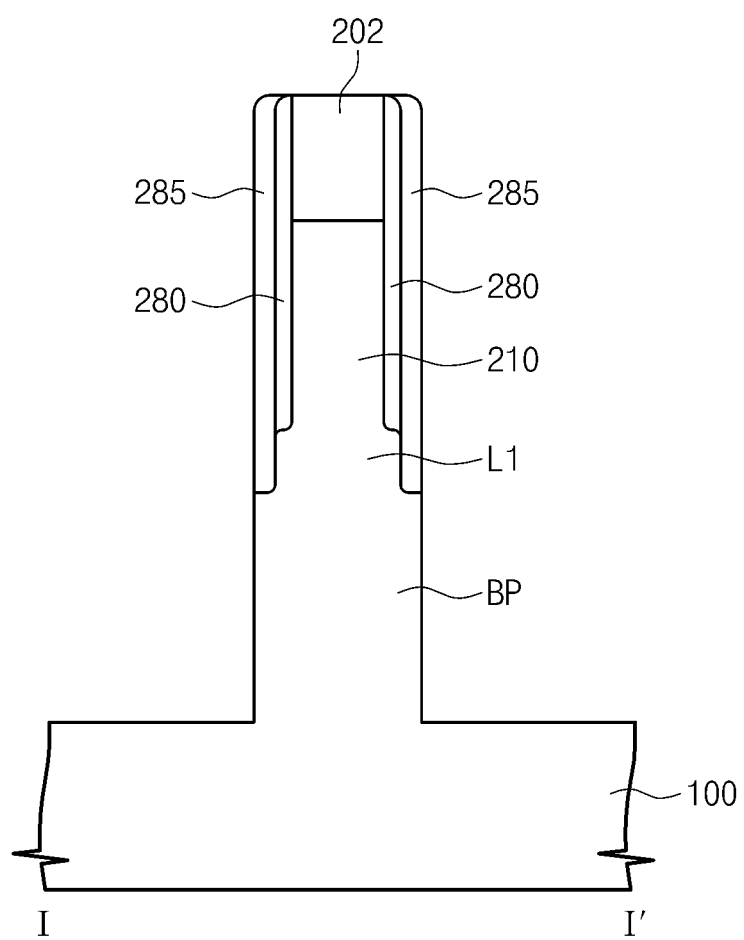

Referring to FIG. 20C, a second mask spacer layer may be conformally formed on the substrate 100, and then the second mask spacer layer may be anisotropically etched to form second mask spacers 285. The second mask spacers 285 may be formed on the first mask spacers 280 and both sidewalls of the first sub-intermediate part L1, respectively.

The substrate 100 may be etched using the mask pattern 202 and the second mask spacers 285 as etch masks, thereby forming a base part BP under the first sub-intermediate part L1 and the second mask spacers 285.

Figure 20D:
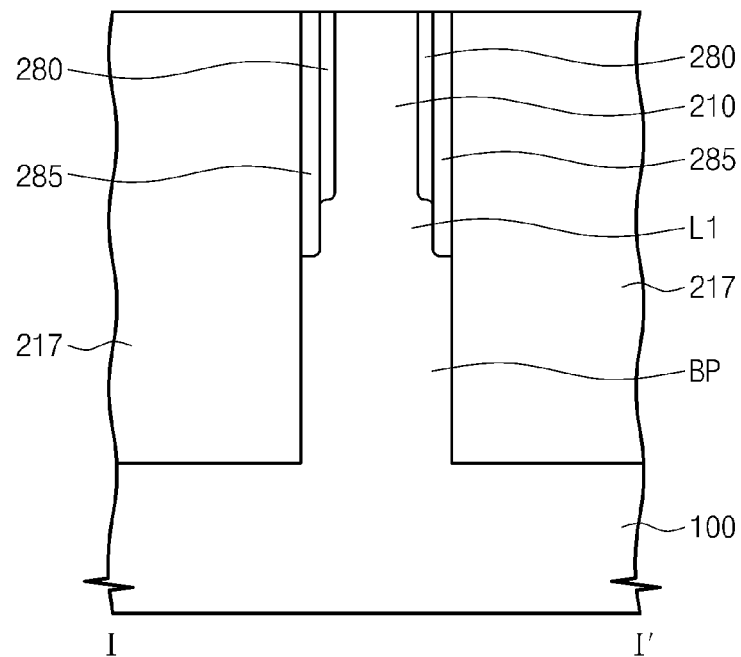

Referring to FIG. 20D, a device isolation layer 217 may be formed on the substrate 100 and then the device isolation layer 217 may be planarized until the mask pattern 202 is exposed. The exposed mask pattern 202 may be removed. While the mask pattern 202 is removed, a top end portion of the planarized device isolation layer 217 and top end portions of the first and second mask spacers 280 and 285 may be etched.

Figure 20E:
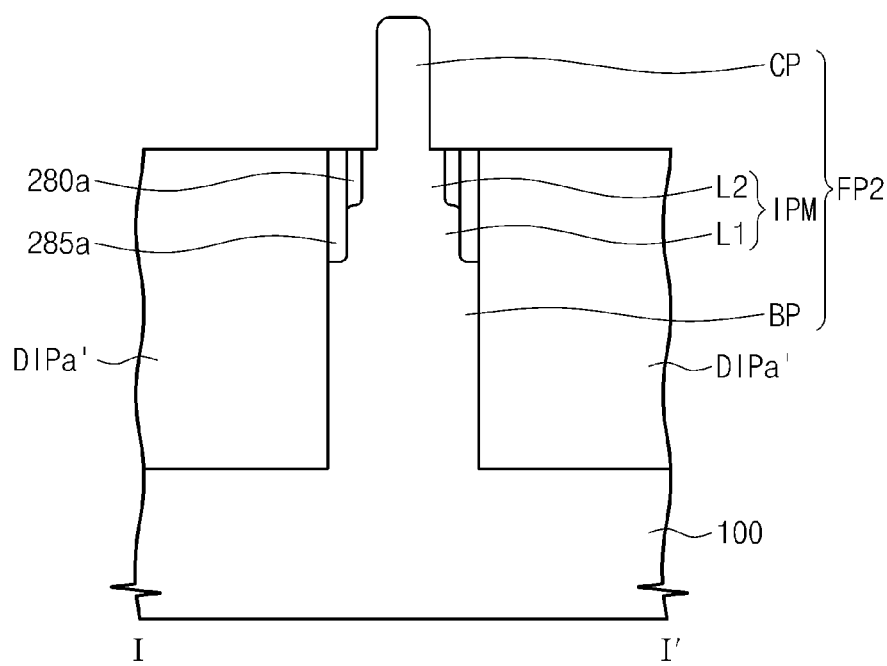

Referring to FIG. 20E, the planarized device isolation layer 217 may be recessed to form a device isolation pattern DIPa'. A top surface of the device isolation pattern DIPa' is lower than a top surface of the preliminary fin 210. When the device isolation layer 217 is recessed, upper portions of the first and second mask spacers 280 and 285 may be removed to expose an upper portion of the preliminary fin 210. At this time, first and second mask spacer patterns 280a and 285a may be formed, and sidewalls of a lower portion of the preliminary fin 210 may be covered by the device isolation pattern DIPa' and the first and second mask spacer patterns 280a and 285a. A thinning process may be performed on the exposed upper portion of the preliminary fin 210, thereby forming a channel part CP. At this time, a second sub-intermediate part L2 is formed under the channel part CP. Thus, a fin portion FP2 is formed. Thereafter, the subsequent processes described with reference to FIGS. 8A to 12A, 8B to 12B, and 8C to 12C may be performed to realize the semiconductor device illustrated in FIG. 16.

Figure 21A:
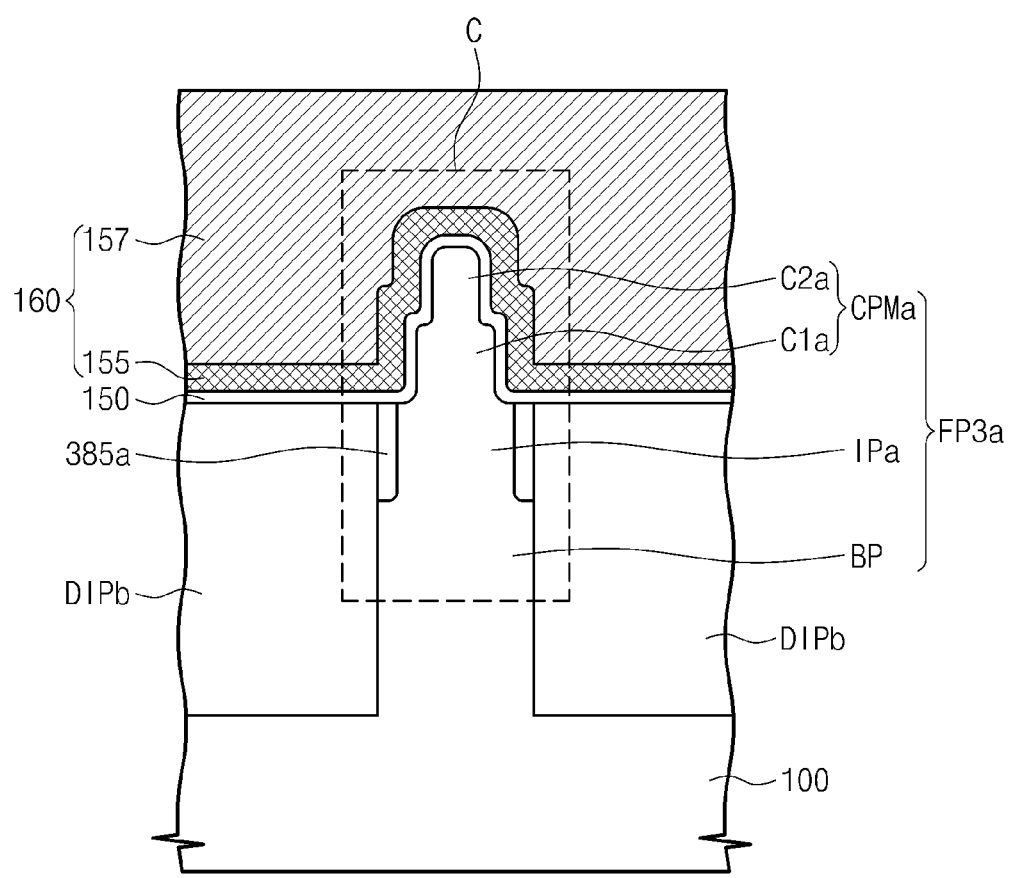
FIGS. 21A and 21B are cross-sectional views illustrating a semiconductor device according to still other exemplary embodiments.
Figure 21B:
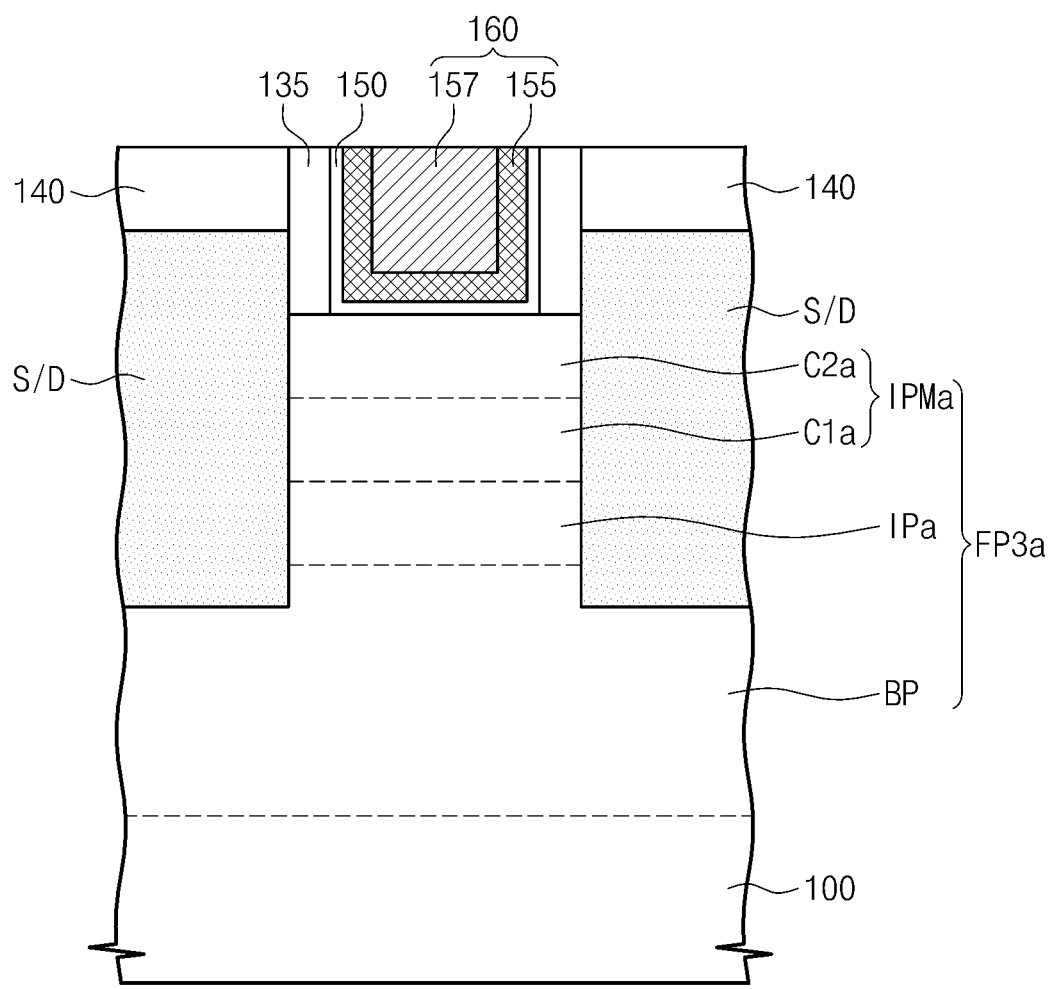
Figure 21C:
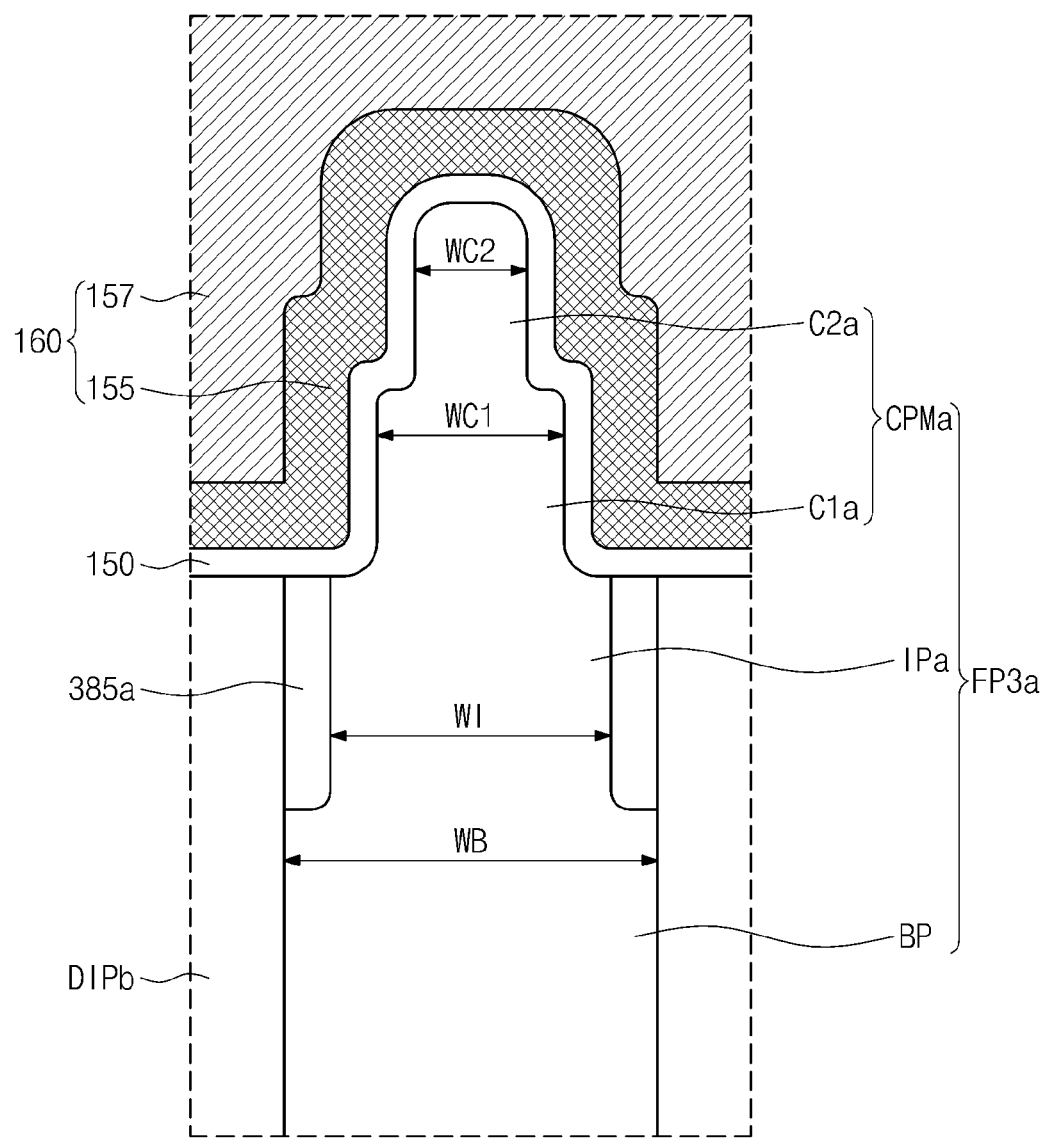
FIG. 21C is an enlarged view of a portion 'C' of FIG. 21A.

FIGS. 21A and 21B are cross-sectional views illustrating a semiconductor device according to still other embodiments. FIG. 21C is an enlarged view of a portion 'C' of FIG. 21A. In the present embodiment, the same elements as described in the embodiment of FIGS. 1A to 1D will be indicated by the same reference numerals or the same reference designators. For the purpose of ease and convenience in explanation, the descriptions to the same elements as described in the embodiment of FIGS. 1A to 1D will be omitted or mentioned briefly. Differences between the present embodiment and the aforementioned embodiments will be mainly described hereinafter. FIG. 21A is a cross-sectional view taken along a longitudinal direction of a gate electrode, and FIG. 21B is a cross-sectional view taken along a perpendicular direction to the longitudinal direction of the gate electrode.

Referring to FIGS. 21A, 21B, and 21C, a fin portion FP3a according to the present embodiment may include the base part BP, the intermediate part IPa, and a channel part CPMa. The channel part CPMa may include a plurality of sequentially stacked sub-channel parts C1a and C2a.

Widths WC1 and WC2 of the stacked sub-channel parts C1a and C2a are different from each other. Each of the widths WC1 and WC2 of the sub-channel parts C1a and C2a is less than the width WI of the intermediate part IPa. The widths WC1 and WC2 of the sub-channel parts C1a and C2a may be reduced stepwise in a direction from the base part BP toward the channel part CPMa. The width WC1 of the lowermost sub-channel part C1a of the sub-channel parts C1a and C2a is less than the width WI of the intermediate part IPa. In some embodiments, the width WC1 of the lowermost sub-channel part C1a may be equal to or less than a value obtained by subtracting twice a minimum removal thickness controllable by a thinning process from the width WI of the intermediate part IPa. In some embodiments, the width WC1 of the lowermost sub-channel part C1a may be equal to or less than a value obtained by subtracting about 2 nanometers from the width WI of the intermediate part IPa. Each of the sub-channel parts C1a and C2a may have a substantially uniform width.

A device isolation pattern DIPb may cover both sidewalls of the base part BP and both sidewalls of the intermediate part IPa. The gate electrode 160 may cover sidewalls of all sub-channel parts C1a and C2a of the channel part CPMa. The gate electrode 160 does not cover sidewalls of the intermediate part IPa. When an operating voltage is applied to the gate electrode 160, all sub-channel parts C1a and C2a may become depletion regions. In one embodiment, an entire portion of each of the sub-channel parts C1a and C2a may become a depletion region.

Mask spacer patterns 385a may be disposed between the device isolation pattern DIPb and the both sidewalls of the intermediate part IPa, respectively. The mask spacer patterns 385a may be formed of an insulating material having an etch selectivity with respect to the substrate 100.

In the semiconductor device according to the present embodiment, the channel part CPMa includes the plurality of sub-channel parts C1a and C2a having the widths WC1 and WC2 different from each other, and the gate electrode 160 covers the sidewalls of the plurality of sub-channel parts C1a and C2a. Thus, a channel-width of a channel generated in the channel part CPMa may be increased to increase a turn-on current of the field effect transistor. Additionally, the effects described with reference to FIGS. 1A to 1D may be obtained due to the intermediate part IPa.

The features of the modified example of FIG. 3 may be applied to the semiconductor device according to the present embodiment. As such, a plurality of the fin portions FP3a may be arranged on the substrate 100 and the gate electrode 160 may cross over the plurality of fin portions FP3a. Other elements of the semiconductor device according to the present embodiment may be substantially the same as corresponding elements in the embodiment described with reference to FIGS. 1A to 1D.

The features of the embodiment illustrated in FIGS. 15A to 15D may be applied to the semiconductor device according to the present embodiment. In more detail, the intermediate part IPa of FIGS. 21A to 21C may be replaced with the intermediate part IPMa illustrated in FIGS. 15A to 15D.

FIGS. 22 to 26 are cross-sectional views illustrating a method of manufacturing a semiconductor device according to certain exemplary embodiments.

Figure 22:
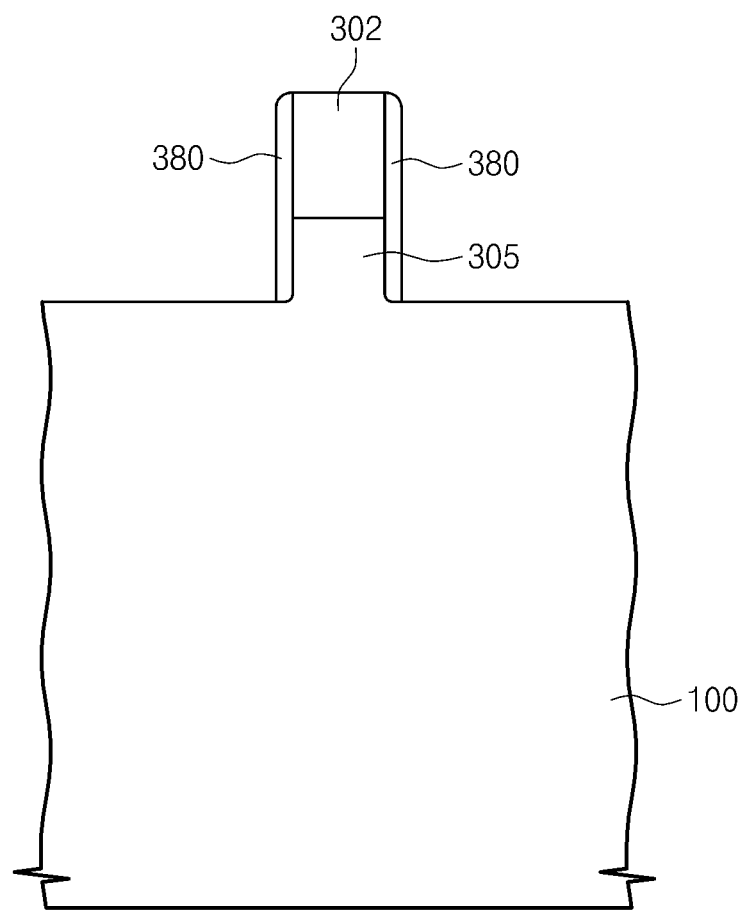
FIGS. 22 to 26 are cross-sectional views illustrating a method of manufacturing a semiconductor device according to still other exemplary embodiments.

Referring to FIG. 22, a mask pattern 302 may be formed on a substrate 100 and then the substrate 100 may be etched using the mask pattern 302 as an etch mask to form a first preliminary fin 305. First mask spacers 380 may be formed on both sidewalls of the mask pattern 302 and both sidewalls of the first preliminary fin 305, respectively.

Figure 23:
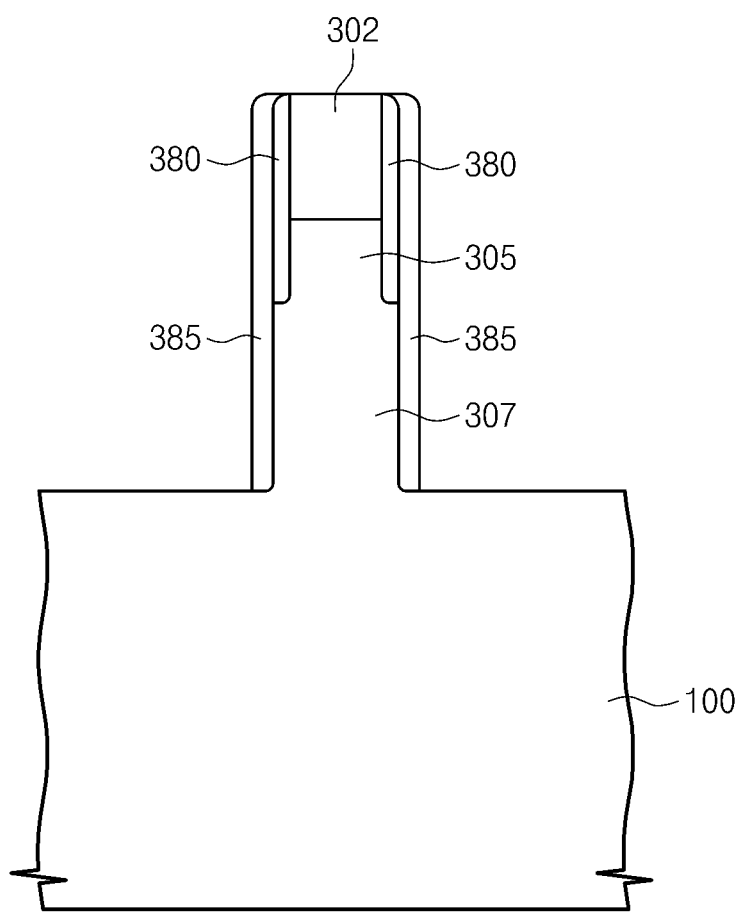

Referring to FIG. 23, the substrate 100 may be etched using the mask pattern 302 and the first mask spacers 380 as etch masks, thereby forming a second preliminary fin 307 under the first preliminary fin 305 and the first mask spacers 380. A width of a lower portion of the second preliminary fin 307 may be equal to the width WI of the intermediate part IPa of FIGS. 21A to 21C.

Subsequently, second mask spacers 385 may be formed on both sidewalls of the second preliminary fin 307, respectively. The second mask spacers 385 may also cover sidewalls of the first mask spacers 380, respectively.

Figure 24:
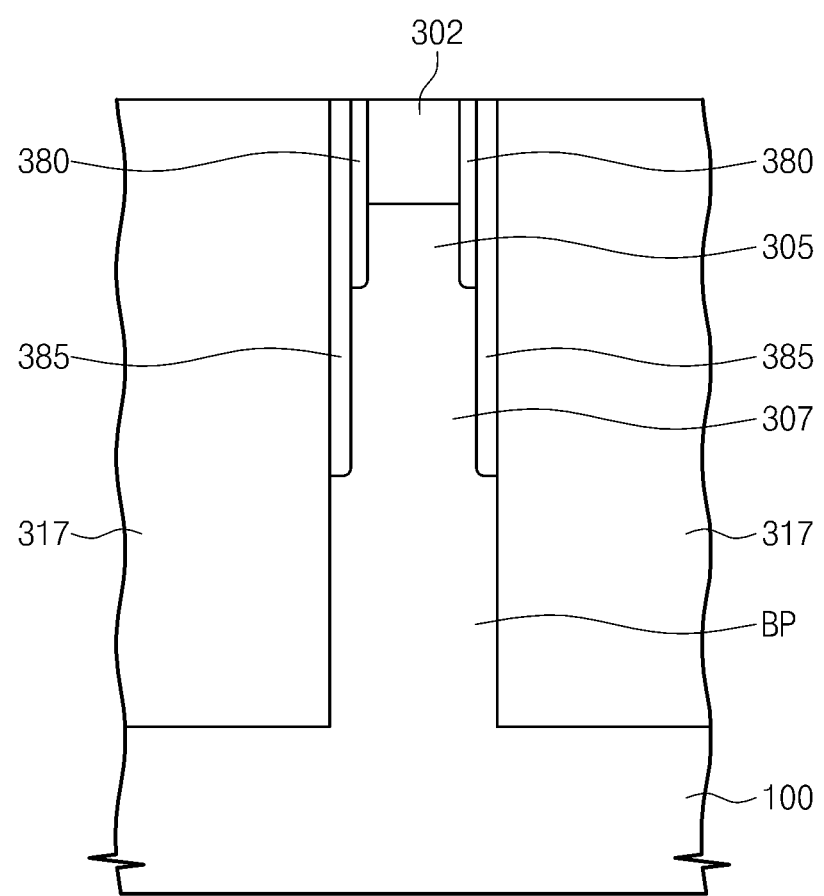

Referring to FIG. 24, the substrate 100 may be etched using the mask pattern 302 and the second mask spacers 385 as etch masks, thereby forming a base part BP under the second preliminary fin 307 and the second mask spacers 385.

Subsequently, a device isolation layer 317 may be formed on the substrate 100 and then the device isolation layer 317 may be planarized until the mask pattern 302 is exposed.

Figure 25:
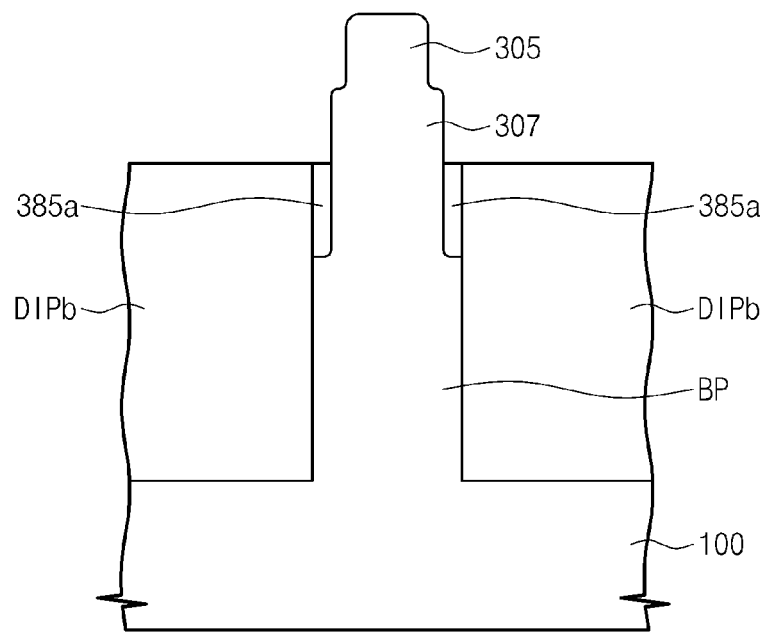

Referring to FIG. 25, the exposed mask pattern 302 may be removed and then the planarized device isolation layer 317 may be recessed to form a device isolation pattern DIPb. The device isolation pattern DIPb may cover both sidewalls of the base part BP and both sidewalls of a lower portion of the second preliminary fin 307. At this time, the first mask spacers 380 may be removed to expose the first preliminary fin 305, and upper portions of the second mask spacers 385 may also be removed to expose an upper portion of the second preliminary fin 307. Mask spacer patterns 385a may be formed between the device isolation pattern DIPb and both sidewalls of the lower portion of the second preliminary fin 307, respectively.

Figure 26:
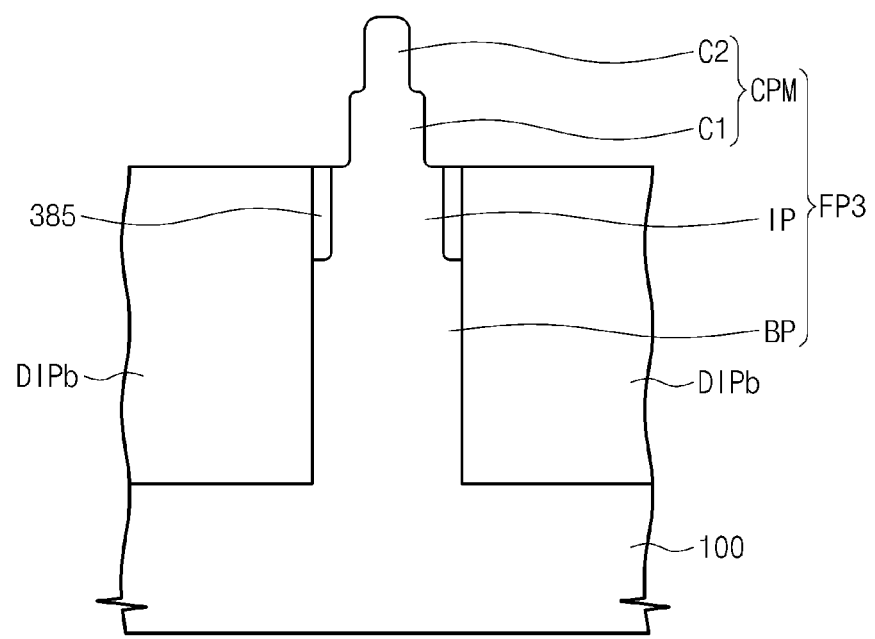

Referring to FIG. 26, a thinning process may be performed on the exposed first preliminary fin 305 and the exposed upper portion of the second preliminary fin 307, thereby forming a channel part CPM. At this time, an intermediate part IP is formed under the channel part CPM. The intermediate part IP corresponds to the lower portion of the second preliminary fin 307, which is not exposed in the thinning process.

The exposed upper portion of the second preliminary fin 307 may be formed into a first sub-channel part C1 by the thinning process, and the exposed first preliminary fin 305 may be formed into a second sub-channel part C2 by the thinning process. The first and second sub-channel parts C1 and C2 may be included in a channel part CPM. As a result, a fin portion FP3 including the base part BP, the intermediate part IP, and the channel part CPM may be performed. Next, the subsequent processes described with reference to FIGS. 8A to 12A, 8B to 12B, and 8C to 12C may be performed to realize the semiconductor device illustrated in FIGS. 21A to 21C.

The semiconductor devices according to the embodiments described above may comprise, for example, the field effect transistors, and may be realized as various kinds of semiconductor devices such as logic devices, system-on-chips (SOCs), and semiconductor memory devices, for example.

Figure 27:
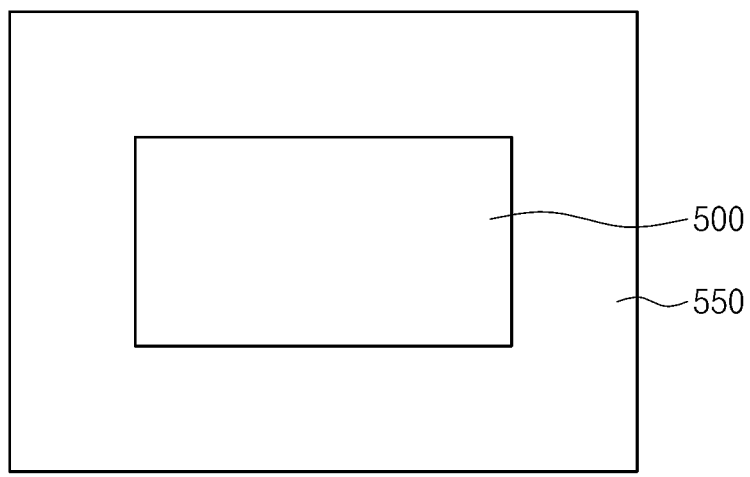
FIG. 27 is a schematic block diagram illustrating a semiconductor device according to certain exemplary embodiments.

FIG. 27 is a schematic block diagram illustrating a semiconductor device according to embodiments of the inventive concepts.

Referring to FIG. 27, a semiconductor device according to certain embodiments may include a first region 500 and a second region 550. In some embodiments, the first region 500 may correspond to a cell array region and the second region 550 may correspond to a logic circuit region. The field effect transistors of the aforementioned embodiments may be applied, for example, to the second region 550. For example, in certain embodiments, the first region 500 is a flash memory cell array region, a magnetic memory cell array region, or a phase change memory cell array region. In this case, the semiconductor devices according to the disclosed embodiments may be realized as flash memory devices, magnetic memory devices, and/or phase change memory devices.

In other embodiments, if the first region 500 is a static random access memory (SRAM) cell array region, the field effect transistors of the aforementioned embodiments may also be applied to the first region 500. As illustrated in FIG. 26, the second region 550 may surround the first region 500. Alternatively, the first region 500 and the second region 550 may be laterally spaced apart from each other.

In still other embodiments, all of the first and second regions 500 and 550 may be logic circuit regions. In this case, the field effect transistors of the aforementioned embodiments may be applied to all of the first and second regions 500 and 550.

The semiconductor devices in the embodiments described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

Figure 28:
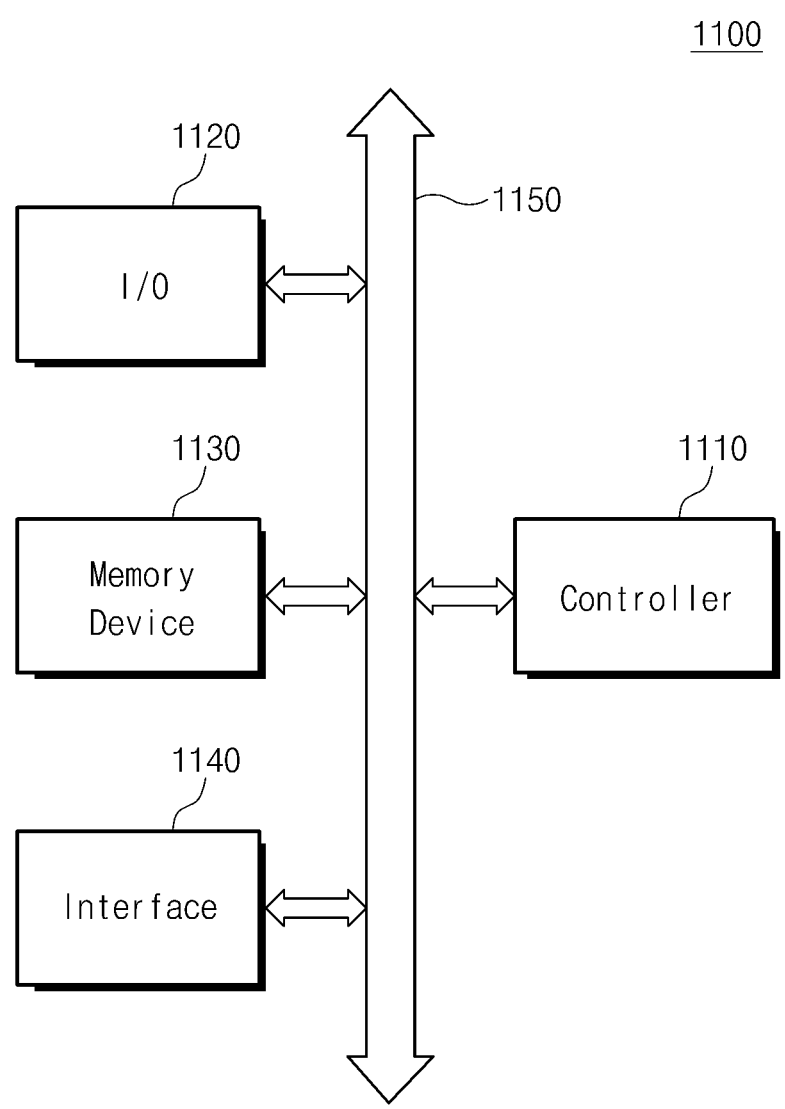
FIG. 28 is a schematic block diagram illustrating an example of electronic systems including semiconductor devices according to certain embodiments.

FIG. 28 is a schematic block diagram illustrating an example of electronic systems including semiconductor devices according to exemplary embodiments.

Referring to FIG. 28, an electronic system 1100 according to certain embodiments may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. If the semiconductor devices according to the aforementioned embodiments are realized as logic devices, the controller 1100 may include at least one of the semiconductor devices according to the aforementioned embodiments. The I/O unit 1120 may include a keypad, a keyboard and/or a display unit. The memory device 1130 may store data and/or commands. The memory device 1130 may include, for example, a non-volatile memory device. If the semiconductor devices according to the aforementioned embodiments are realized as flash memory devices, magnetic memory devices, and/or phase change memory devices, the memory device 1130 may include at least one of the semiconductor devices according to the aforementioned embodiments of the inventive concepts. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast DRAM device and/or a fast SRAM device which acts as a cache memory device for improving an operation of the controller 1110. If the semiconductor devices according to the disclosed embodiments are realized as SRAM devices, the cache memory device may include at least one of the semiconductor devices according to the aforementioned embodiments of the inventive concepts.

The electronic system 1100 may be applied, for example, to a personal digital assistant (PDA), a portable computer, a web tablet, a wireless phone, a mobile phone, a digital music player, a memory card or other electronic products. Other electronic products may also receive or transmit information data by wireless.

Figure 29:
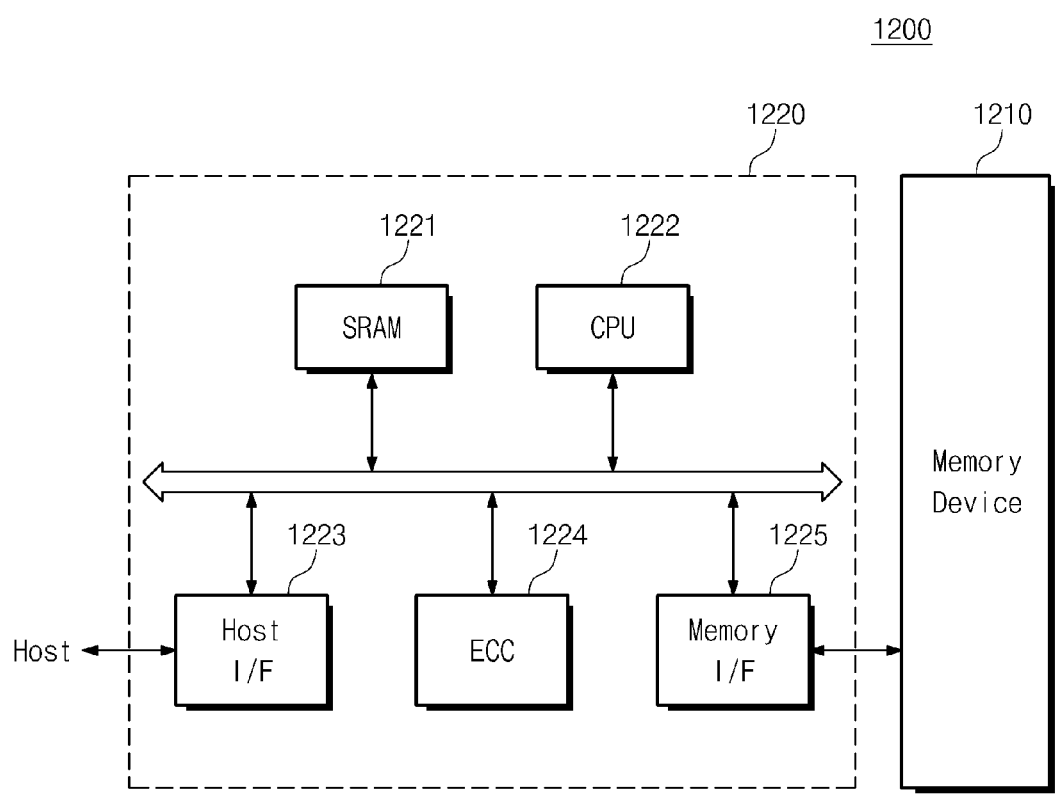
FIG. 29 is a schematic block diagram illustrating an example of memory cards including semiconductor devices according to certain disclosed embodiments.

FIG. 29 is a schematic block diagram illustrating an example of memory cards including semiconductor devices according to certain exemplary embodiments.

Referring to FIG. 29, a memory card 1200 according to one embodiment includes a memory device 1210. If the semiconductor devices according to the aforementioned embodiments are realized as flash memory devices, magnetic memory devices, and/or phase change memory devices, the memory device 1210 may include at least one of the semiconductor devices according to the aforementioned embodiments. The memory card 1200 may include a memory controller 1220 that controls data communication between a host and the memory device 1210.

The memory controller 1220 may include a central processing unit (CPU) 1222 that controls overall operations of the memory card 1200. If the semiconductor devices according to the aforementioned embodiments are realized as logic devices, the CPU 1222 may include at least one of the semiconductor devices according to the aforementioned embodiments. In addition, the memory controller 1220 may include an SRAM device 1221 used as an operation memory of the CPU 1222. The semiconductor device according to certain embodiments may be applied to the SRAM device 1221. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

As described above, the width of the intermediate part between the channel part and the base part is less than the width of the base part. Thus, the punch-through characteristic between the source/drain patterns may be improved. Additionally, the parasitic capacitance between the fin portion and the gate electrode may be reduced or minimized due to the intermediate part. As a result, the highly integrated semiconductor device having excellent reliability may be realized.

While the disclosure has been described with reference to example embodiments, it will be apparent to those skilled in the art that various changes and modifications may be made without departing from the spirits and scope of the disclosed embodiments. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor device comprising:
a fin component protruding from a substrate, the fin component including a base part, an intermediate part on the base part, and a channel part on the intermediate part, the channel part including two opposite sidewalls, wherein a width of the intermediate part is less than a width of the base part and is greater than a width of the channel part;
a device isolation pattern disposed on the substrate and adjacent to at least a first sidewall of the fin component; and
a gate electrode crossing over the fin component, the gate electrode covering both opposite sidewalls and a top surface of the channel part,
wherein the first sidewall of the fin component has a different slope at an interface between the base part and the intermediate part than at a portion of the intermediate part between the base part and the channel part.

2. The semiconductor device of claim 1, wherein the widths of the base, intermediate, and channel parts are defined in a longitudinal direction of the gate electrode.

3. The semiconductor device of claim 1, wherein the base, intermediate, and channel parts have inclined sidewalls, respectively,
wherein the widths of the base, intermediate, and channel parts correspond to upper widths thereof, respectively.

4. The semiconductor device of claim 3, wherein the upper width of the base part is smaller than a lower width of the base part.

5. The semiconductor device of claim 1, wherein the base, intermediate and channel parts are directly connected to each other, and constitute one united body.

6. The semiconductor device of claim 1, further comprising:
a gate insulating layer disposed between the channel part and the gate electrode.

7. The semiconductor device of claim 1, further comprising:
a pair of source/drain patterns disposed on the substrate at both sides of the gate electrode, respectively,
wherein the channel part is disposed between the pair of source/drain patterns; and
wherein the base part laterally extends to be disposed between the substrate and the pair of source/drain patterns.

8. The semiconductor device of claim 1, wherein the substrate is a bulk semiconductor substrate; and
wherein the fin component corresponds to a portion of the bulk semiconductor substrate.

9. A semiconductor device comprising:
a fin component protruding from a substrate, the fin component including a base part, an intermediate part on the base part, and a channel part on the intermediate part, the channel part including two opposite sidewalls, and including a first interface between the base part and the intermediate part and a second interface between the intermediate part and the channel part;
a device isolation pattern disposed on the substrate, the device isolation pattern formed on at least a sidewall of the base part and at least a sidewall of the intermediate part; and
a gate electrode crossing over the fin component, the gate electrode covering both opposite sidewalls and a top surface of the channel part,
wherein widths of the base part, the intermediate part, and the channel part are reduced stepwise at the first and second interfaces, and
wherein the first interface is at a level between a bottom surface and a top surface of the device isolation pattern.

10. The semiconductor device of claim 9, wherein at least a sidewall of the fin component has a different slope at the first interface than at a portion of the intermediate part.

11. The semiconductor device of claim 9, wherein the base, intermediate, and channel parts are directly connected to each other, and constitute one united body.

12. The semiconductor device of claim 9, wherein the substrate is a bulk semiconductor substrate; and
wherein the fin component corresponds to a portion of the bulk semiconductor substrate.

13. A semiconductor device comprising:
a substrate including a plurality of fin portions at an upper portion of the substrate, at least one of the fin portions including a base part, an intermediate part on the base part, and a channel part on the intermediate part;
a device isolation pattern disposed between a pair of the fin portions, the device isolation pattern defining at least a first sidewall of the base part and at least a second sidewall of the intermediate part; and
a gate electrode crossing over the fin portions and extending on the device isolation pattern, the gate electrode covering opposite sidewalls and a top surface of the channel part,
wherein a slope of the second sidewall is different from a slope of an interface between the first and second sidewalls.

14. The semiconductor device of claim 13, wherein the first and second sidewalls constitute a part of a sidewall of the fin portion.

15. The semiconductor device of claim 13, wherein a width of the intermediate part is less than a width of the base part and is greater than a width of the channel part, and
wherein the widths of the base, intermediate, and channel parts are defined in a longitudinal direction of the gate electrode.

16. The semiconductor device of claim 13, wherein the plurality of fin portions extend in parallel to each other.

* * * * *